US010332724B2

(12) United States Patent
Zimmerman et al.

(10) Patent No.: US 10,332,724 B2
(45) Date of Patent: Jun. 25, 2019

(54) CYCLOTRONIC PLASMA ACTUATOR WITH ARC-MAGNET FOR ACTIVE FLOW CONTROL

(71) Applicants: CU Aerospace, LLC, Champaign, IL (US); The Board of Trustees of the University of Illinois, Urbana, IL (US)

(72) Inventors: Joseph W. Zimmerman, Champaign, IL (US); David L. Carroll, Champaign, IL (US); Phillip J. Ansell, Urbana, IL (US); Georgi Hristov, Champaign, IL (US)

(73) Assignee: CU Aerospace, LLC, Champagne, IL (US)

( * ) Notice: Subject to any disclaimer, the term of this patent is extended or adjusted under 35 U.S.C. 154(b) by 0 days.

(21) Appl. No.: 15/923,271

(22) Filed: Mar. 16, 2018

(65) Prior Publication Data

US 2018/0286635 A1    Oct. 4, 2018

Related U.S. Application Data

(60) Provisional application No. 62/472,642, filed on Mar. 17, 2017.

(51) Int. Cl.
*B64C 3/14* (2006.01)
*H05H 1/50* (2006.01)
(Continued)

(52) U.S. Cl.
CPC .......... *H01J 37/32064* (2013.01); *B64C 3/14* (2013.01); *B64C 23/005* (2013.01);
(Continued)

(58) Field of Classification Search
CPC .......... H01J 37/32064; H01J 37/32449; H01J 37/32568; H01J 37/32669; H01J 37/32678; B64C 3/14; H05H 13/005
See application file for complete search history.

(56) References Cited

U.S. PATENT DOCUMENTS

| 2009/0014027 A1* | 1/2009 | Schriever | B08B 5/00 |
| | | | 134/1.1 |
| 2010/0308730 A1* | 12/2010 | Mohamed | H05H 1/48 |
| | | | 315/111.21 |

(Continued)

OTHER PUBLICATIONS

PCT Search Results, Corresponding App. PCT/US2018/022837; dated Aug. 27, 2018.

*Primary Examiner* — Dedei K Hammond
*Assistant Examiner* — Raymond R Chai
(74) *Attorney, Agent, or Firm* — Adam K. Sacharoff; Much Shelist, P.C.

(57) ABSTRACT

In an embodiment of the invention there is a cyclotronic actuator. The actuator is defined by having a high-voltage plasma driver connected to a first electrode. The first electrode is surrounded by a dielectric material. A second electrode is grounded and placed away from the first electrode, such that a plasma arc is formed between the pair of electrodes when the high-voltage plasma driver is activated. A ring magnet surrounding the second electrode is configured to introduce a magnetic field locally to the plasma arc. The plasma arc will then discharge in a radial direction. The magnet creates a local magnetic field oriented vertically in a direction parallel to the axisymmetric orientation of the first and second electrodes to create a Lorentz Force. The force causes the plasma arc to move in a tangential direction and causes the plasma arc to discharge out in a circular pattern.

18 Claims, 48 Drawing Sheets
(44 of 48 Drawing Sheet(s) Filed in Color)

ILLUSTRATION OF CYCLOTRONIC PLASMA ACTUATOR ON AN AIRFOIL.

(51) Int. Cl.
  *B64C 23/00*    (2006.01)
  *H01J 37/32*    (2006.01)
  *H05H 13/00*    (2006.01)

(52) U.S. Cl.
  CPC .. *H01J 37/32449* (2013.01); *H01J 37/32568* (2013.01); *H01J 37/32669* (2013.01); *H01J 37/32678* (2013.01); *H05H 1/50* (2013.01); *H05H 13/005* (2013.01); *B64C 2230/12* (2013.01)

(56) References Cited

U.S. PATENT DOCUMENTS

| | | | |
|---|---|---|---|
| 2011/0210211 A1* | 9/2011 | Zha | B64C 21/025 244/208 |
| 2012/0027151 A1* | 2/2012 | Bystriskii | G21B 1/052 376/127 |
| 2015/0323187 A1* | 11/2015 | Gomez del Campo | F02C 7/264 60/776 |
| 2015/0380113 A1* | 12/2015 | Wong | G21B 3/006 376/133 |
| 2016/0029472 A1* | 1/2016 | Jevtic | H05H 1/46 250/288 |
| 2016/0356501 A1* | 12/2016 | Gomez del Campo | F02C 7/264 |

\* cited by examiner

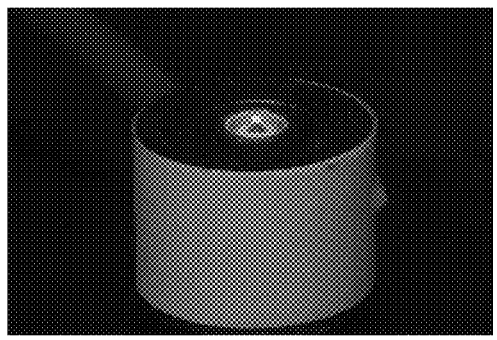
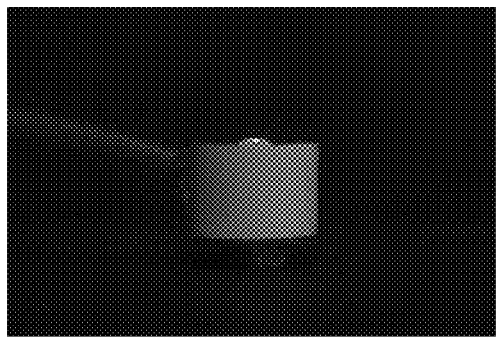
FIG. 1(A)  FIG. 1(B)
FIG. A1 and 1B CYCLOTRONIC PLASMA ACTUATOR: 1A) ISOMETRIC VIEW, 1B) SIDE VIEW.
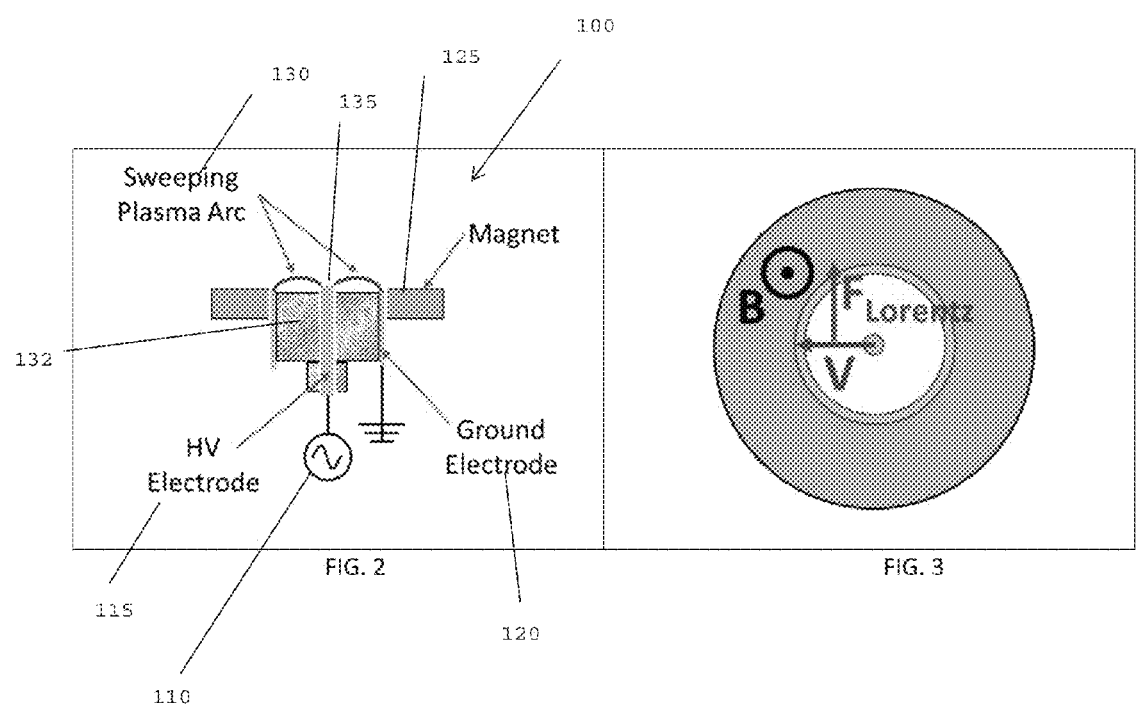
FIG. 2
FIG. 3

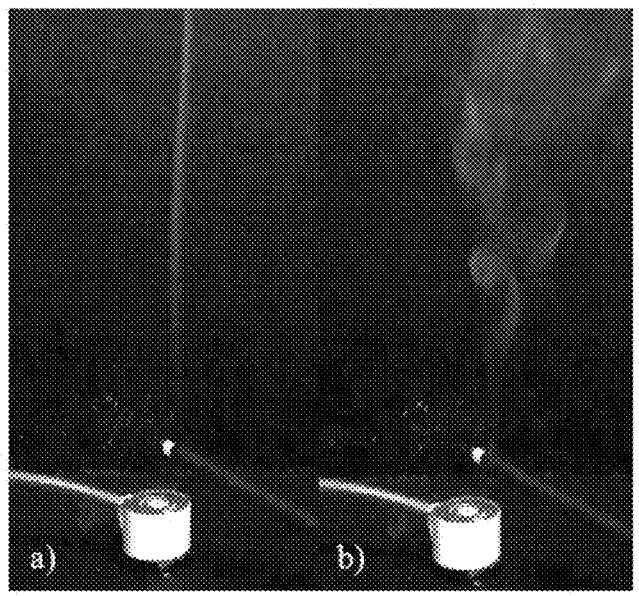
FIGS. 4A and 4B. OPERATION OF ACTUATOR: (A) PLASMA OFF, (B) PLASMA ON
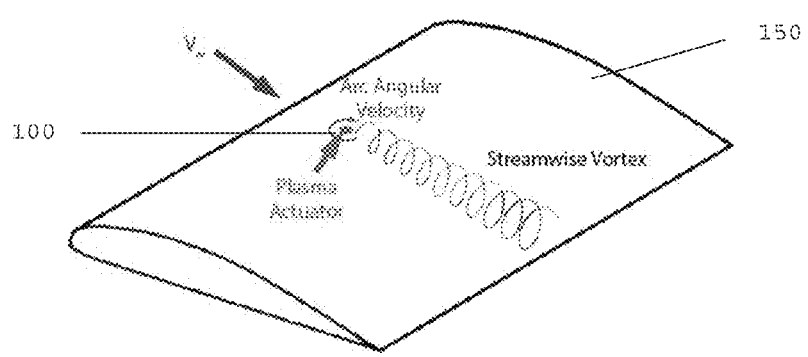
FIG. 5. ILLUSTRATION OF CYCLOTRONIC PLASMA ACTUATOR ON AN AIRFOIL.

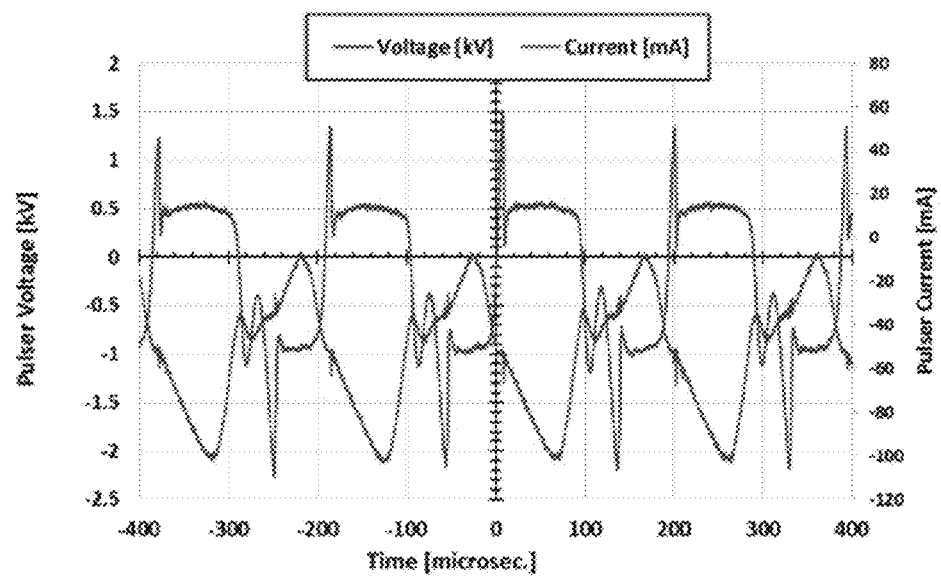
FIG. 6A - 2.5 MM GAP, 5.2 KHZ
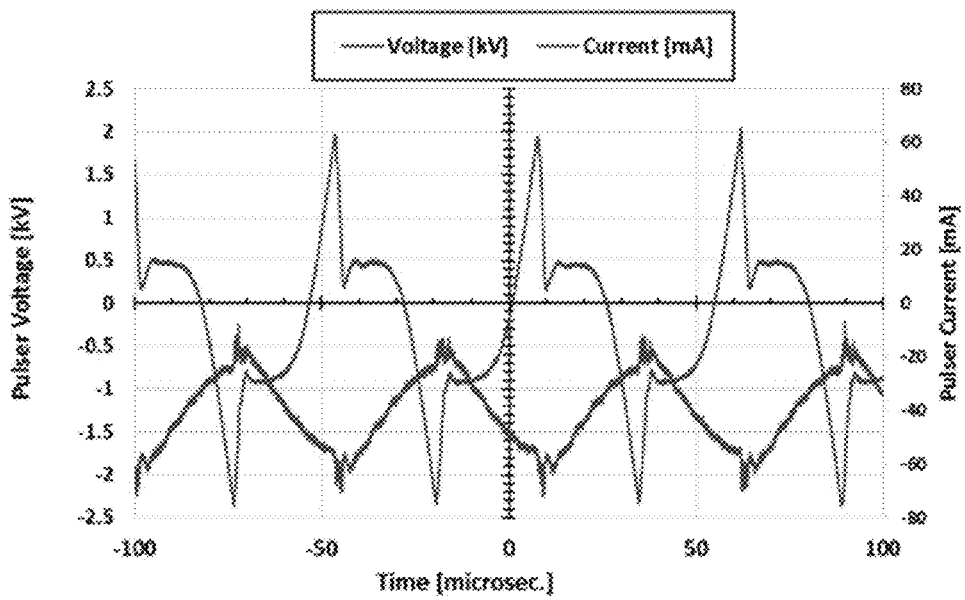
FIG. 6B 2.5 MM GAP, 18 KHZ

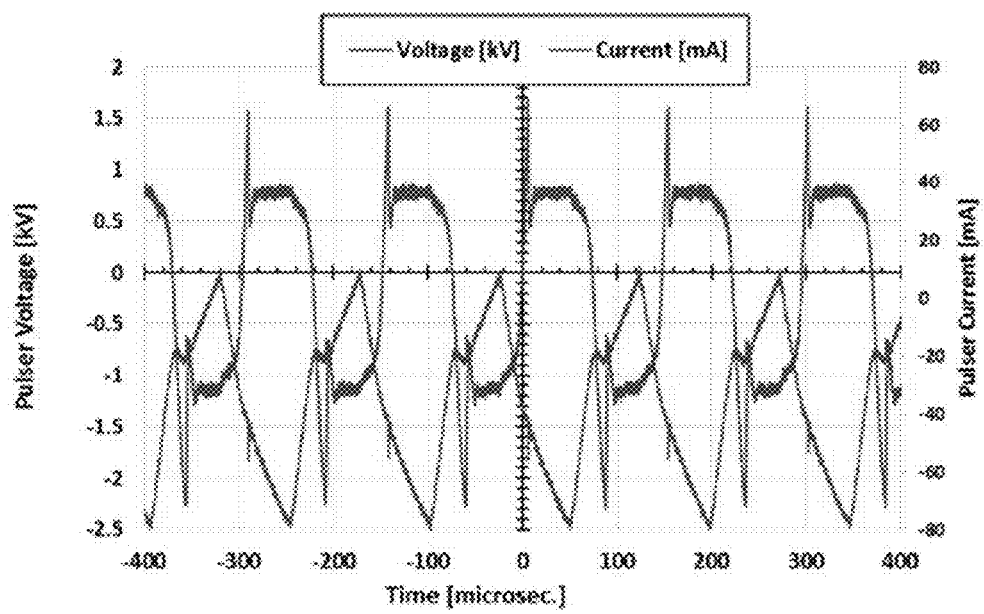
FIG. 6C 4 MM GAP, 6.8 KHZ
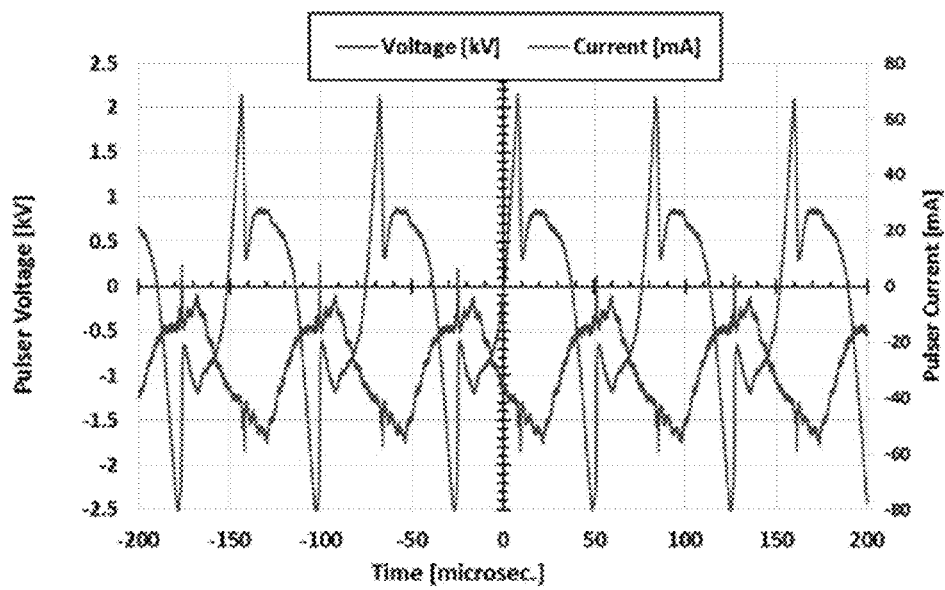
FIG. 6D 4 MM GAP, 13.2 KHZ

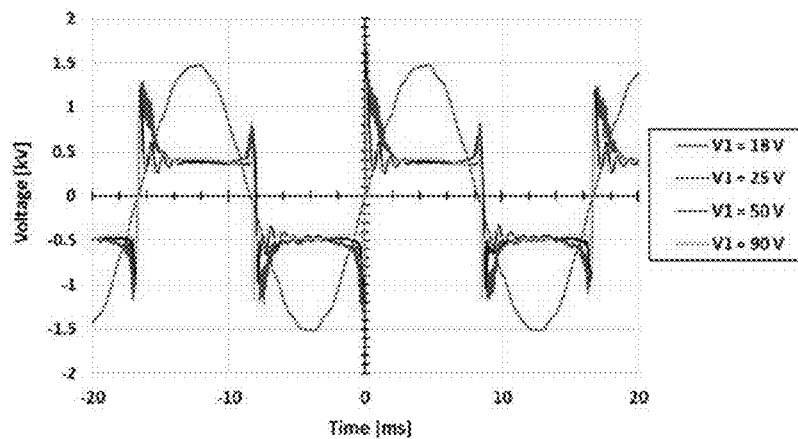
FIG. 7A. (Voltage) V-I CHARACTERISTICS OF A CYCLOTRONIC PLASMA ACTUATOR DRIVEN WITH A 60 HZ AC TRANSFORMER
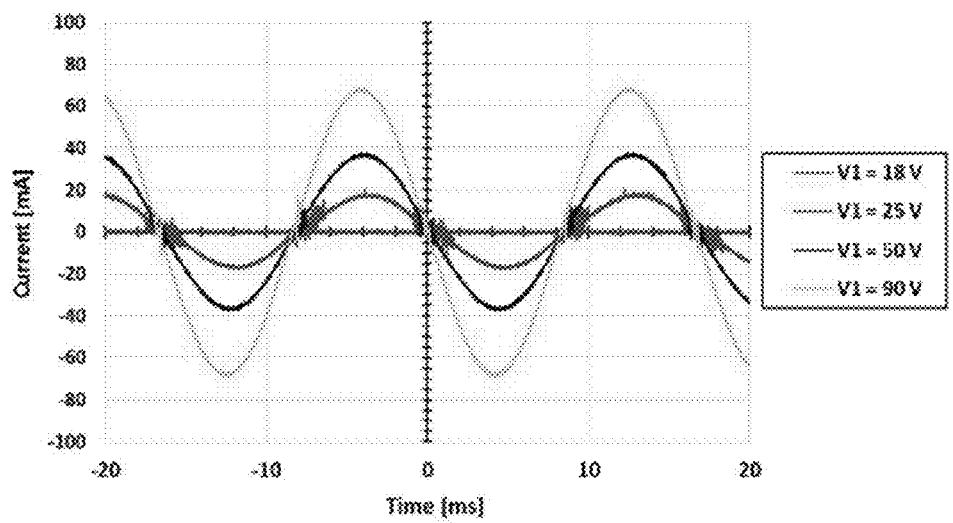
FIG. 7B. (CURRENT) V-I CHARACTERISTICS OF A CYCLOTRONIC PLASMA ACTUATOR DRIVEN WITH A 60 HZ AC TRANSFORMER

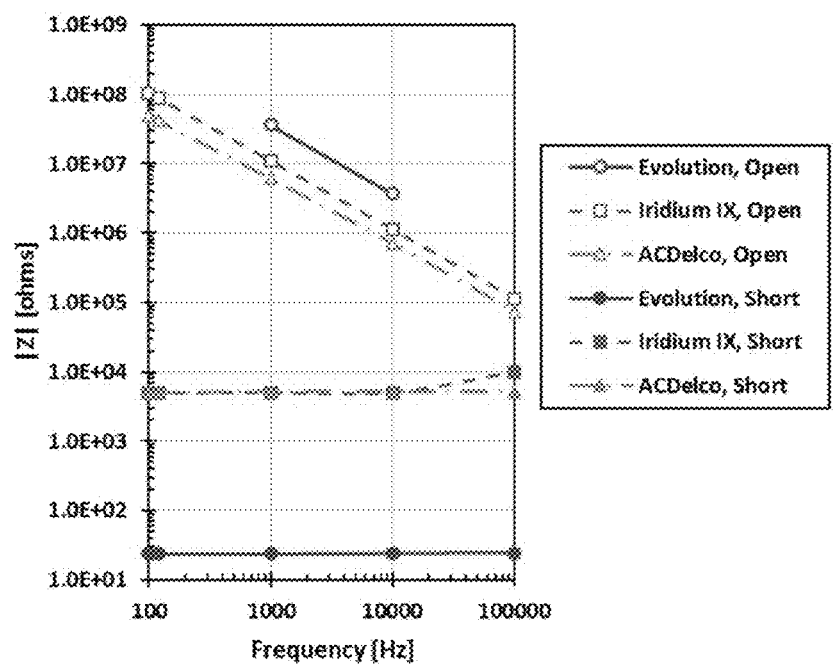
FIG. 8. IMPEDANCE MEASUREMENTS FOR MODIFIED SPARKPLUGS USED AS COAXIAL ELEMENTS IN CYCLOTRONIC PLASMA ACTUATOR EXPERIMENTS

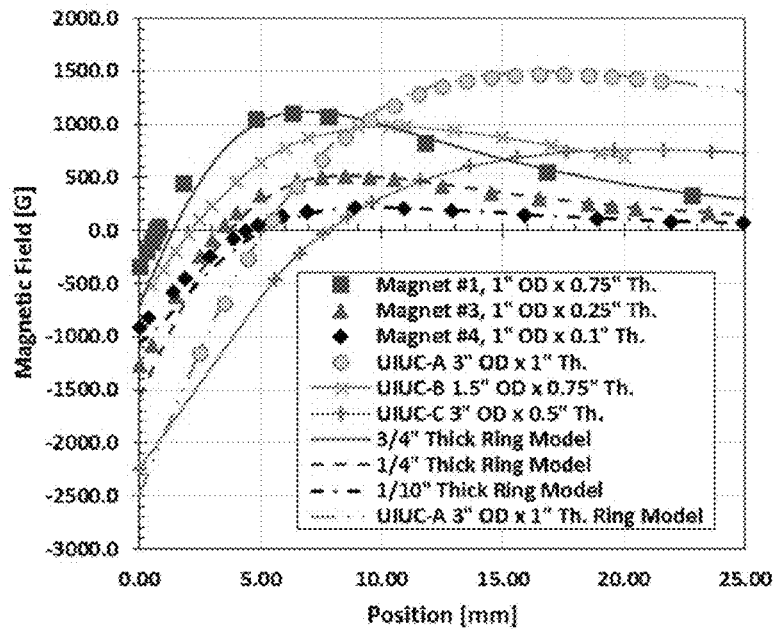
FIG. 9A CENTERLINE MAGNETIC FIELD MEASUREMENTS MADE ABOVE SURFACE OF RING MAGNETS WITH ALPHALAB GM-1-ST: (A) CENTERLINE WITH COMPARISON TO HEURISTIC (DATA-BASED) MODEL
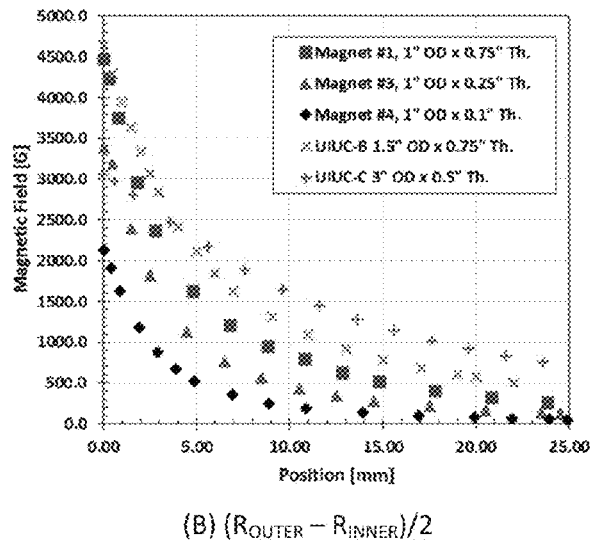
(B) $(R_{OUTER} - R_{INNER})/2$
FIG. 9B. MAGNETIC FIELD MEASUREMENTS MADE ABOVE SURFACE OF RING MAGNETS WITH ALPHALAB GM-1-ST: (B) ABOVE $(R_{OUTER} - R_{INNER})/2$

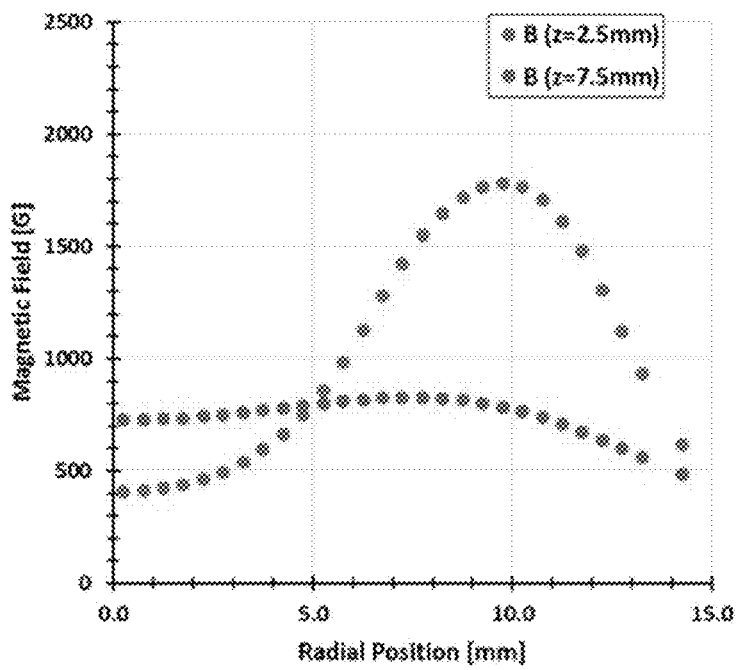
FIG. 9C. DC MAGNETIC FIELD MEASUREMENTS AS A FUNCTION OF RADIUS
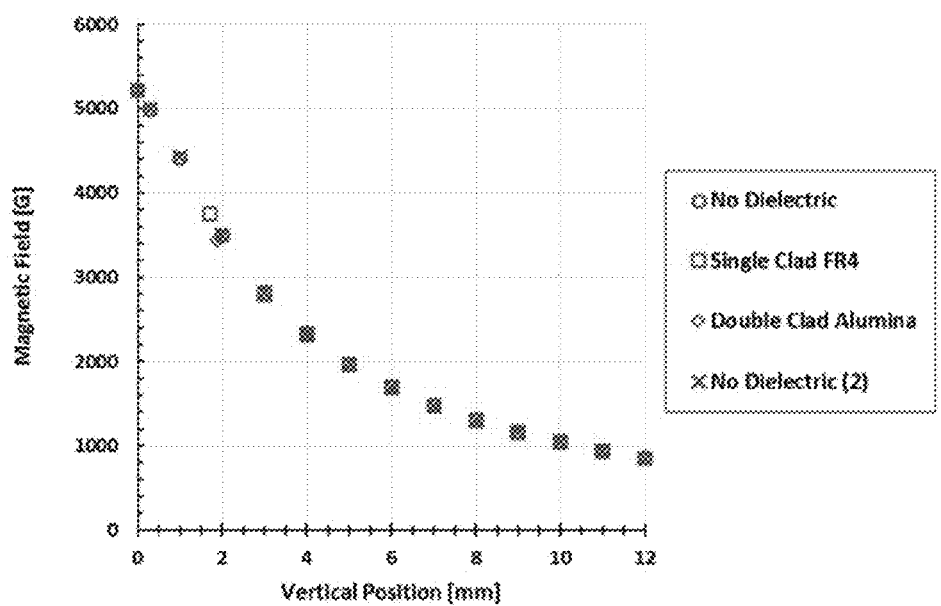
FIG. 9D. DC MAGNETIC FIELD MEASUREMENTS AS A FUNCTION OF VERTICAL POSITION WITHOUT AND WITH DIELECTRIC SPACERS.

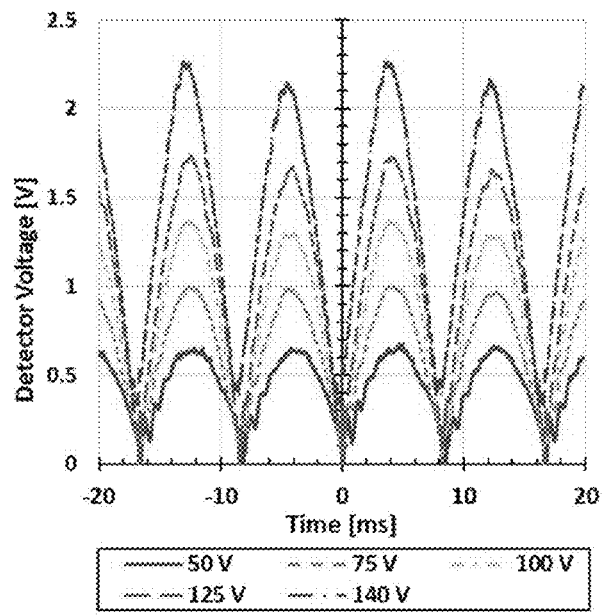
FIG. 10A. MEASUREMENTS OF LIGHT EMISSION PULSES WITH UDT UV-100 SILICON DETECTOR AS TRANSFORMER VOLTAGE VARIES.
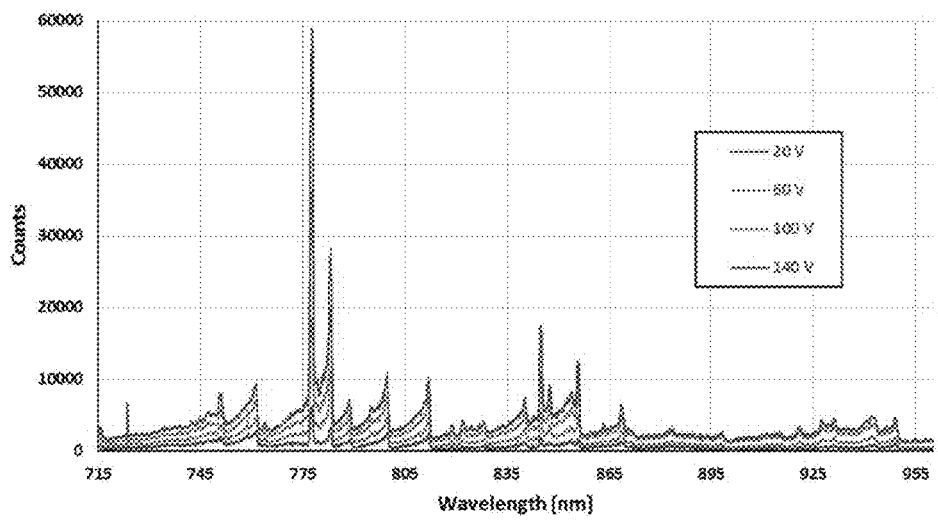
FIG. 10B. NEAR INFRARED EMISSIONS FROM THE SWEEPING AC ARC PLASMA FORMED IN THE CYCLOTRONIC PLASMA ACTUATOR.

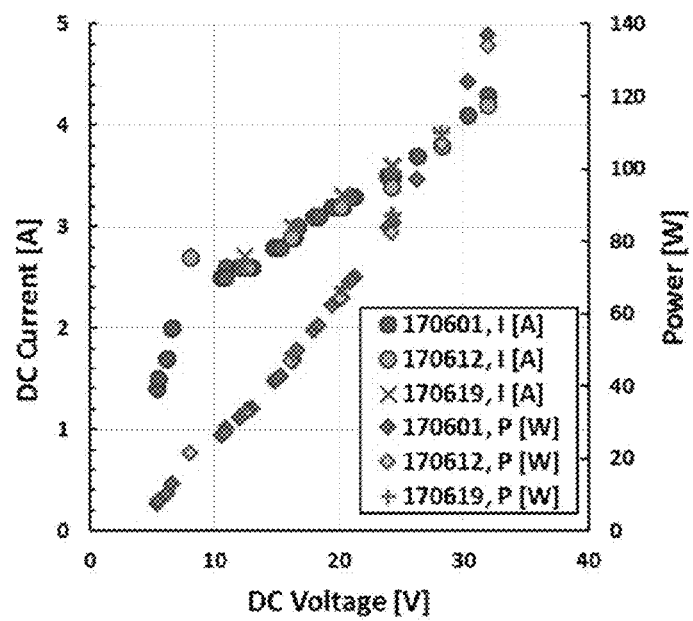
FIG. 11A. FLYBACK CIRCUIT DATA FOR ZVS MODULE #1: *I-V, P-V* INPUT
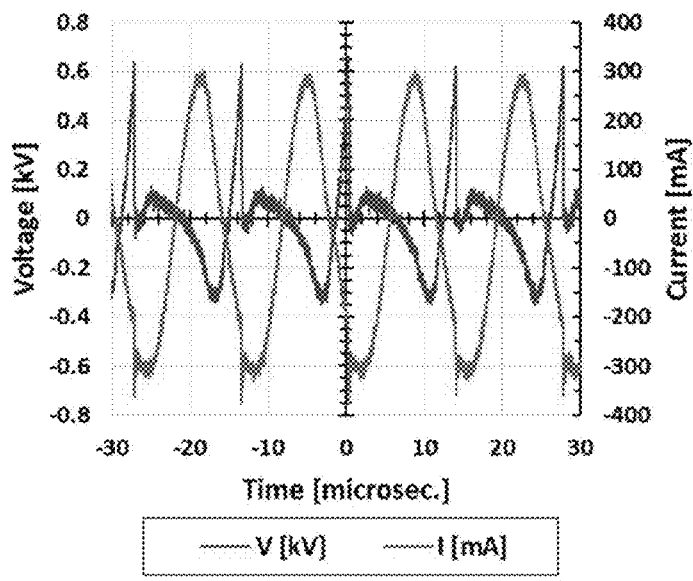
FIG. 11B. FLYBACK CIRCUIT DATA FOR ZVS MODULE #1 SAMPLE VOLTAGE AND CURRENT WAVEFORMS AT 73 KHZ WITH 16.2 V AND 2.9 A DC SUPPLY

FIG. 12A RECONFIGURABLE COAX DESIGN ASSEMBLED ACTUATOR
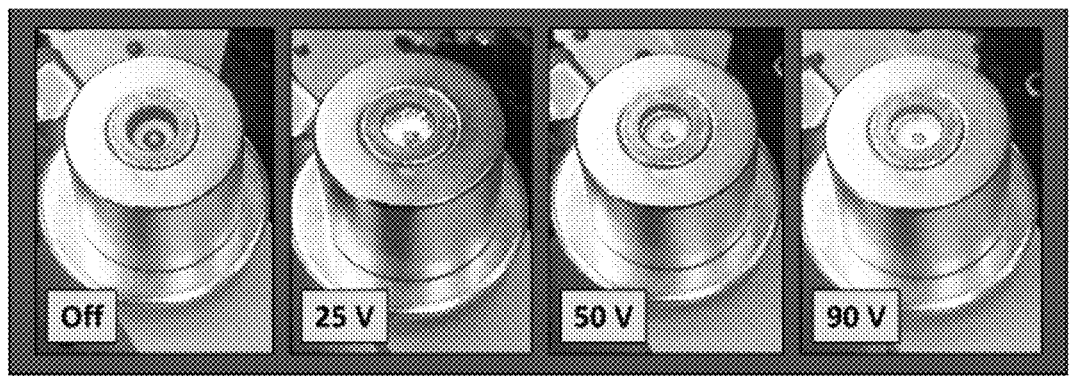
FIG. 12B RECONFIGURABLE COAX DESIGN images of actuator operating at different voltage settings with 60 Hz bipolar excitation.

FIG. 12C, 12D Example Cyclotronic Plasma Actuator (Coaxial Type 1 configuration)
(a) components, (b) test stand operation

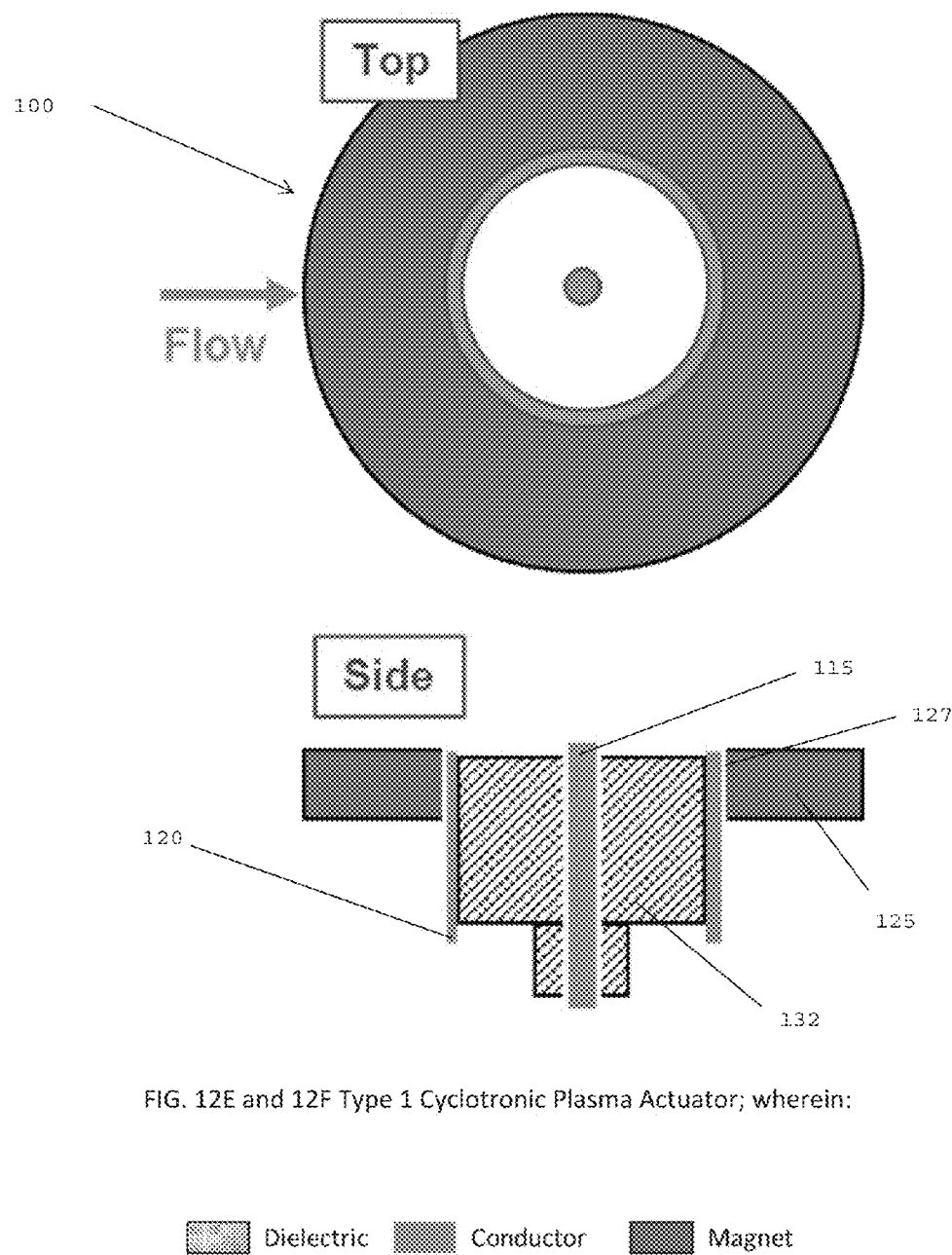
FIG. 12E and 12F Type 1 Cyclotronic Plasma Actuator; wherein:

FIG. 13A Coaxial Arc-Magnet Actuator Type 2 Bench Test Components
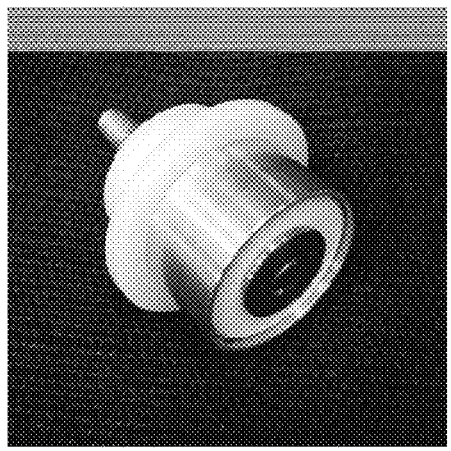
FIG. 13B Coaxial Arc-Magnet Actuator Type 2 Bench Test Components
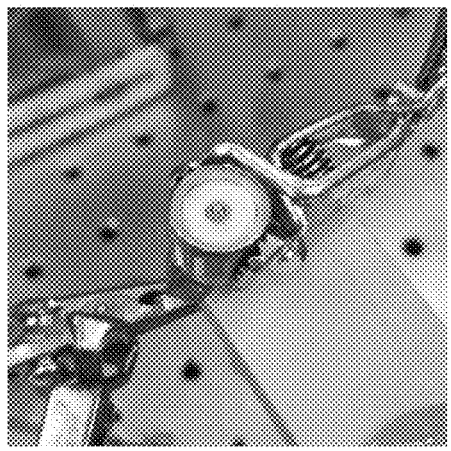
FIG. 13C Coaxial Arc-Magnet Actuator Type 2 Bench Test Components

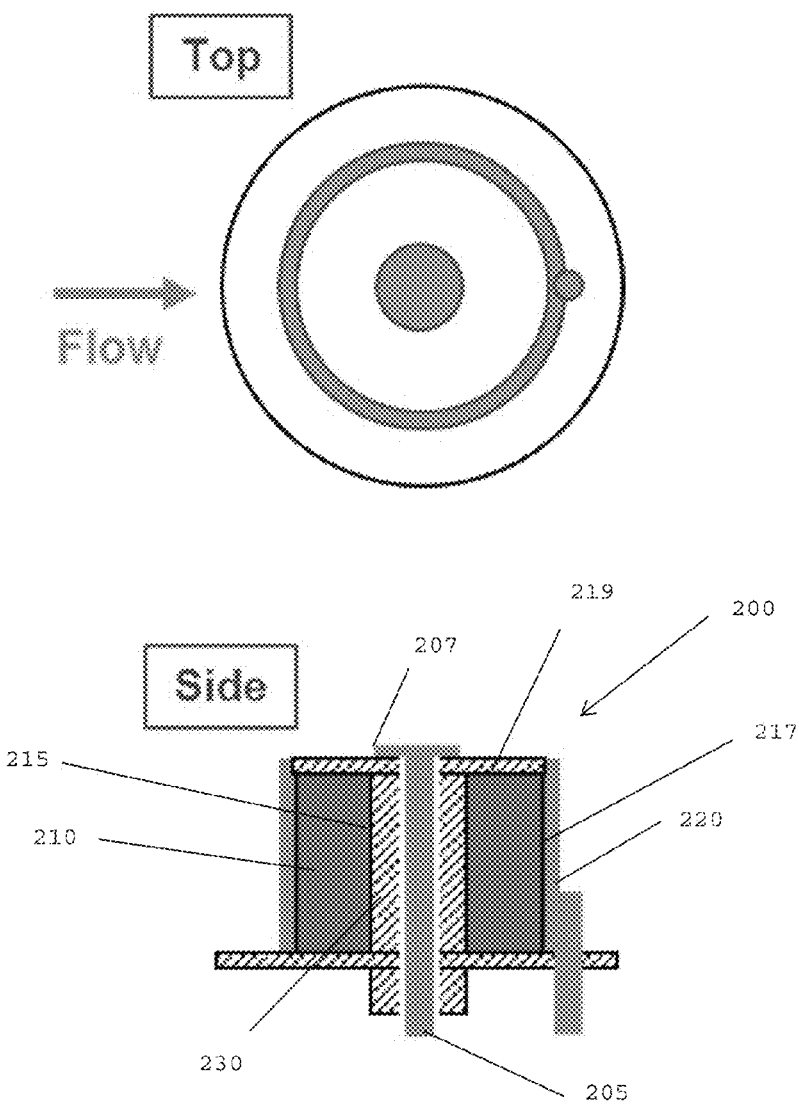
FIG. 14A and 14B Type 2 Cyclotronic Plasma Actuator; wherein: Dielectric, Conductor, Magnet

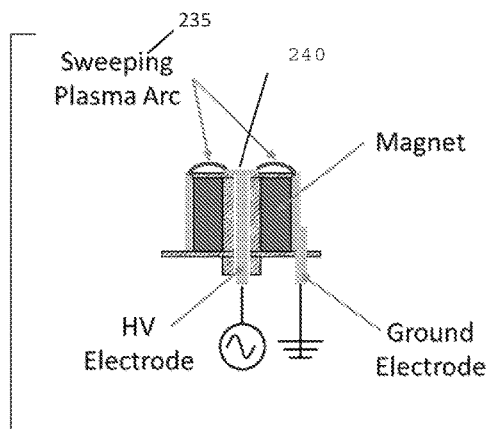
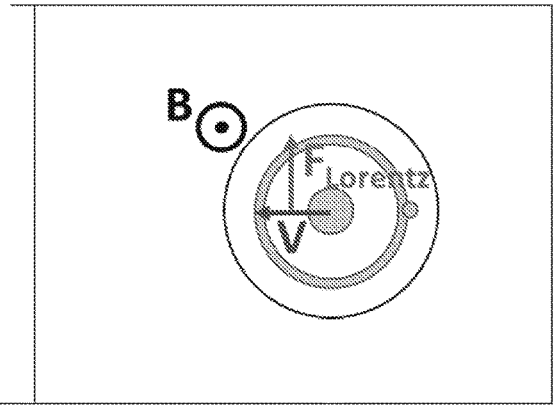
FIG 14C
FIG. 14D
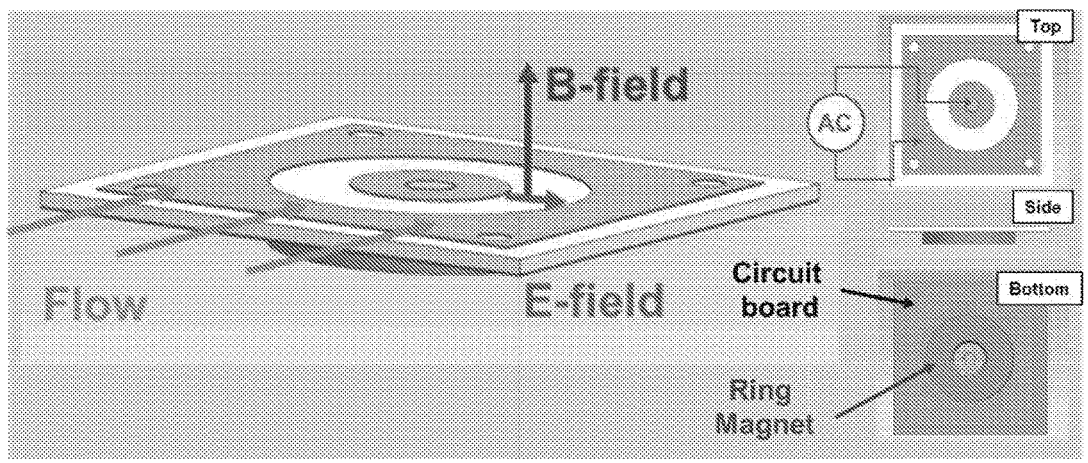
FIG. 15A CYCLOTRONIC PLASMA ACTUATOR CONCEPT WITH EMBEDDED MAGNET

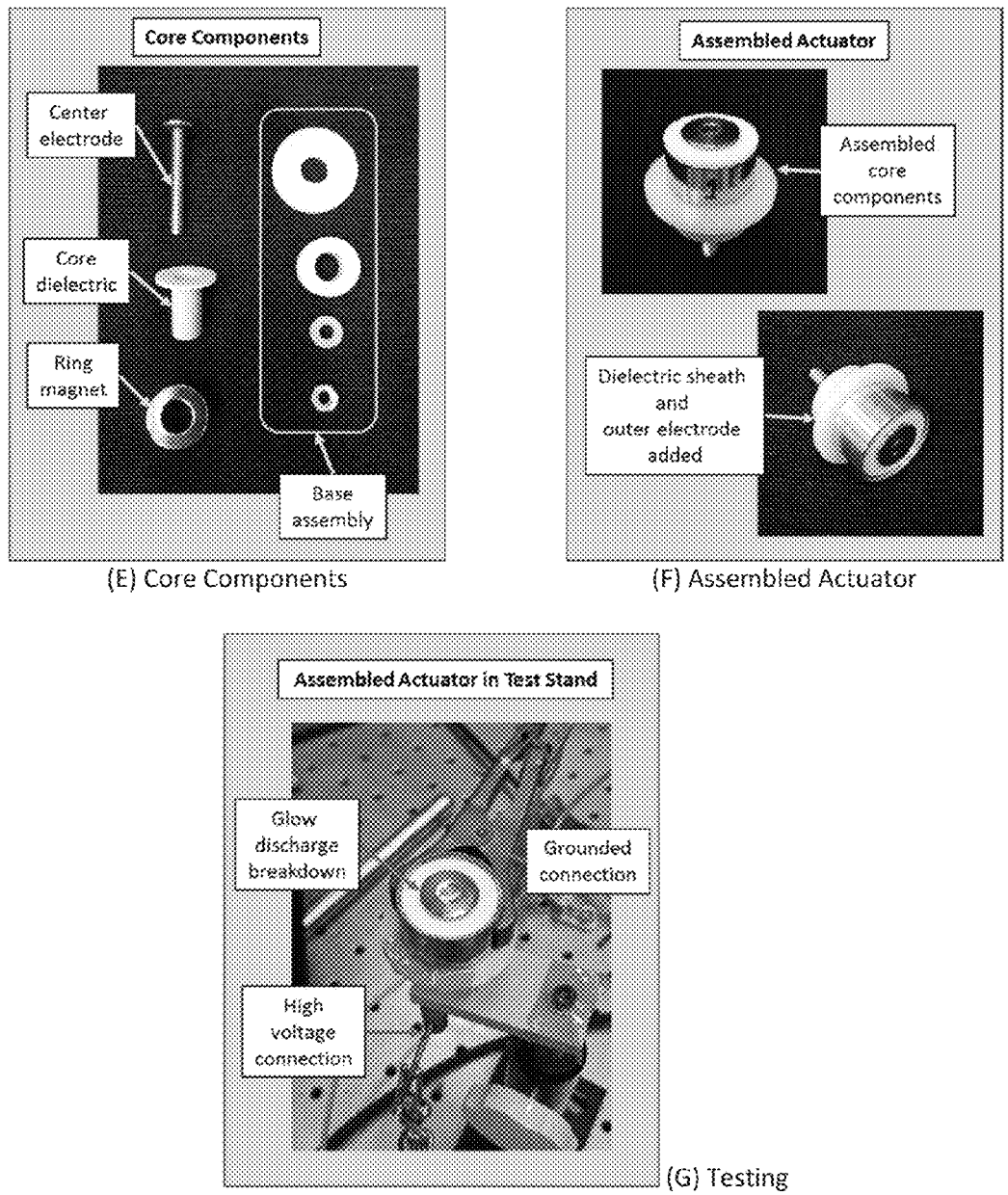
Figure 14E, 14F, 14G Assembly Process for a Cyclotronic Type 2 Plasma Actuator
(E) core components, (F) assembled actuator, (G) Testing

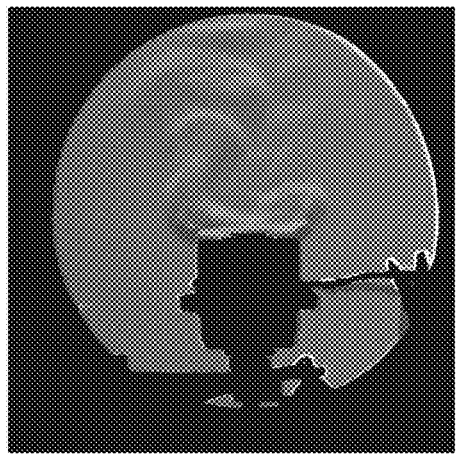
FIG 14H. Schlieren Image of Cyclotronic Plasma Type 2 Actuator with Discharge Activated (quiescent flow)
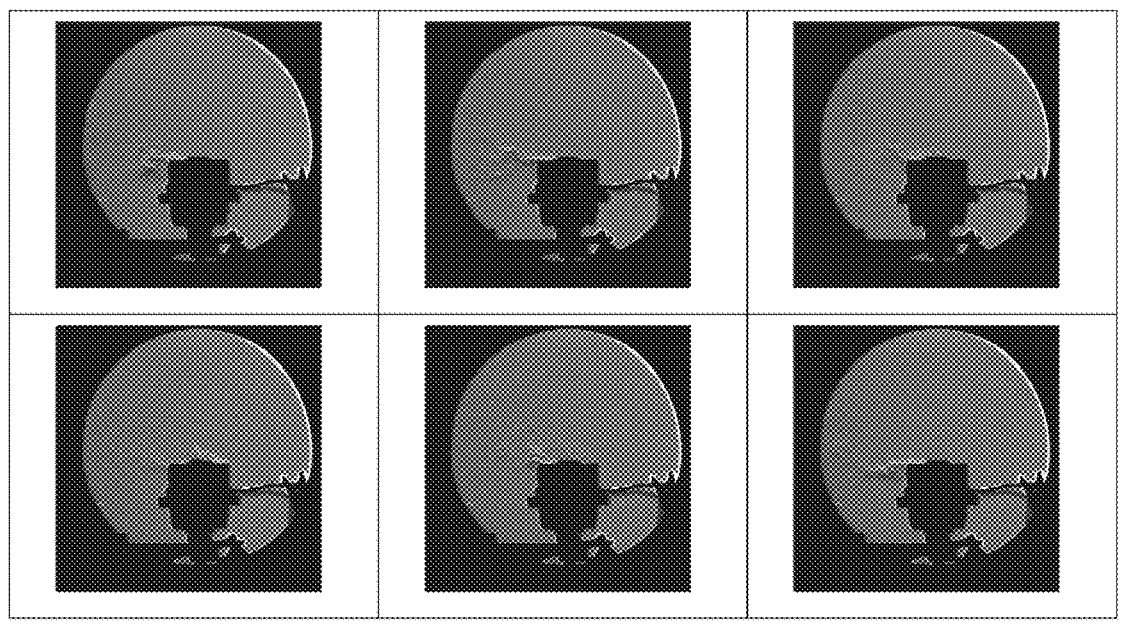
FIG. 14I. Schlieren Images of Cyclotronic Plasma Type 2 Actuator with Discharge Activated and Air Flow (Right to Left)

FIG. 15B and 15C Type 3 Cyclotronic Plasma Actuator; wherein: Dielectric, Conductor, Magnet FIGS 16A – 16C. TESTING OF EMBEDDED MAGNET DESIGNS: (A) TESTING OF A CNC FILLED BOARD, (B) VARIOUS ELECTRODE PATTERNS CHEMICALLY ETCHED IN CU-CLAD FR4 WITH $FECL_3$, AND (C) IMAGE OF ARC ROTATION IN ETCHED COAX WITH 60 HZ BIPOLAR EXCITATION.

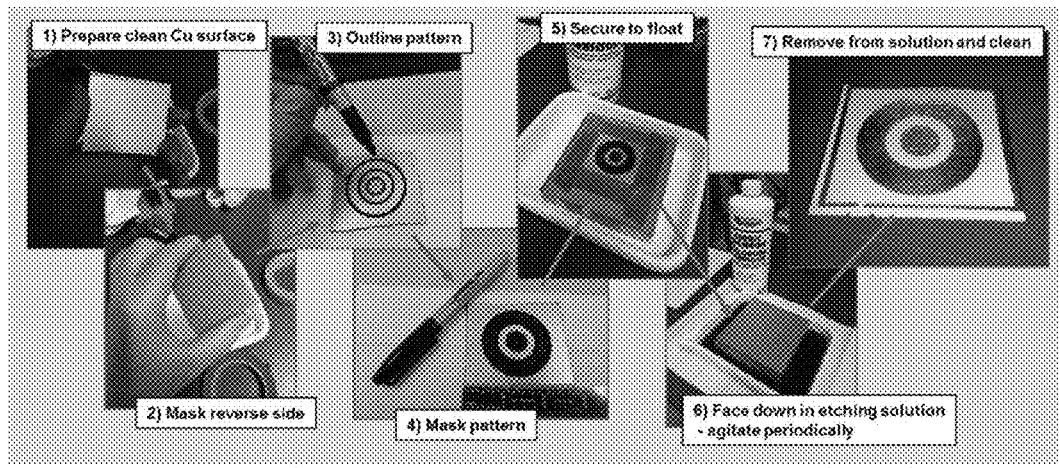
FIG. 16D PROCESS FOR CHEMICALLY ETCHING CU-CLAD ALUMINA IN FERRIC CHLORIDE
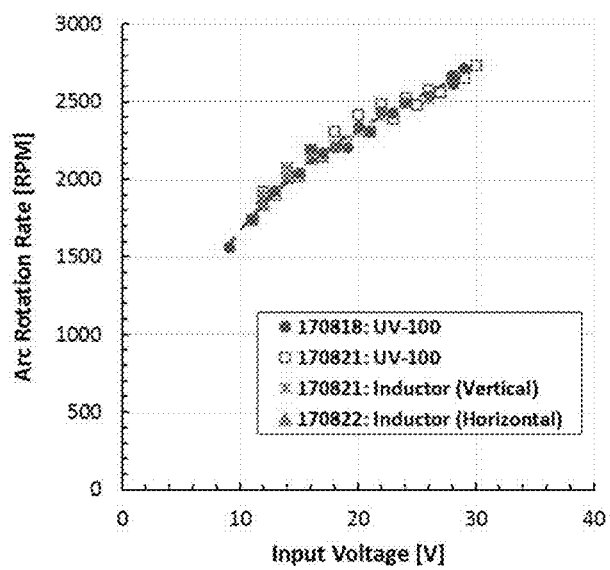
FIG 17A. ARC ROTATION RATES MEASURED BY UV SENSOR AND INDUCTIVE PICKUP TACHOMETERS. THE ACTUATOR UNDER TEST IS C2A WITH POWER SUPPLIED BY A ZVS MODULE DRIVEN AT VARIED DC VOLTAGES.

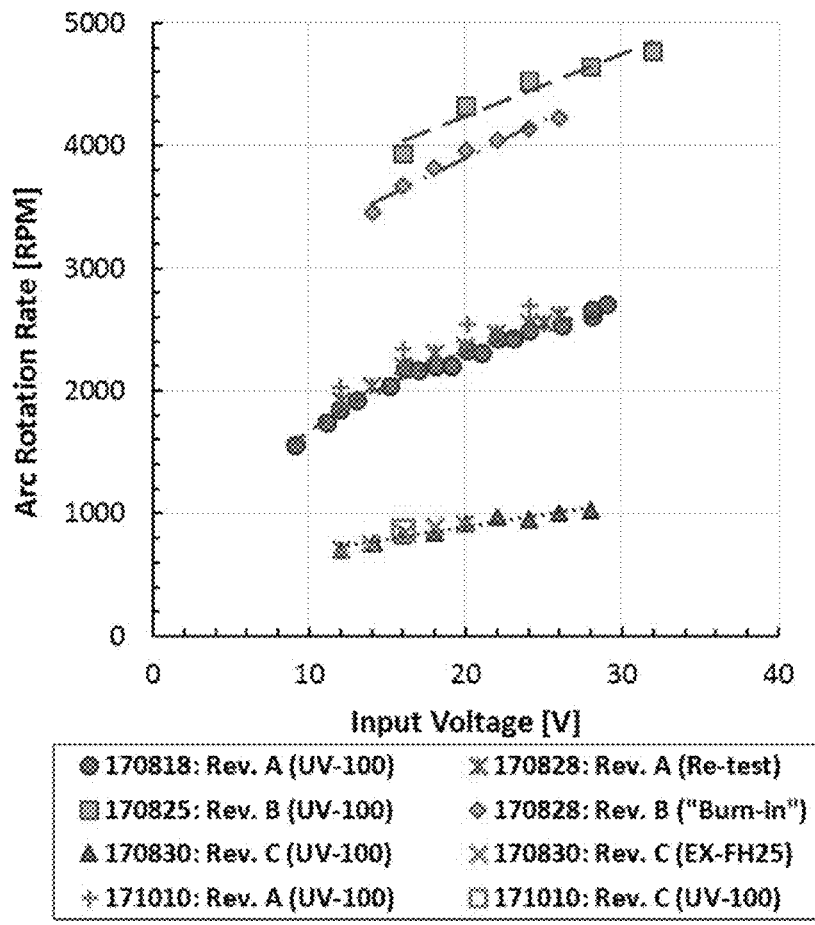
FIG 17B. ARC ROTATION RATES FOR VARIOUS COAX TYPE 2 BENCH TEST CONFIGURATIONS. THE ACTUATORS UNDER TEST ARE COAX TYPE 2 VARIANTS WITH POWER SUPPLIED BY A ZVS MODULE DRIVEN AT VARIED DC VOLTAGES.

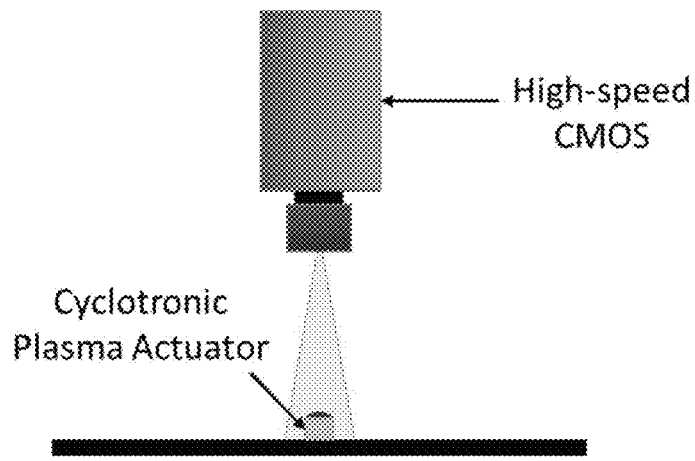
FIG. 18A. CONFIGURATION OF HIGH-SPEED IMAGING EXPERIMENTS FOR MONITORING OF ARC ROTATION IN CYCLOTRONIC PLASMA ACTUATOR
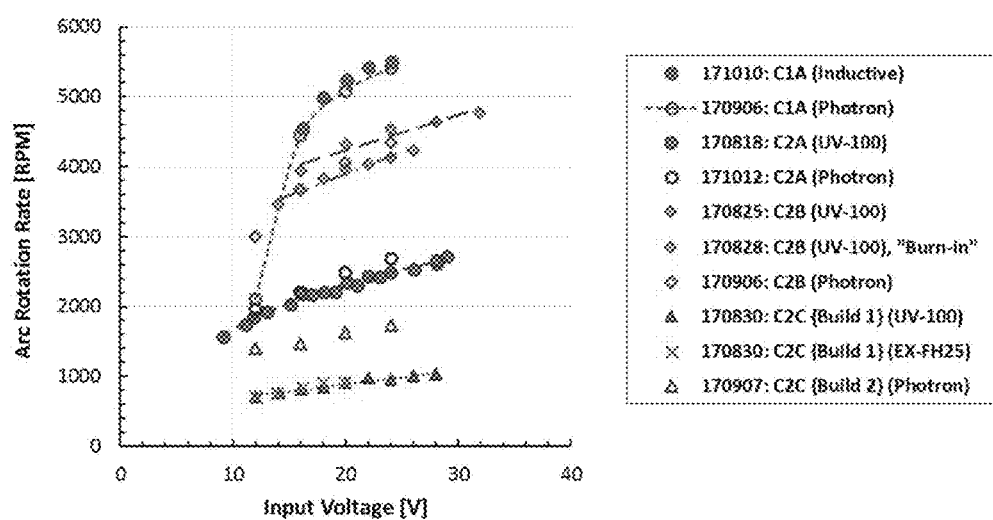
FIG 18B. ARC ROTATION RATES FOR VARIOUS COAXIAL ACTUATOR BENCH TEST CONFIGURATIONS

C1A

C2A

C2B

C2C2

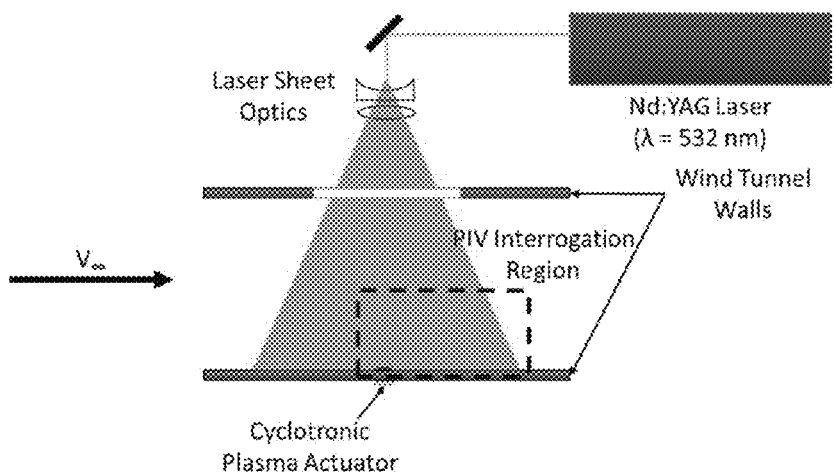
FIG. 19. SCHEMATIC OF PIV DATA ACQUISITION CONFIGURATION IN 1-FT × 1-FT SUBSONIC WIND TUNNEL.
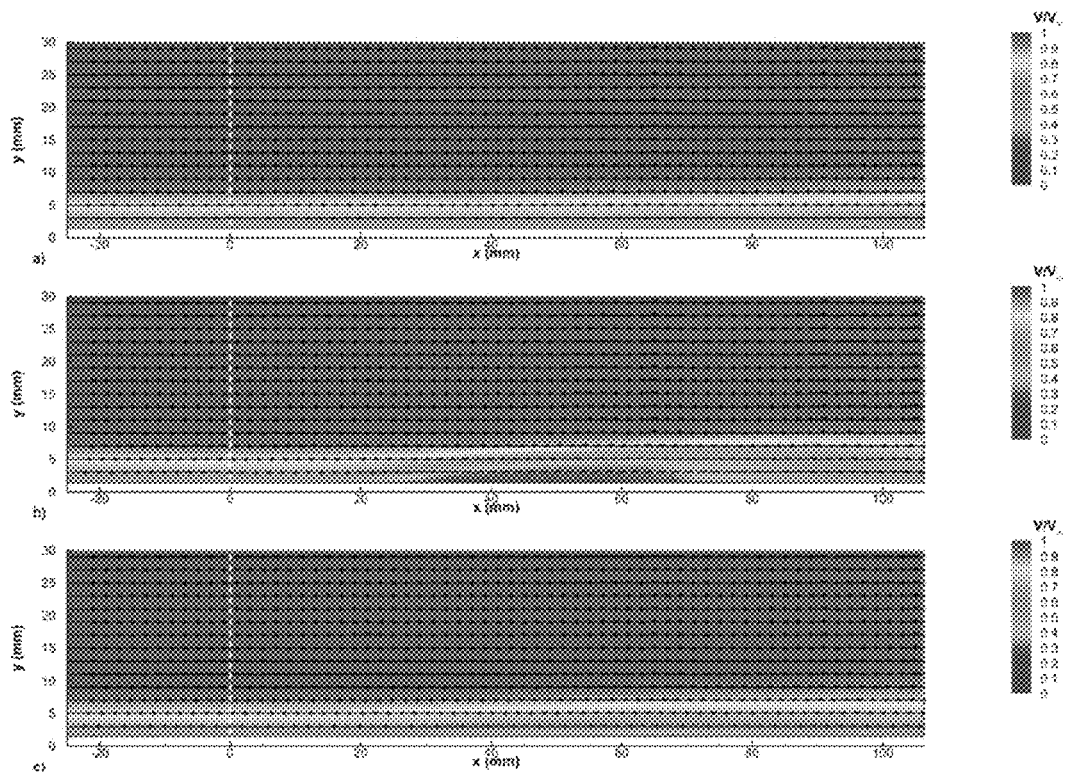
FIGS. 20A, 20B, 20C. VELOCITY SCALAR FIELD FOR FLAT-PLATE BOUNDARY LAYER WITH: A) NO ACTUATION, B) CONTINUOUS ACTUATION, C) BURST MODE ACTUATION.

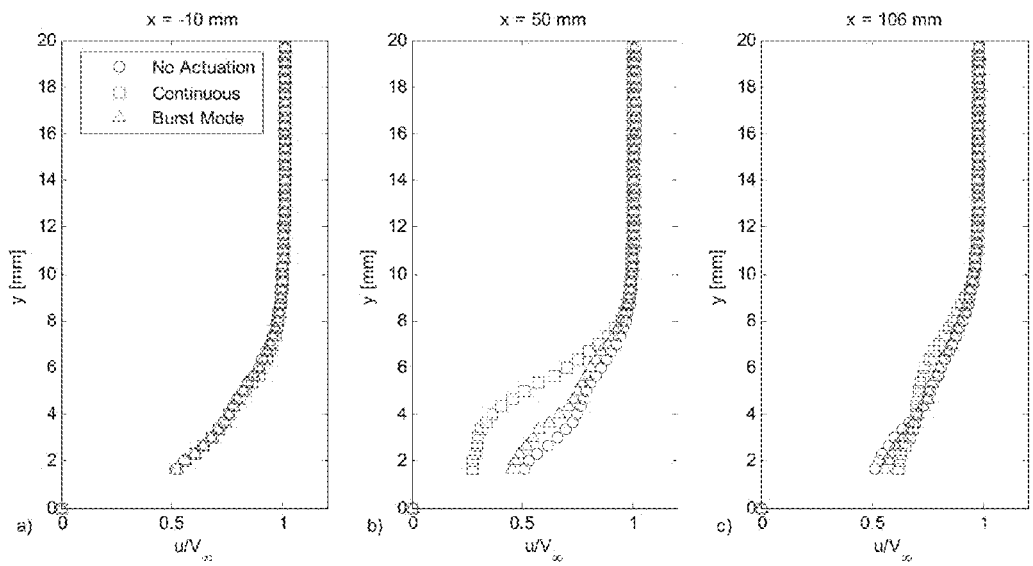
FIGS. 21A, 21B, and 21C. BOUNDARY-LAYER PROFILES EXTRACTED FROM PIV DATA: A) X = -10 MM, B) X = 50 MM, C) X = 106 MM.
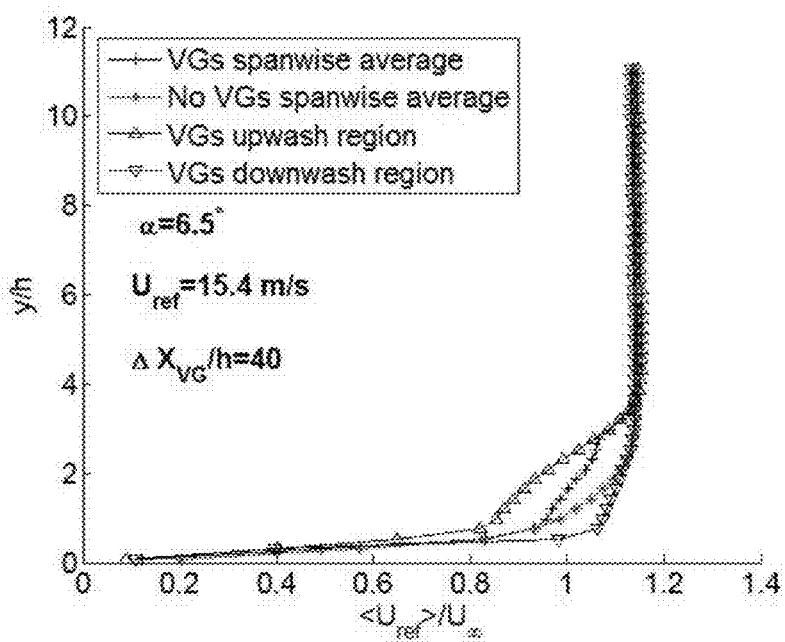
FIG. 22A. BOUNDARY-LAYER PROFILES DOWNSTREAM OF PASSIVE VORTEX GENERATORS ON A DU 91-W2-250 AIRFOIL: A = 6.5 DEG,

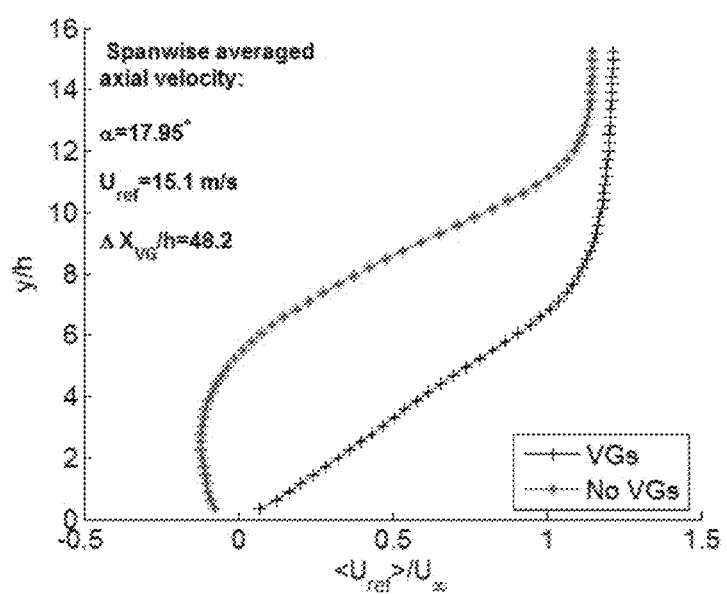
FIG. 22B. BOUNDARY-LAYER PROFILES DOWNSTREAM OF PASSIVE VORTEX GENERATORS ON A DU 91-W2-250 AIRFOIL: A = 17.95 DEG.

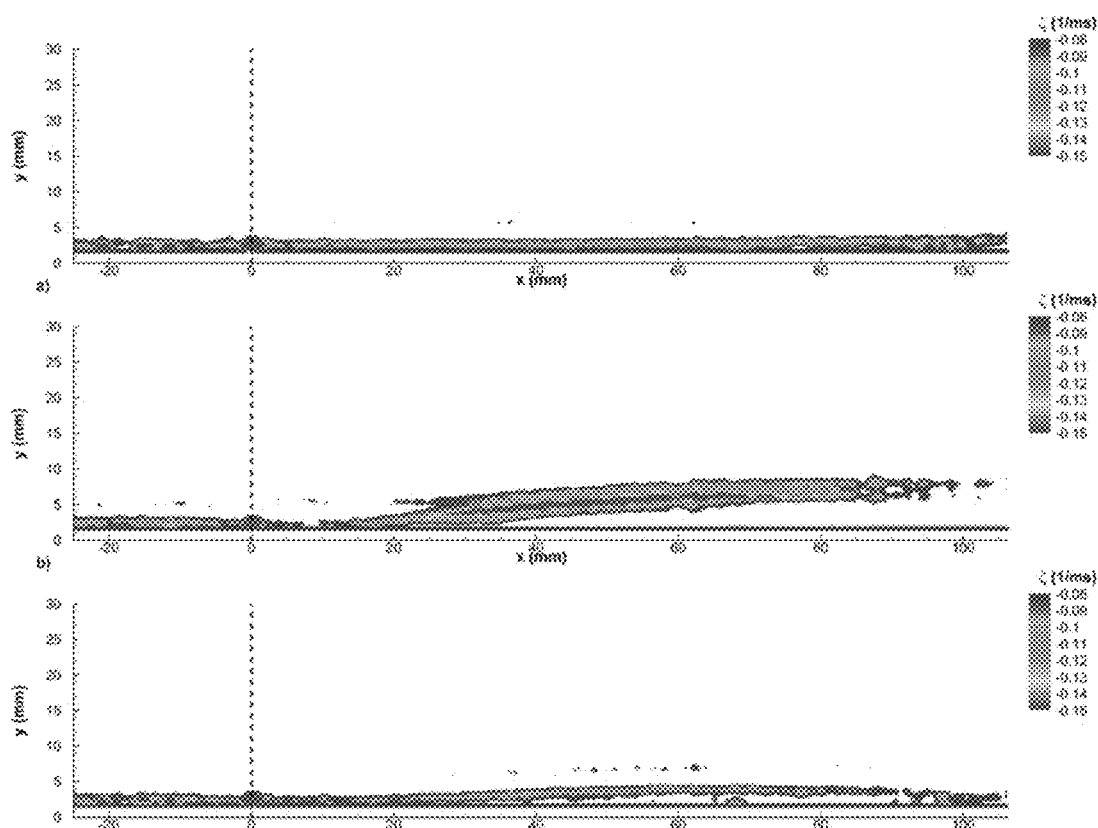
FIG 23A, 23B, 23C. Z-VORTICITY FIELD FOR FLAT-PLATE BOUNDARY LAYER WITH: A) NO ACTUATION, B) CONTINUOUS ACTUATION, C) BURST MODE ACTUATION.

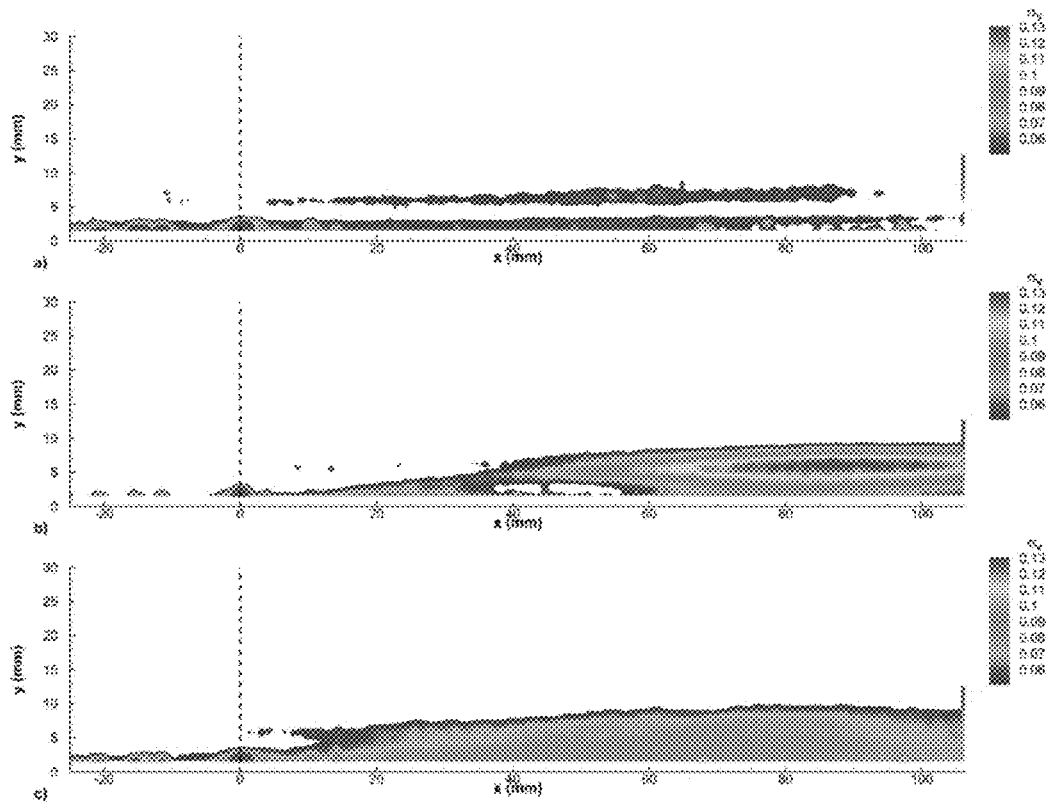
FIG 24A, 24B, 24C. STANDARD DEVIATION OF VELOCITY SCALAR FIELD FOR FLAT-PLATE BOUNDARY LAYER WITH: A) NO ACTUATION, B) CONTINUOUS ACTUATION, C) BURST MODE ACTUATION.
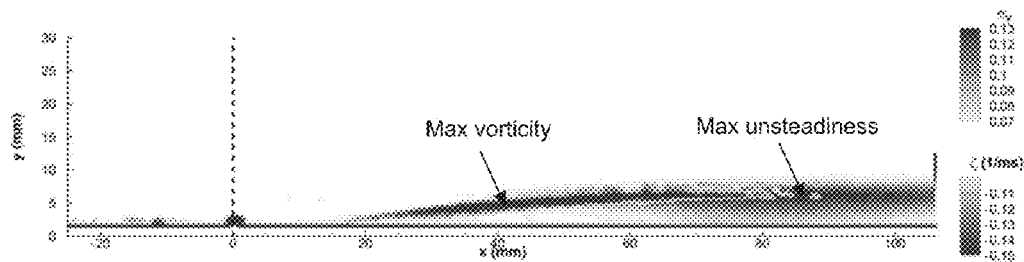
FIG. 25. CO-PLOT OF Z-VORTICITY AND VELOCITY STANDARD DEVIATION CONTOURS, WITH LOCATIONS IN MAXIMUM MAGNITUDES INDICATED BY ARROW SYMBOL.

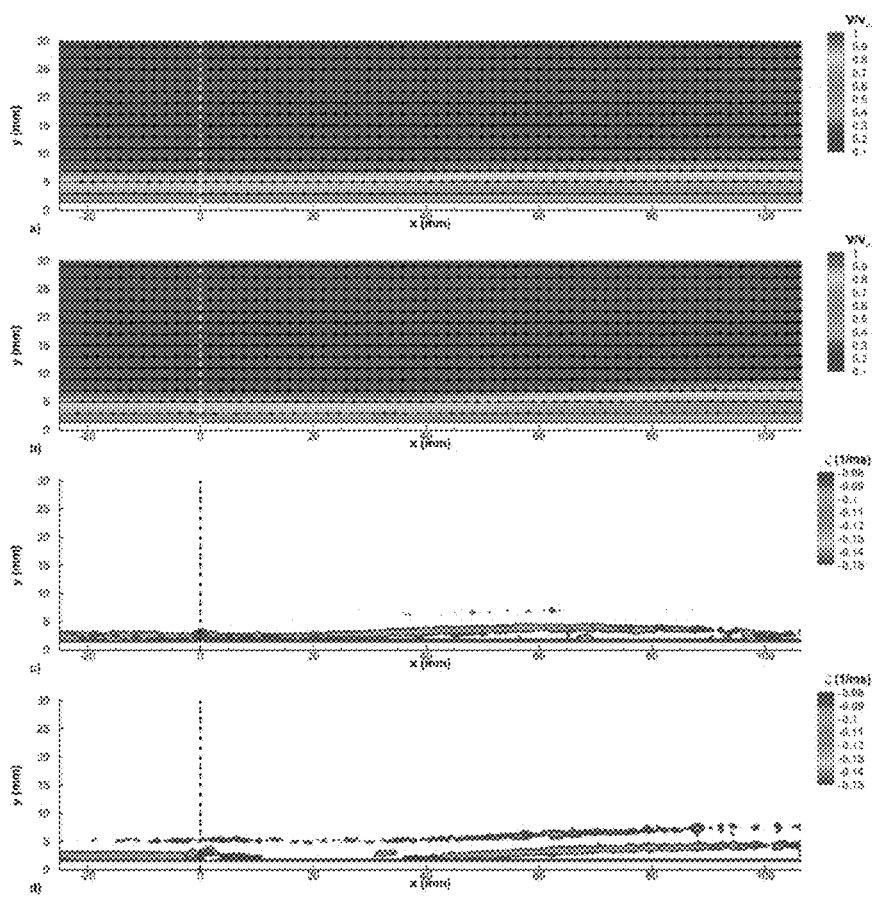
FIGS. 26A, 26B, 26C, 26D. COMPARISON OF ACTUATION EFFECTS OF SPARK PLUGS OPERATING IN BURST MODE: A) VELOCITY FIELD OF NDK IRIDIUM PLUG, B) VELOCITY FIELD OF ACDELCO PLUG, C) Z-VORTICITY FIELD OF NDK IRIDIUM PLUG, D) Z-VORTICITY OF ACDELCO PLUG.

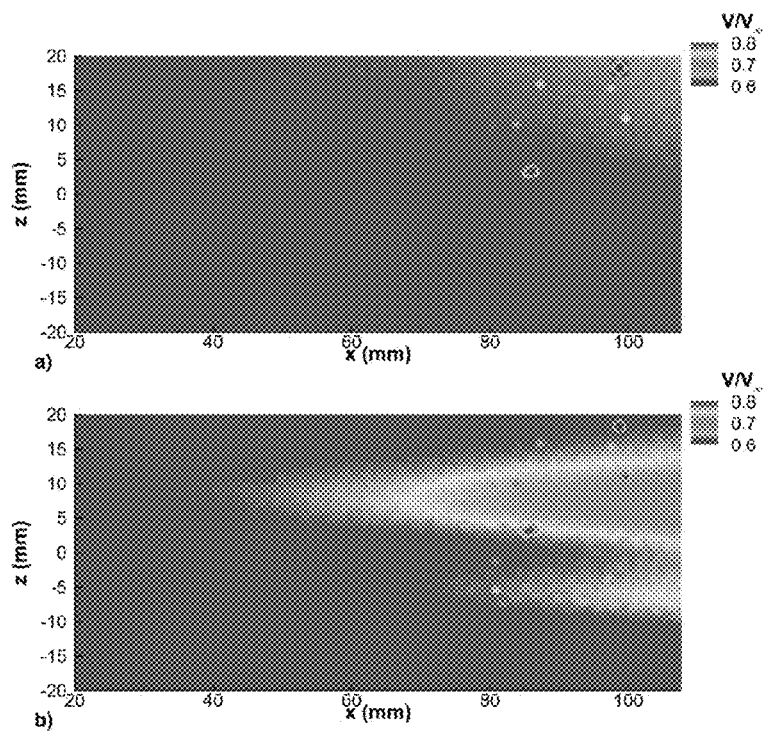
FIGS. 27A and 27B. VELOCITY SCALAR OF (A) UNACTUATED AND (B) CONTINUOUS ACTUATION FLOW AT Y = 5 MM.
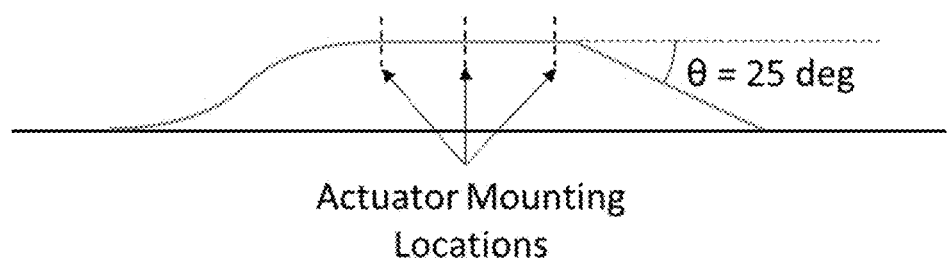
FIG. 28. SCHEMATIC OF HUMP AND DIFFUSING RAMP GEOMETRY FOR LOW-SPEED WIND TUNNEL EXPERIMENTS.

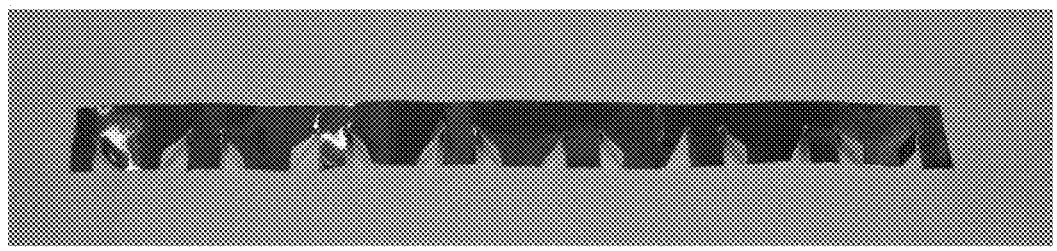
FIG. 29. VG STRIP USED FOR SEPARATION CONTROL EXPERIMENTS ON LINEAR RAMP.
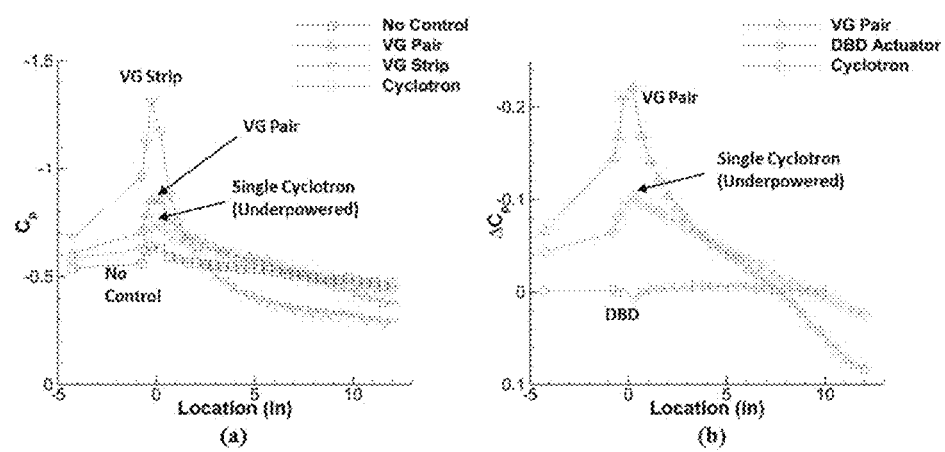
FIGS. 30A, 30B. PRESSURE DISTRIBUTIONS ON WALL-MOUNTED HUMP AND 25 DEG LINEAR RAMP FOR UNCONTROLLED, VG, DBD, AND CYCLOTRONIC PLASMA CONTROLLED CASES: $V_\infty = 32.1$ FT/S.

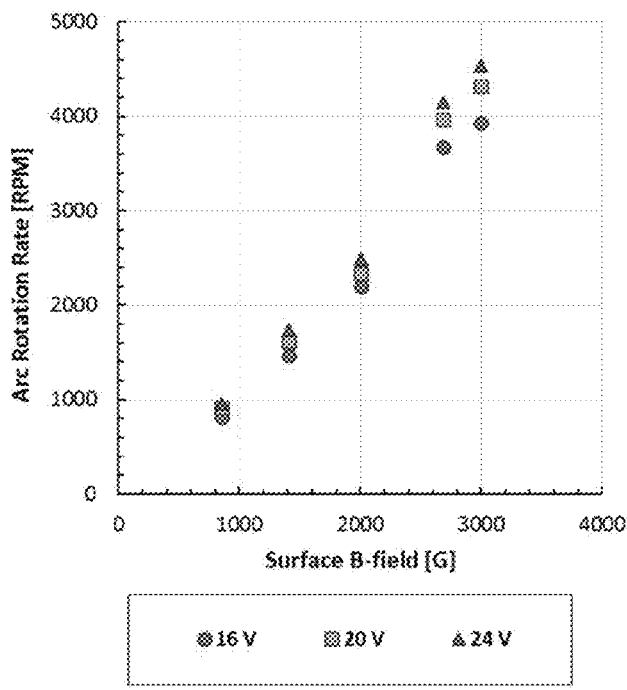
FIG. 31. SCALING OF ARC ROTATION RATE WITH B-FIELD FOR 5.5 MM COAXIAL TYPE 2 ACTUATORS
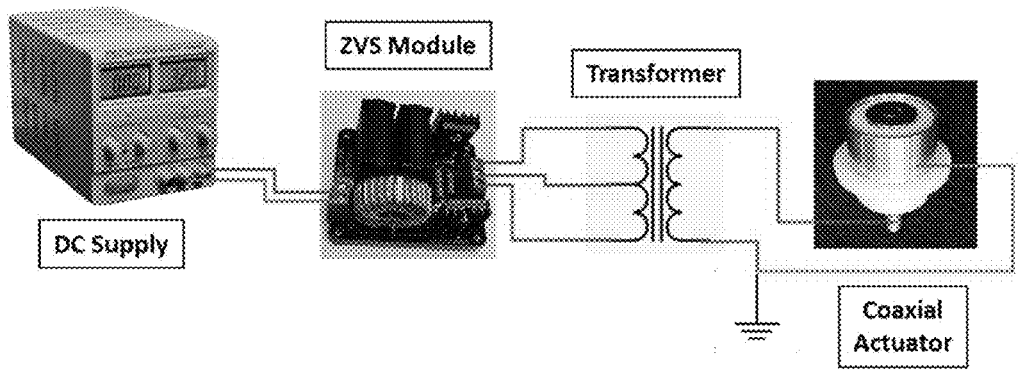
FIG. 32. COMPONENTS LAYOUT FOR ZVS CIRCUIT BENCH TEST SYSTEM

TOP VIEW

TOP, ALONG SPAN

BOTTOM VIEW

BOTTOM, SPARS INSERTED

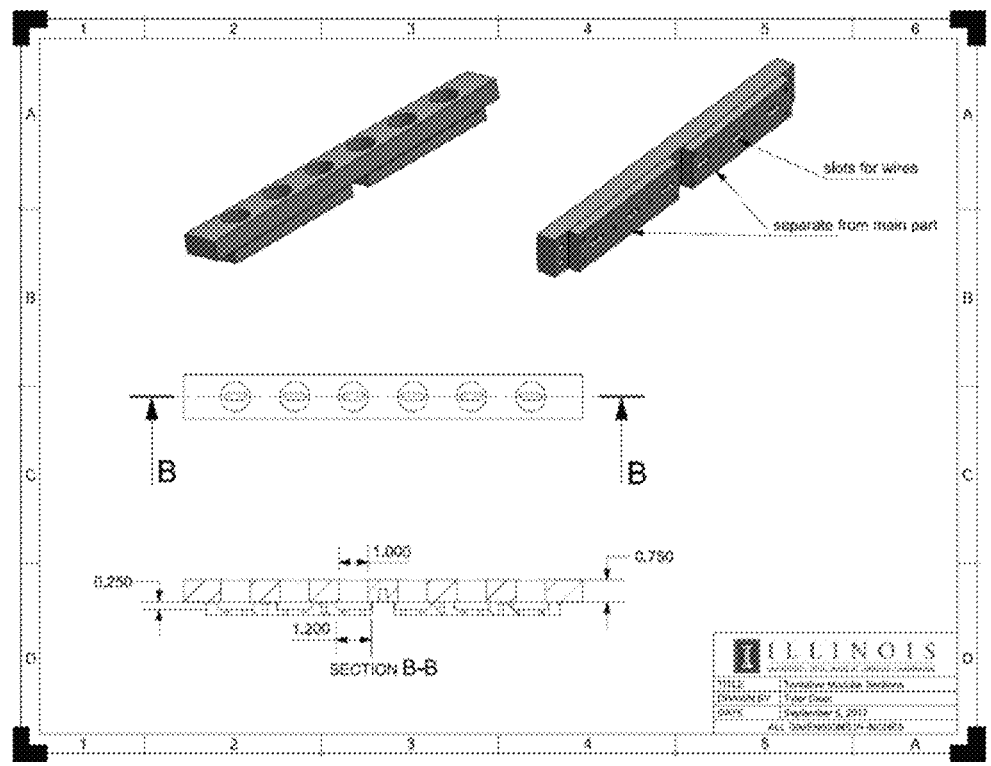
FIG. 34A
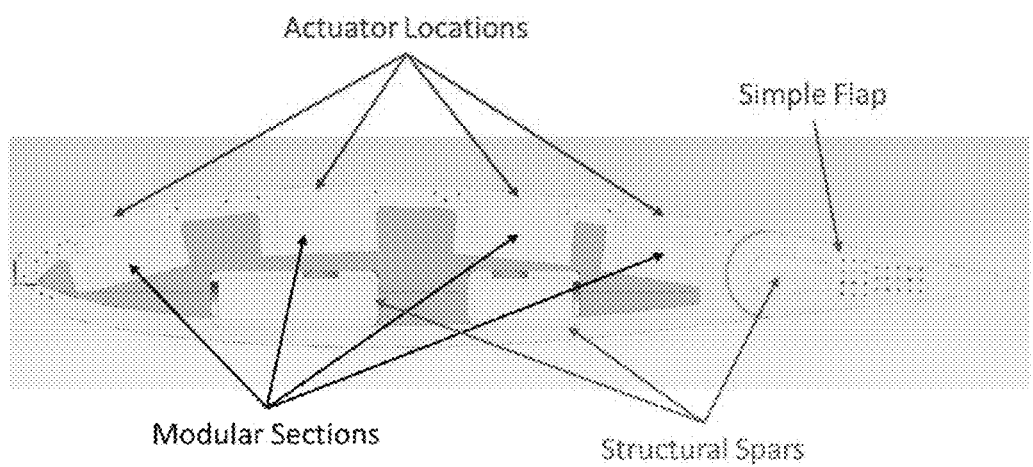
FIG. 35 Cross Section Layout

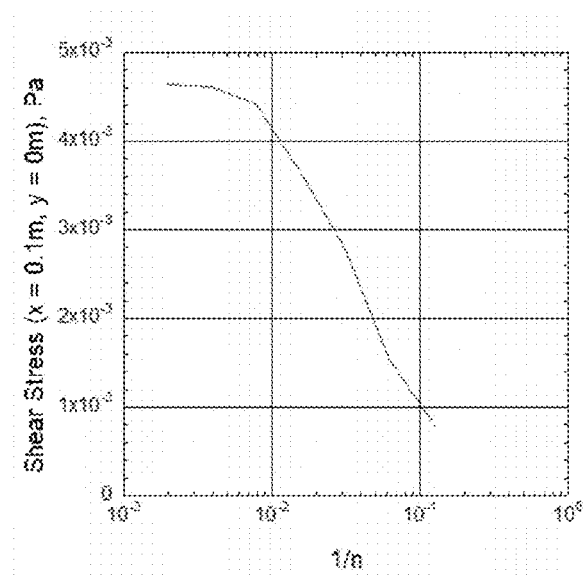
FIG. 36. BLAZE-7 CALCULATED WALL SHEAR STRESS AT 0.1 M DOWNSTREAM OF THE SIMULATION INLET AS A FUNCTION OF THE INVERSE OF THE NUMBER OF NODES USED TO DISCRETIZE THE WALL NORMAL DIMENSION.
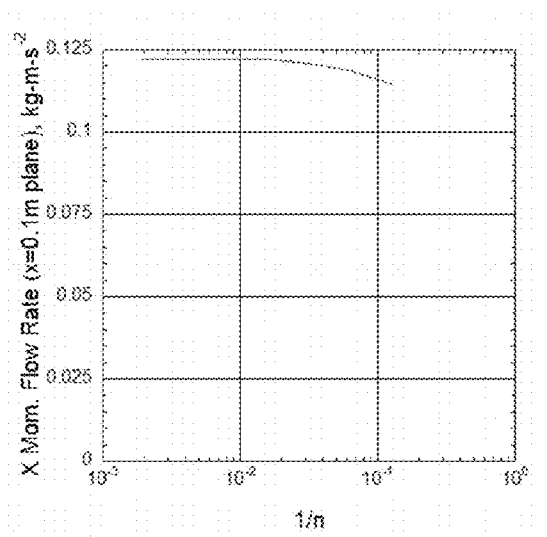
FIG. 37. BLAZE-7 CALCULATED STREAM-WISE MOMENTUM FLUX AT 0.1 M DOWNSTREAM OF THE SIMULATION INLET AS A FUNCTION OF THE INVERSE OF THE NUMBER OF NODES USED TO DISCRETIZE THE WALL NORMAL DIMENSION.

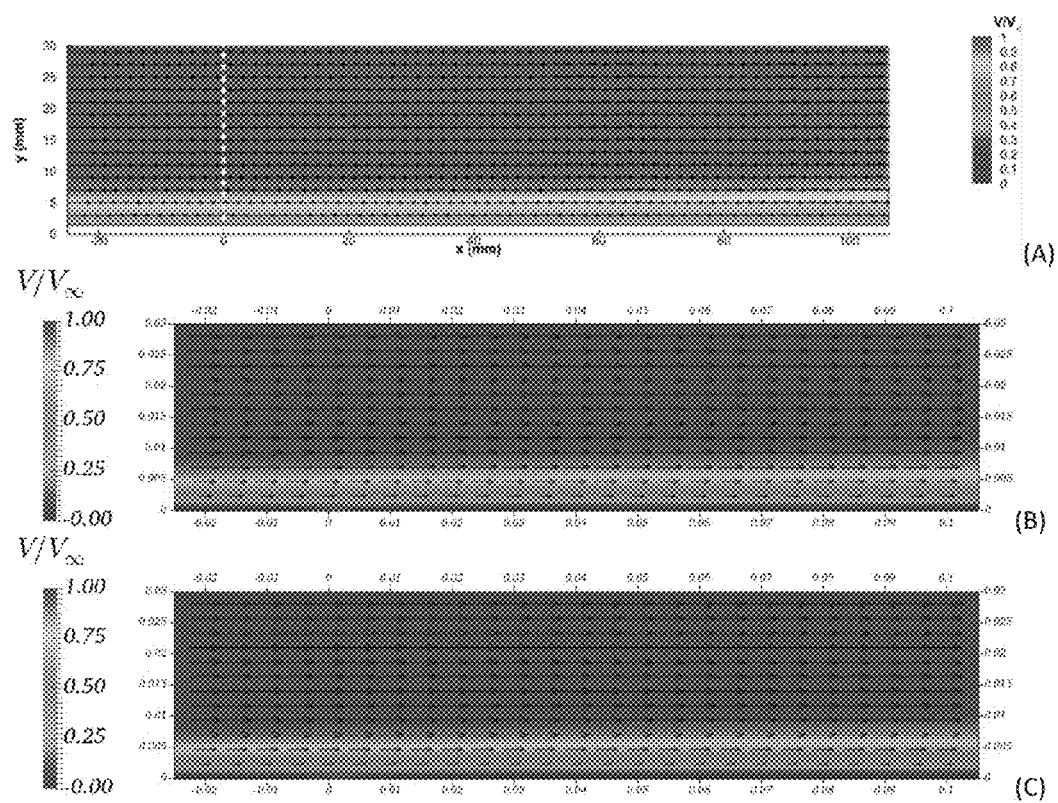
FIG. 38A, 38B, 38C A) INACTIVE ACTUATOR EXPERIMENTAL NORMALIZED VELOCITY FIELD RESULTS B) BLAZE-7 CALCULATED NORMALIZED VELOCITY FIELD RESULTS USING THE SPALART-ALLMARAS TURBULENCE MODEL, AND C) BLAZE-7 CALCULATED NORMALIZED VELOCITY FIELD RESULTS USING THE CHIEN K-ε TURBULENCE MODEL

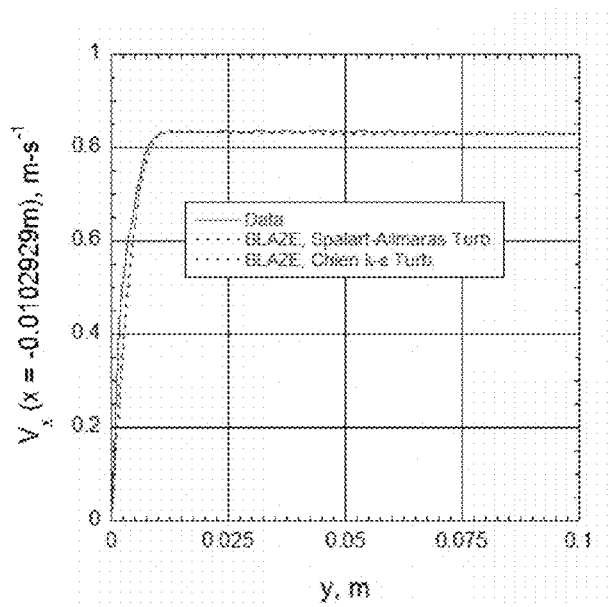
FIG. 39. COMPARISON OF EXPERIMENTAL AND BLAZE-7 CALCULATED BOUNDARY LAYER PROFILES ASSUMING AN INACTIVE FLOW ACTUATOR AT X = -0.010292 M (THE ACTUATOR IS LOCATED AT X = 0 M)
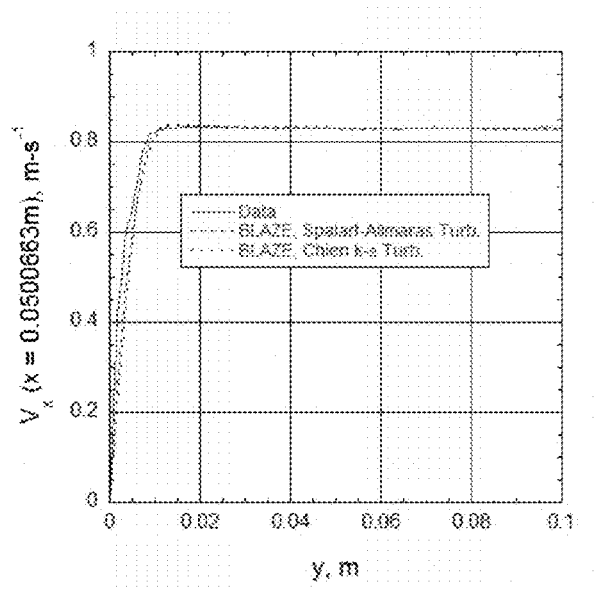
FIG. 40. COMPARISON OF EXPERIMENTAL AND BLAZE-7 CALCULATED BOUNDARY LAYER PROFILES ASSUMING AN INACTIVE FLOW ACTUATOR AT X = 0.0500663 M (THE ACTUATOR IS LOCATED AT X = 0 M).

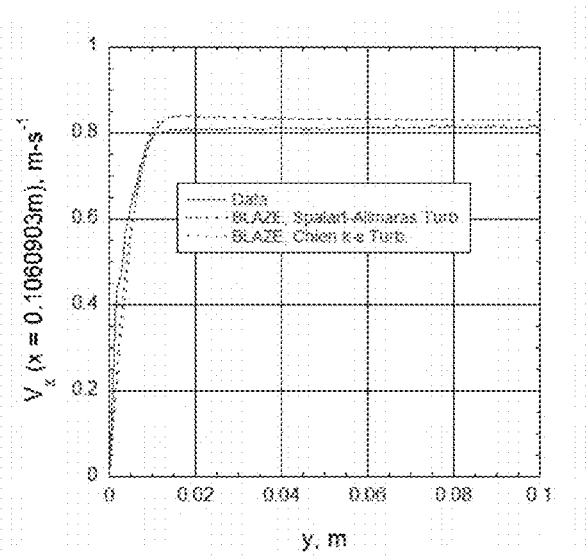
FIG. 41. COMPARISON OF EXPERIMENTAL AND BLAZE-7 CALCULATED BOUNDARY LAYER PROFILES ASSUMING AN INACTIVE FLOW ACTUATOR AT X = 0.1060903 M (THE ACTUATOR IS LOCATED AT X = 0 M).
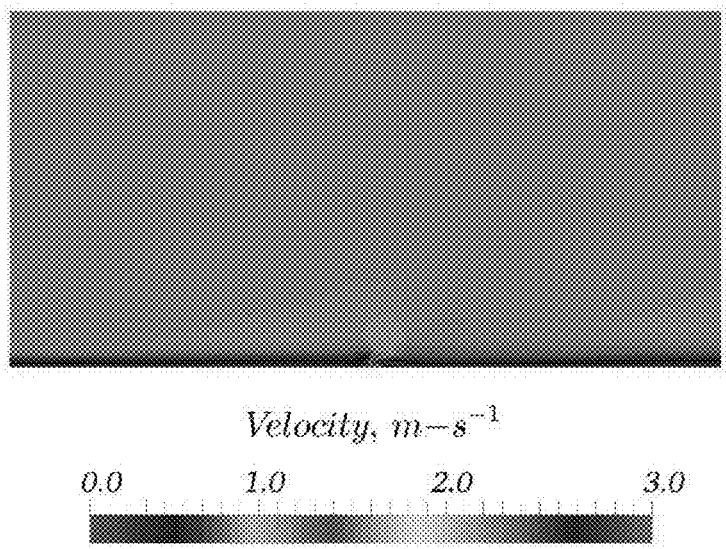
FIG. 42. BLAZE-7 CALCULATED VELOCITY FIELD RESULTS USING THE SPALART-ALLMARAS TURBULENCE MODEL AND A WALL NORMAL MOMENTUM SOURCE.

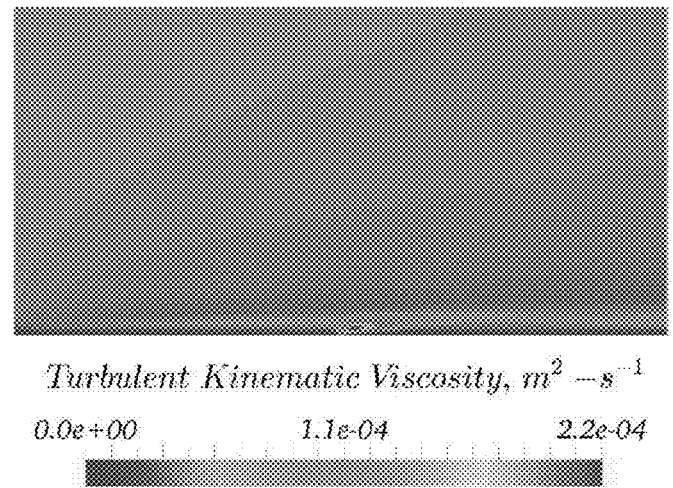
FIG. 43. BLAZE-7 CALCULATED TURBULENT KINEMATIC VISCOSITY RESULTS USING THE SPALART-ALLMARAS TURBULENCE MODEL AND A WALL NORMAL MOMENTUM SOURCE.
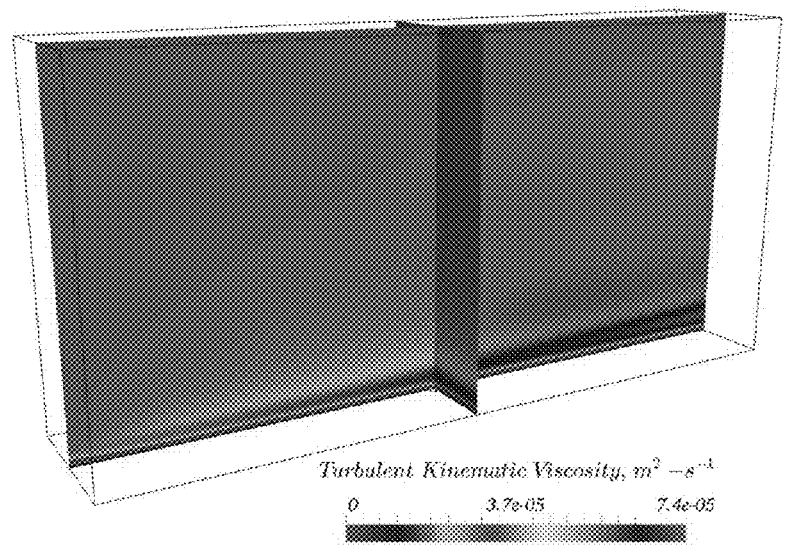
FIG. 44. BLAZE-7 CALCULATED TURBULENT KINEMATIC VISCOSITY RESULTS USING THE SPALART-ALLMARAS TURBULENCE MODEL AND NO ACTIVE SOURCE IN A THREE-DIMENSIONAL DOMAIN.

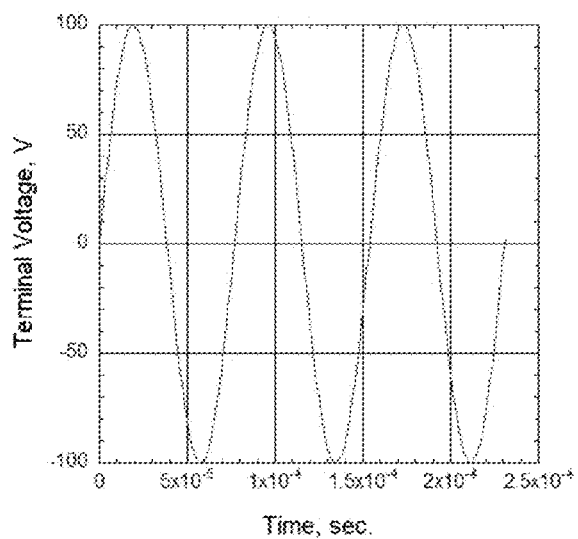
FIG. 45. BLAZE-7 1D PULSED AIR DISCHARGE SIMULATION HIGH VOLTAGE TERMINAL VOLTAGE AS A FUNCTION OF SIMULATION TIME
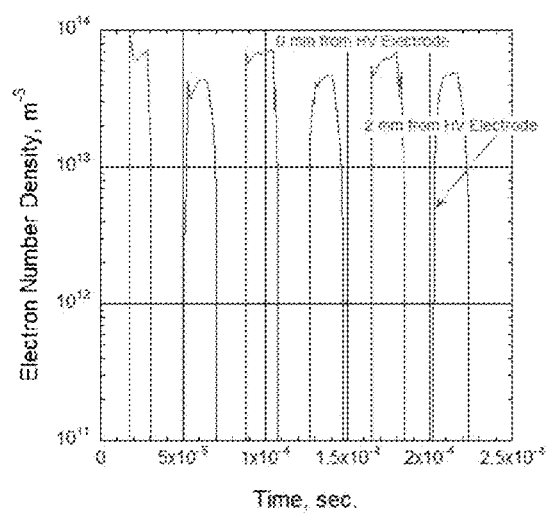
FIG. 46. BLAZE-7 CALCULATED ELECTRON NUMBER DENSITY AS A FUNCTION OF TIME AND LOCATION RELATIVE TO THE HIGH VOLTAGE ELECTRODE IN A 1D SIMULATION OF A 2 MM AIR DISCHARGE OPERATING AT 13 KHZ WITH A PEAK TERMINAL VOLTAGE OF 100 VOLTS.

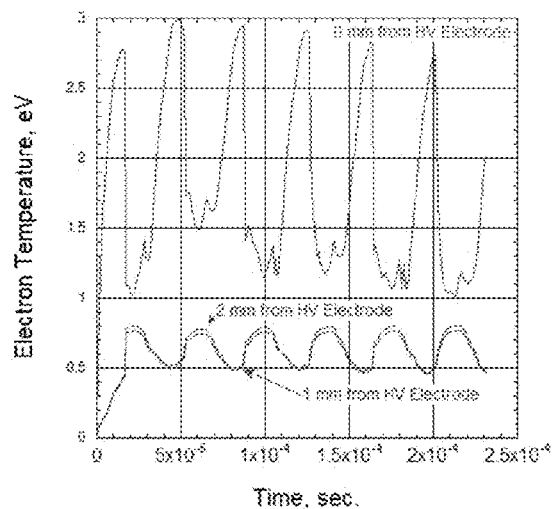

FIG. 47. BLAZE-7 CALCULATED ELECTRON TEMPERATURE AS A FUNCTION OF TIME AND LOCATION RELATIVE TO THE HIGH VOLTAGE ELECTRODE IN A 1D SIMULATION OF A 2 MM AIR DISCHARGE OPERATING AT 13 KHZ WITH A PEAK TERMINAL VOLTAGE OF 100 VOLTS

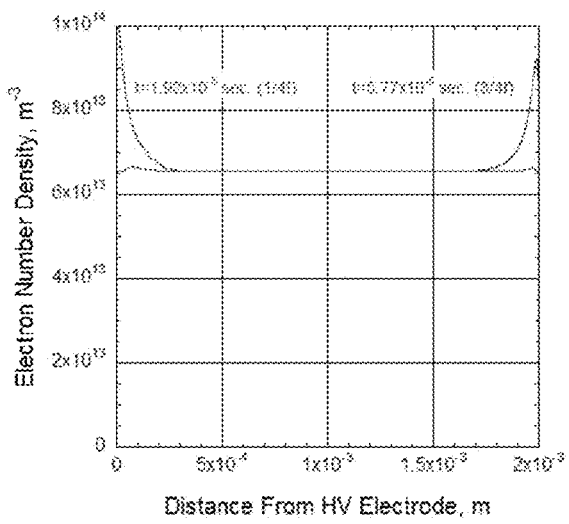

FIG. 48. BLAZE-7 CALCULATED ELECTRON NUMBER DENSITY AS A FUNCTION OF DISTANCE FROM THE HIGH VOLTAGE ELECTRODE IN A 1D SIMULATION OF A 2 MM AIR DISCHARGE OPERATING AT 13 KHZ WITH A PEAK TERMINAL VOLTAGE OF 100 VOLTS.

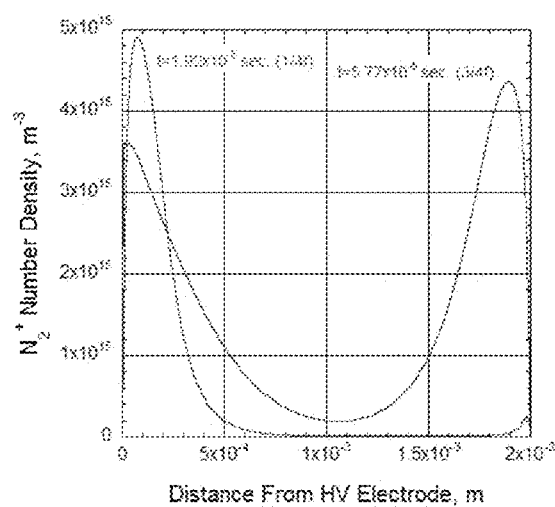
FIG. 49. BLAZE-7 CALCULATED N2+ NUMBER DENSITY AS A FUNCTION OF DISTANCE FROM THE HIGH VOLTAGE ELECTRODE IN A 1D SIMULATION OF A 2 MM AIR DISCHARGE OPERATING AT 13 KHZ WITH A PEAK TERMINAL VOLTAGE OF 100 VOLTS.

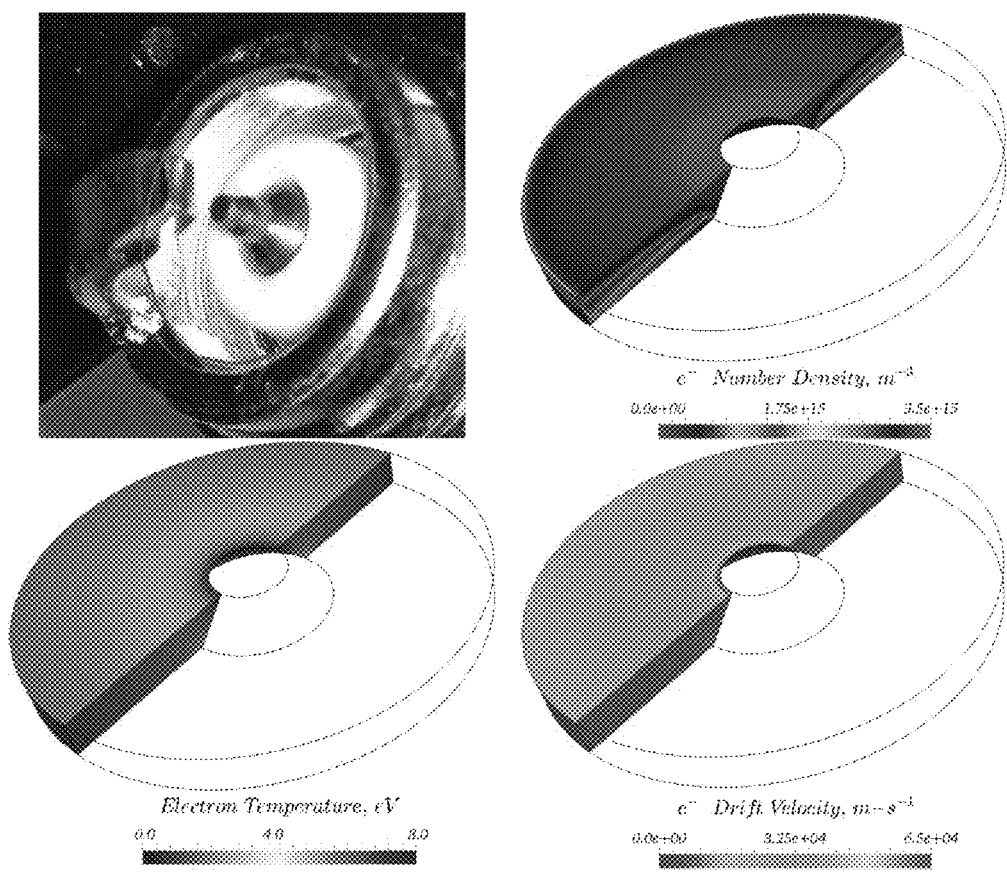
FIG. 50. MODELED REGION OF SPARK PLUG DISCHARGE GAP (UPPER-LEFT) AND BLAZE-7 CALCULATED ELECTRON NUMBER DENSITY (UPPER-RIGHT), ELECTRON TEMPERATURE (LOWER-LEFT), AND ELECTRON DRIFT VELOCITY (LOWER-RIGHT) FOR THE 1 KV PEAK TO PEAK TERMINAL VOLTAGE CASE AT T = $5.775 \times 10^{-5}$ SEC. = (3/4F).

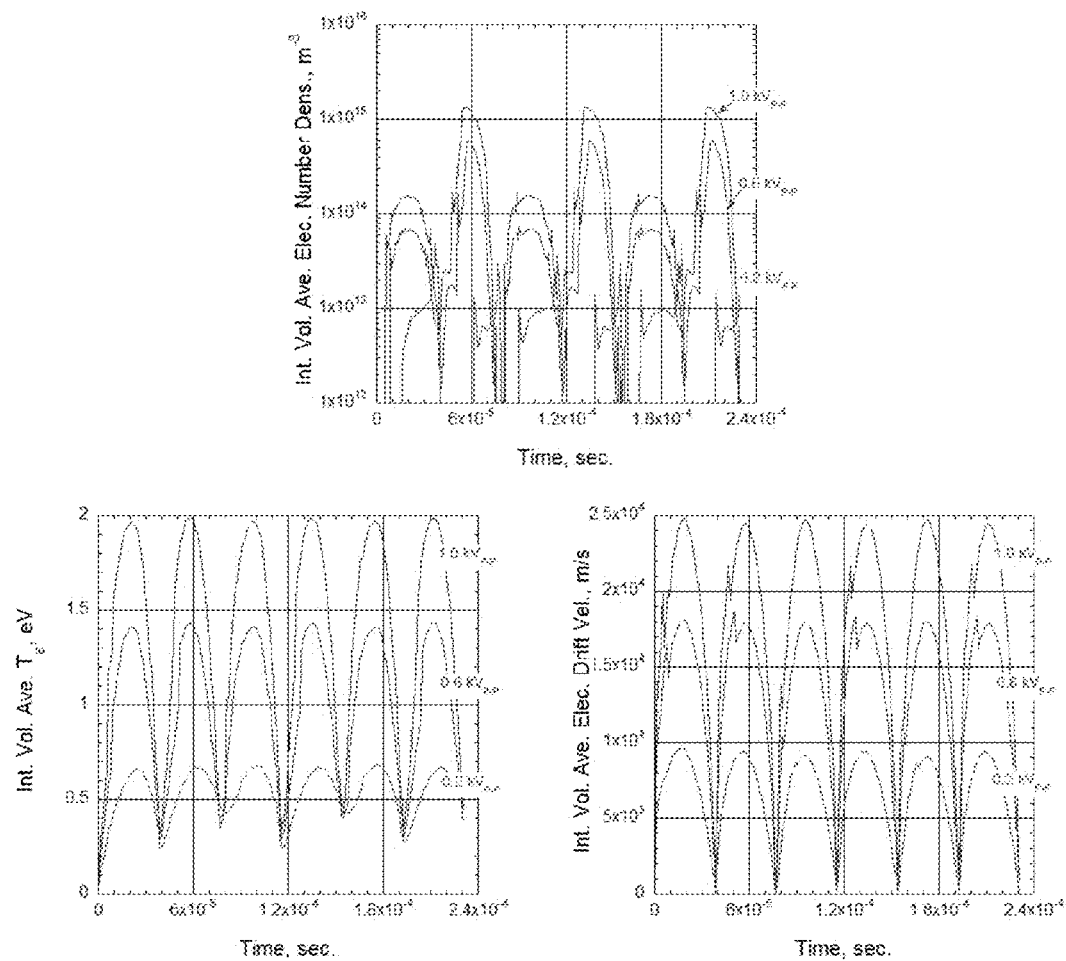
FIG. 51 BLAZE-7 CALCULATED ELECTRON NUMBER DENSITY (UPPER-RIGHT), ELECTRON TEMPERATURE (LOWER-LEFT), AND ELECTRON DRIFT VELOCITY (LOWER-RIGHT) FOR THE 0.2, 0.6, AMD 1 KV PEAK TO PEAK TERMINAL VOLTAGE CASE AS A FUNCTION OF TIME.

Modification of Cyclotronic Plasma Actuator technique for Plasma Assisted Combustion (PAC):

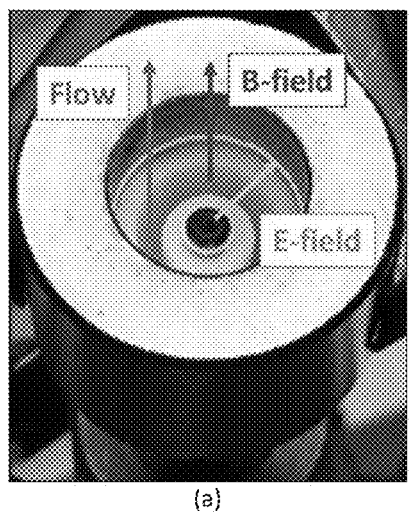 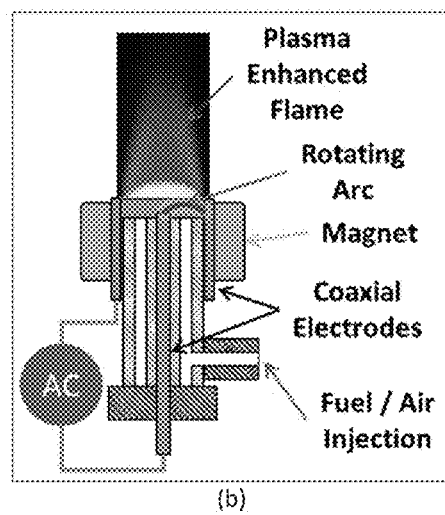

(a)  (b)

FIGS. 52A, 52B. Plasma-assisted Combustion Concept with Arc-Plasma Rotation in Field of Permanent Magnet
(a) orientation of magnetic field, electric field, and flow direction on image of arc-magnet actuator (67 ms exposure), (b) sketch of arc-magnet actuation applied to combustion flame.

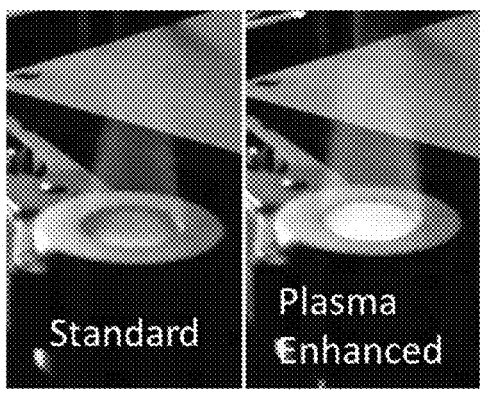 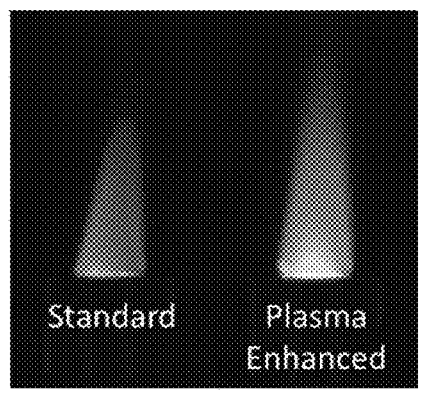

(a) at angle viewing discharge region  (b) side view of flames

FIGS 53A, 53B Side-by-Side Comparisons of Standard and Plasma-Enhanced Flame using Cyclotronic Plasma Actuator

CYCLOTRONIC PLASMA ACTUATOR WITH ARC-MAGNET FOR ACTIVE FLOW CONTROL

CROSS REFERENCE TO RELATED APPLICATIONS

The present application is a nonprovisional application claiming the benefit of U.S. Provisional Application 62/472,642 filed Mar. 17, 2017 and is hereby incorporated herein by reference.

STATEMENT OF GOVERNMENT SUPPORT

The invention was made with government support under NASA Langley Research Center on Contract Order #: NNX16CL76P.

BACKGROUND OF THE INVENTION

Various active flow control methodologies have emerged as a method for enabling advancement in efficiency and operational capabilities for fixed-wing aircraft. However, practical use of modern flow control techniques has been hindered by high power requirements, integration challenges, and insufficient control authority of existing methods. CU Aerospace (CUA) and the University of Illinois at Urbana-Champaign (UIUC) have teamed to develop an innovative cyclotronic arc-plasma flow control actuator, which can be utilized to alleviate turbulent boundary-layer separation. By embedding a pair of coaxial actuator electrodes within a magnetic field, a sweeping plasma arc is produced which acts to enhance mixing of the flow, similar to a traditional, passive vortex generator. The result is a novel flow control technique that combines the efficiency of vortex-based mixing for inhibiting boundary-layer separation with on-demand capabilities.

SUMMARY OF THE INVENTION

The University of Illinois at Urbana-Champaign (UIUC) and CU Aerospace (CUA) have developed an innovative plasma-based flow control actuator which produces a high-voltage plasma arc across a coaxial pair of electrodes positioned within the field of a strong rare-earth ring magnet. Formation of the plasma arc within a magnetic field perpendicular to its current path results in a Lorentz force on the charged particles, causing the arc to sweep about the center of the coax, forming a plasma disc. Being similar in concept to microwave-generating cyclotron elements, the resulting actuator concept has been designated as a "Cyclotronic Plasma Actuator". The innovative aspect of this concept is the coupling of the thermal actuation of the plasma arc along with the induced swirl component produced by the angular velocity of the Lorentz forcing. This actuator is envisioned to be used in boundary layer flows when the coaxial arrangement is embedded in an aerodynamic surface. The purpose of the device is to alleviate turbulent flow separation, serving as a controllable vortex generator that can be enabled or disabled on-demand (e.g. during takeoff and landing), and also does not produce parasitic drag during high speed cruise. Demonstration of this technology pioneers a class of plasma actuators aimed at addressing a notorious problem in active flow control.

The Applicant has (i) conducted a variety of bench tests to study the actuator apparatus with various interchangeable components, (ii) performed high-speed imaging experiments to analyze the rotation of the plasma arc in the magnetic field for a variety of configurations, (iii) performed wind tunnel testing with particle image velocimetry measurements and pressure recovery measurements on a ramp to demonstrate the impact of the actuator apparatus on the boundary layer flow, and (iv) produced multiphysics simulations based directly on experimental geometries and conditions in order to capture the dynamics of the flow-field around the actuator as well as the physics of the plasma arc in the magnetic field. The results reported here support robust baseline design approaches to be implemented and tested in detail.

Numerous other advantages and features of the invention will become readily apparent from the following detailed description of the invention and the embodiments thereof, from the claims, and from the accompanying drawings.

BRIEF DESCRIPTION OF THE FIGURES

The patent or application file contains at least one drawing executed in color. Copies of this patent or patent application publication with color drawing(s) will be provided by the Office upon request and payment of the necessary fee. A fuller understanding of the foregoing may be had by reference to the accompanying drawings, wherein:

FIGS. 1A and 1B is a cyclotronic plasma actuator illustrated in isometric view and in a side view;

FIG. 2 is a representative schematic of an actuator operation illustrated in side view;

FIG. 3 is a representative schematic of an actuator operation illustrated in top view;

FIGS. 4A and 4B are photos of the operation of actuator: (A) PLASMA OFF, (B) PLASMA ON;

FIG. 5. is an illustration of low-complexity, on-demand cyclotronic plasma actuator on an airfoil, showing the embedded active plasma actuator avoiding the drag penalty during cruise introduced by classic passive fixed vortex generators;

FIG. 6A-6D are electrical characteristics of a cyclotronic plasma actuator driven with GBS Minipuls 2.2;

FIGS. 7A and 7B are V-I characteristics of a cyclotronic plasma actuator driven with a 60 HZ AC transformer;

FIG. 8 is an impedance measurements for modified sparkplugs used as coaxial elements in cyclotronic plasma actuators;

FIGS. 9A and 9B are centerline magnetic field measurements made above the surface of ring magnets taken at a centerline with comparison to heuristic data based model and taken with $(R_{OUTER} - R_{INNER})/2$;

FIG. 9C is a chart outlining the DC magnetic field measurements as a function of radius;

FIG. 9D is a chart of the DC magnetic field measurements as a function of vertical position without and with dielectric spacers;

FIG. 10A is measurements of light emission pulses with an UDT-UV 100 silicon detector as transformer voltage varies;

FIG. 10B is a chart of the near infrared emissions from the sweeping AC arc plasma formed in the cyclotronic plasma actuator FIG. 11A is a chart of the Flyback circuit data for ZVS module #1;

FIG. 11B is a chart of the Flyback circuit data for ZVS module #1 sample of voltage and current waveforms;

FIGS. 12A and 12B are reconfigurable coax designs of the cyclotronic plasma actuator;

FIGS. 12E and 12F are top and side view illustrations of a Type 1 cyclotronic plasma actuator in accordance with one embodiment of the invention;

FIGS. 13A, 13B, & 13C are photos of a Type 2 cyclotronic plasma actuator in accordance with one embodiment of the invention;

FIGS. 14A and 14B are top and side view illustrations of a Type 2 cyclotronic plasma actuator in accordance with one embodiment of the invention;

FIGS. 14C and 14D are top and side view representative schematics of a Type 2 cyclotronic plasma actuator in operation and accordance with one embodiment of the invention;

FIGS. 14E, 14F, 14G are photos of the assembly process for a Type 2 cyclotronic plasma actuator;

FIGS. 14H, 14I are Schlieren images of an activated Type 2 actuator;

FIG. 15A is a Type 3 cyclotronic plasma actuator concept design with an embedded magnet in accordance with one embodiment of the invention;

FIGS. 15B and 15C are top and side view illustrations of a Type 3 cyclotronic plasma actuator in accordance with one embodiment of the invention;

FIG. 16D is an illustration of the process for chemically etching Copper-CLAD Alumina in Ferric Chloride;

FIG. 17A is a chart of ARC rotation rates measured by UV sensor and inductive pickup tachometers, where the actuator under test is C2A with power supplied by a ZVS module driven at varied DC Voltages;

FIG. 17B is a chart of Arc rotation rates for various coax Type 2 bench test configurations;

FIG. 18A is an illustration of a configuration of high-speed imaging experiments for monitoring of ARC rotation in cyclotronic plasma actuator;

FIG. 18B is a chart of ARC rotation rates for various coaxial actuator bench test configurations;

FIG. 19 is a schematic of PIV data acquisition configuration in a subsonic wind tunnel;

FIGS. 20A, 20B, and 20C are charts illustrating velocity scalar field for flat-plate boundary layers with various actuations;

FIGS. 21A, 21B, and 21C are charts illustrating boundary-layer profiles extracted from the PIV data;

FIG. 22A is an illustration of boundary-layer profiles downstream of a passive vortex generator on an airfoil at 6.5 degrees;

FIG. 22B is an illustration of boundary-layer profiles downstream of passive vortex generators on an airfoil at 17.95 degrees;

FIGS. 23A, 23B, 23C illustrate Z-=vorticity fields for flat-plate boundary layers with various actuation;

FIGS. 24A, 24B, 24C illustrate standard deviation of velocity scalar fields for flat-plate boundary layers with various actuation;

FIG. 25 is a co-plot of Z-vorticity and velocity standard deviation contours;

FIGS. 26A, 26B, 26C, 26D are comparisons of actuation effects of spark plugs operating in burst mode;

FIGS. 27A, 27B illustrate velocity scalar of unactuated and continuous actuation of the cyclotronic plasma actuator;

FIG. 28 is a schematic of hump and diffusing ramp geometry for low-speed wind tunnel experiments;

FIG. 29 is a VG strip used for separation control experiments on linear ramp;

FIGS. 30A, 30B illustrate pressure distributions on wall-mounted hump and 24 degree linear ramp for uncontrolled and controlled experiments;

FIG. 31 illustrates scaling of ARC rotation rate with B-field for a 5.5 MM coaxial Type 2 actuator;

FIG. 32 illustrate components layout for a bench test system;

FIG. 34A is a strut beam used within an airfoil for mounting one or more actuators;

FIG. 35 is a cross section of an airfoil;

FIG. 36 illustrates a BLAZE-7 calculated wall shear stress;

FIG. 37 illustrates a BLAZE-7 calculated stream-wise momentum flux;

FIGS. 38A, 38B, 38C illustrate inactive actuators with normalized velocity field results, a BLAZE-7 calculated normalized velocity field used various turbulence models;

FIG. 39 illustrates a comparison of experimental and Blaze-7 calculated boundary layer profiles assuming inactive flow actuator X=−0.010292 M;

FIG. 40 illustrates a comparison of experimental and Blaze-7 calculated boundary layer profiles assuming inactive flow actuator X=0.0500663 M;

FIG. 41 illustrates a comparison of experimental and Blaze-7 calculated boundary layer profiles assuming an inactive flow actuator X=0.1060903 M;

FIG. 42 illustrates a Blaze-7 calculated velocity field results using a turbulence model;

FIG. 43 illustrates a Blaze-7 calculated turbulent kinematic viscosity;

FIG. 44 illustrate another Blaze-7 calculated turbulent kinematic viscosity;

FIG. 45 illustrates a Blaze-7 1D pulsed air discharge simulation;

FIG. 46 illustrates a Blaze-7 calculated electron number density as a function of time and location relative to the high voltage electrode;

FIG. 47 illustrates a Blaze-7 calculated electron temperature as a function of time and location relative to the high voltage electrode;

FIG. 48 illustrates a Blaze-7 calculated electron number density as function of distance from the high voltage electrode;

FIG. 49 illustrates a Blaze-7 calculated N2+ number density as a function of distance from the high voltage electrode;

FIG. 50 is a modeled region of spark plug discharge gap and Blaze-7 calculated electron number density;

FIG. 51 illustrates a Blaze-7 calculated electron number density showing electron temperature and electron drift velocity;

FIGS. 52A, 52B illustrate plasma-assisted combustion with an arc-plasma rotation in a field of a permanent magnet; and FIGS. 53A, 53B illustrate side-by-side comparisons of standard and plasma-enhanced flames using a cyclotronic plasma actuator.

DETAILED DESCRIPTION OF THE INVENTION

Figure 12C:
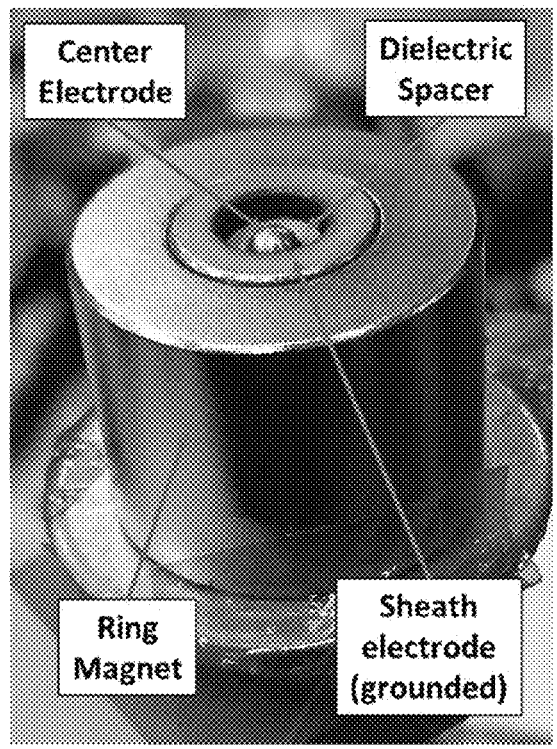
FIG. 12C is a photo of one a Type 1 cyclotronic plasma actuator in accordance with one embodiment of the invention illustrating the various components.
Figure 12D:
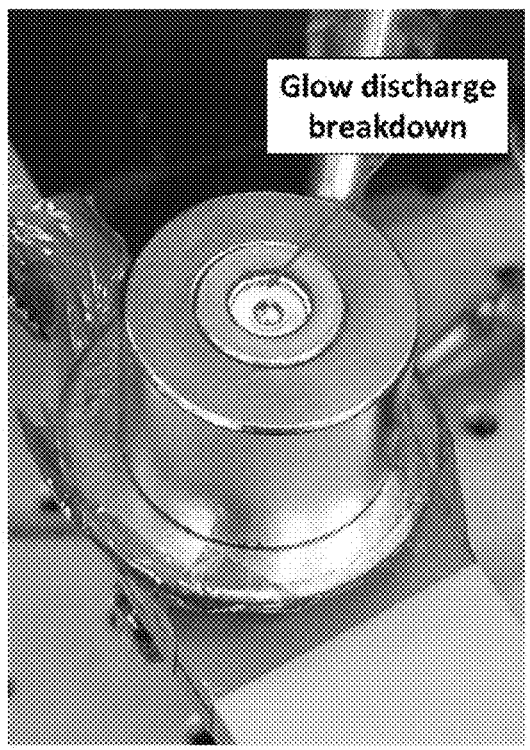
FIG. 12D is a photo from a perspective view of the Type 1 cyclotronic plasma actuator.

In order to provide an understanding of how the new actuation approach can be utilized in comparison to other actuation techniques, parametric studies were conducted to evaluate electrical characteristics and power requirements, measure magnetic field strengths, monitor device heating, and diagnose plasma arc behaviors with various control circuits. High-speed imaging enabled visualization of the sweeping AC arc, including the influence of electro-mechanical properties on the rotational velocity of the actuator arc. The impact of the device on the flow-field was evaluated using planar velocimetry techniques. Multiphysics simulation techniques were applied to develop a qualitative understanding of the physics related to the experimental observations, laying the groundwork for advanced modeling and simulation.

Nomenclature
AC=alternating current
B=magnetic field strength
CRT=cathode ray tube
DBD=dielectric barrier discharge
DC=direct current
fps=frames per second
HV=high voltage
I=current
MHD=magnetohydrodynamics
PIV=particle image velocimetry
RF=radio frequency
RPM=revolutions per minute
UAV=unmanned air vehicle
UV=ultraviolet
V=flow velocity or voltage
$V_\infty$=free stream flow velocity
VG=vortex generator
ZVS=zero voltage switching The Cyclotronic Plasma Actuator Concept The baseline actuator system is shown in FIGS. 1A and 1B, where FIG. 1A shows an isometric view of the actuator, and FIG. 1B shows a side view of a Type 1 Actuator. A representative schematic of the actuator is also shown in FIGS. 2, 3, 12E and 12F. The actuator 100 consists of a high-voltage, AC plasma driver 110, which is connected to a high-voltage electrode 115 in the center of the actuator. Surrounding the high-voltage electrode at the center of the device is an axisymmetric, grounded electrode 120.

When the supply power is provided to the high-voltage electrode 115, an arc 130 is formed between the pair of electrodes. Surrounding the grounded electrode is a Neodymium permanent magnet 125, which acts to introduce a magnetic field local to the plasma arc. As shown in FIG. 3, the plasma arc 130 discharges in the radial direction, and the local magnetic field lines are oriented vertically, in the direction parallel to the axisymmetric orientation of the electrodes. As a result, a Lorentz force F is created, which induces a local forcing on the arc in the tangential direction. This forcing causes the arc discharge to sweep out in a circular, or dome-shaped pattern, as visible in FIGS. 1A and 1B.

By producing a plasma arc in the fashion described above, the cyclotronic plasma actuator is able to produce a localized arc-induced jet, similar to existing SparkJet plasma-based flow control techniques, but with an additional swirl component. Most modern plasma-based flow control techniques, such as dielectric barrier discharge (DBD) actuation, have been shown to provide an effective means to control aerodynamic flows with minimal mechanical complexity. However, traditional AC-DBD flow control devices have been limited to very low-speed applications, due to the limited actuator authority provided by the actuation device. For the proposed cyclotronic plasma actuator, an additional swirl component is induced by the device to produce three-dimensional, streamwise-oriented vortical structures which are useful for preventing boundary-layer separation in the presence of high adverse pressure gradients. A demonstrative example of this swirl component is shown in the preliminary visualization in FIGS. 4A and 4B. In this demonstration, an incense stick is used to create a laminar smoke plume. The resulting smoke pattern produced by the incense stick with the actuator off is shown in FIG. 4A, and with the actuator on in FIG. 4B.

From FIGS. 4A and 4B, a rotational component can be observed in the smoke plume when the actuator is engaged. These vortical structures can be used to enhance the mixing of the flow between the low-momentum boundary layer and the external, high-momentum inviscid region about an aerodynamic body, making the boundary layer less susceptible to separation under high adverse pressure gradients. Furthermore, the use of plasma-based thermal manipulation for boundary-layer control, such as that used in nanosecond DBD (ns-DBD) has been shown to provide actuation amplitudes significantly greater than the ionic wind actuation provided by traditional DBD actuators. It is believed that the rotating plasma arc produced by the cyclotronic flow control actuator utilizes a similar thermal actuation mechanism as ns-DBD or SparkJet actuators, allowing it to be utilized for both low-speed and high-speed flows. Additionally, the use of pulsed-DC plasma actuation can be explored, which has recently shown to provide a plasma-induced thrust force that is approximately six times larger than that of typical AC-DBD actuation, for a fixed voltage.

The fluidic mixing technique used by the cyclotronic plasma actuator is also similar to the control approach used with fixed vortex generators, which are known to be a highly effective in preventing boundary-layer separation for fixed-wing aircraft. However, unlike vortex generators, the cyclotronic plasma flow control actuator can be enabled on-demand, allowing the actuators to introduce vortices during critical phases of flight, like take-off, climb, approach, and landing, as shown in FIG. 5, while being disabled during cruise. FIG. 5. is an illustration of low-complexity, on-demand cyclotronic plasma actuator 100 on an airfoil 150, showing the embedded active plasma actuator avoiding the drag penalty during cruise introduced by classic passive fixed vortex generators.

This flexibility of the proposed innovation allows the drag penalty associated with fixed, passive vortex generator devices to be avoided. As a result, the proposed actuator provides an innovative solution to improving vehicle performance by providing a robust, efficient system for controlling turbulent boundary-layer separation in a compact package.

Testbed Design and Benchtop Experiments

The first task was to design a configuration of the cyclotronic plasma actuator to be tested. The test utilized a high-voltage plasma driver and a combination of commercially-available hardware. The primary plasma driver incorporated was a GBS Minipuls 2.2, capable of providing up to 20 $kV_{p-p}$ across a range of AC frequencies. Using this supply, actuation was performed in either continuous or burst frequency mode. A simple 60 Hz transformer circuit was also applied in the study.

Benchtop experiments were performed on several configurations of electrode and permanent magnet configurations in order to understand the sensitivity of the power scaling and circuit AC driving frequency on the actuator components. Various circuit analysis equipment was applied to analyze components and actuator circuits, and a Gaussmeter was acquired in order to characterize the magnetic field strengths of the various magnets applied in the experimental apparatus. Bench testing primarily examined coaxial designs similar to the one pictured in FIGS. 1A and 1B and described in FIG. 2. These tests combined modified spark plugs as the coaxial element and commercially available ring magnets. Some preliminary proof-of-concept prototypes were also bench tested: (i) a reconfigurable coaxial design where the vertical positions of the electrodes and dielectric spacer could be adjusted along the ring magnet center axis, and (ii) an embedded magnet design in which a coaxial electrode patterns was etched on a copper-clad circuit board, and a ring magnet was positioned below the circuit board such that the magnetic field lines from its top surface were perpendicular to the electrode gap and normal to the circuit board surface.

High-Speed Visualizations of Sweeping Plasma Arc

Experiments were performed on the actuator in order to understand the arc sweep characteristics of the plasma discharge. A Photron AX200 high-speed CMOS camera was used for imaging. Image capture at higher frame rates with reduced resolution was also possible. This visualization technique provided a validation of the use of a Lorentz force to create a spinning plasma arc, and was also used to determine the angular velocity of the arc produced by the actuator. These measurements were applied for various electrode gaps and magnetic field strengths, which identified these as critical design aspects in the innovative plasma actuator design.

Evaluation of Actuator Flow Physics with Planar Velocimetry

In order to understand the influence of the actuator concept on an aerodynamic flowfield, the actuator was incorporated into a flat plate model inside of a low-speed wind tunnel. A 1-ft×1-ft low-speed subsonic wind tunnel located in a UIUC Aerospace Engineering facility at Talbot Laboratory was used for this investigation.

Planar PIV was used to measure the velocity field local to and downstream of the actuator at various freestream speeds. The PIV measurements were acquired in the streamwise plane across the actuator to capture the local effects on the flow field. Additional PIV measurements were captured across the transverse plane downstream of the actuator in order to characterize the vortex formation induced by the sweeping arc plasma.

Pressure measurements were also acquired with the plasma actuator installed upstream of a linear diffuser model in a low-speed wind tunnel. For this investigation, the Illinois 3-ft×4-ft wind tunnel was used. This tunnel has a maximum test-section velocity of 240 ft/s and a freestream turbulence intensity of less than 0.1% for all operating conditions. The diffuser angle was adjustable to various angles (typically 25 deg.), to induce flow separation at the initial diffuser ramp location. During these experiments, the plasma actuator was used for separation control, where the resulting pressure recovery characteristics across the ramp were compared with the actuator enabled or disabled. PIV measurements were not obtained in these conditions due to time limitations. The goal was to analyze the influence of the actuator in a naturally separated flow-field. Some preliminary comparisons to effects of conventional vortex generators were also performed.

Testbed Design and Benchtop Experiments

The Cyclotronic Plasma Actuator conceptual design is produced through a fairly straightforward hardware configuration. The basic conceptual design, shown in FIG. 2, was implemented by placing a ceramic-insulated coaxial electrode or conductor along the centerline of a ring-magnet which has been magnetized along the cylindrical axis. A high-voltage plasma arc is broken down at the open terminal of the coax between the center electrode 115 and the cylindrical coaxial electrode 120 by providing a high-voltage (AC or pulsed) supply at the input to the coax circuit. Preliminary work used a modified automotive spark plugs as the coaxial element and widely available neodymium ring magnets 125 to provide the required magnetic field. Two approaches have been examined as power supplies for the device: (1) a GBS Minipuls 2.2 high-frequency plasma driver which provides high voltage AC in the 5-20 kHz range with variable duty cycle and burst mode operation (5-400 Hz), and (2) a 60 Hz Jefferson Electric luminous tube transformer (midpoint-grounded secondary) which provides step-up to 12 kV from 115 V line and allows variable arc power by use of an autotransformer (L1010) to adjust the primary coil voltage. Both supplies enable controllable, repeatable initiation of an arc plasma in air gaps similar to the size to the coax gap of the modified spark plugs (i.e. a few millimeters). The GBS Minipuls 2.2 can produce arcs across these gaps at variable frequency within a 5 to 20 kHz range. The 60 Hz transformer arrangement enables production of arcs with gap voltages within the 2-10 kV range, along with an arc current between 10 and 100 mA (depending on the resistance and gap size of the coax used).

V-I Measurements

FIGS. 6A, 6B, 6C and 6D shows the V-I characteristics of the cyclotronic actuator driven with the GBS Minipuls system. The voltage and current are monitored via probepoints mounted on the transformer board. These tests applied both Iridium IX #3502 (2.5 mm gap) and ACDelco #41-902 (4 mm gap) modified spark plugs as coaxial elements mounted in a 3-in. diameter ring magnet. The magnitude of the voltage increases with the gap size. The typical voltage waveform consists of a high voltage pulse (1-2 kV peak) followed by a quasi-steady voltage period with a length depending on the frequency.

V-I characteristics were also measured using the 60 Hz AC transformer to drive the actuator. FIGS. 7A and 7B show voltage and current measurements taken at a variety of autotransformer settings (primary voltage $V_1$) with the NDK Iridium IX spark plug centered in a 1" o.d.×0.5" i.d.×0.75" thick neodymium magnet. The voltage probe was a Tektronix P6015 attached to the top of the secondary coil and grounded to the center of the secondary coil (ground). The secondary current was measured with a Pearson 411 wideband current monitor placed around the lead attached to the outer sheath electrode of the spark plug. Four cases are plotted with different operating voltages: (1) just below breakdown with $V_1$=18 V, (2) just above breakdown threshold with $V_1$=25 V, (3) $V_1$=50 V, and (4) $V_1$=90 V. Prior to breakdown of the arc (case 1), the voltage of the secondary oscillates sinusoidally while the current is zero. After breakdown (case 2), the current in the secondary is sinusoidal at 60 Hz. For this case, oscillations in the voltage were observed, with each half period beginning with a high voltage pulse at initial breakdown which decays to a lower quasi-steady voltage, followed by an increase in voltage as the current magnitude drops at the end of the half cycle. Increasing the primary voltage and current (in cases 3 and 4) results in increased current in the secondary coil and reduced the decay time of the initial high voltage at breakdown. These low frequency V-I results illustrate the dynamic impedance of the plasma during the pulse period. The voltage pulse in the high frequency (13 kHz) result above is similar, but a steady voltage is not reached during the significantly shorter pulse period.

Characterization of Circuit Components

Proper selection of the coaxial element is important, as it determines the breakdown characteristics of the arc as well as the power losses and circuit behaviors when the arc is discharging. Various commercially-available spark plugs have been modified to use as coaxial elements by removing the gap tab. The spark plugs which are being utilized in the preliminary investigation have a built-in resistor between the input terminal and the center electrode tip. Thus, prior to arc break down, the actuator circuit can be considered as a resistor in series with a capacitor. After breakdown, the actuator circuit can be considered as the spark plug internal resistance in series with the plasma impedance (having resistive, capacitive, and inductive components). An Agilent U1733C LCR meter was used to measure the resistive and capacitive components of the spark plugs applied in the experiments by measuring the terminal impedance with the coax in both open and shorted conditions in the 100 Hz to 100 kHz range. FIG. 8 and Table 1 show the results for three spark plugs used in the bench tests: (i) an Evolution Engines #EVOG10350, (ii) a NGK IridiumIX #3521, and (iii) an ACDelco #41-902.

TABLE 1

Electrical Characteristics of Modified Spark Plug Elements used in Actuators

| Model | R [Ω] | C [pF] (10 kHz) |
|---|---|---|
| Evolution EVOG10350 | 24.36 | 4.3 |
| NGK IridiumIX #3521 | 4940. | 14.3 |
| ACDelco #41-902 | 5200. | 22.5 |

Magnetic Field Measurements

To characterize the magnetic field applied in the experiments, an AlphaLab model GM-1-ST DC Gaussmeter was acquired. This meter uses a Hall-effect sensor to measure DC magnetic fields up to 20 kG with resolution of 0.1 G. The field strength of an array of neodymium ring magnets were measured, both above the ring along the center axis and vertical distances above the midpoint between the inner and outer radii. The experimental results for the field strength along the centerline are compared to heuristic models in FIGS. 9A and 9B.

Magnets 1, 3, and 4 were neodymium magnets with 0.5 in. inner diameters and 1 in. outer diameters, with thicknesses of 0.75, 0.25, and 0.1 inches, respectively. Magnet 2 (not shown) was the same size as Magnet 1 and was measured to be nearly identical in strength. The measurements showed each size of ring magnet to have similar strengths to the specified values for N35 material. In addition to specifying inputs for simulations and guiding prototype design, this diagnostic was also useful in demonstrating that heating of the actuator during plasma actuation did not resulted in degradation of the field strength.

Results for the magnetic field strength as a function of radius for a typical ring magnet (grade N38, 1" o.d.×0.5" i.d.×0.75" thick) at two heights above the ring are shown in FIG. 9C. The falloff in field strength can also be characterized, which is important when considering the location of the arc relative to the magnet in embedded magnet designs; results for a grade N42 1" o.d.×0.5" i.d.×1" thick ring are shown in FIG. 9D, showing that the falloff is unaffected by the dielectric materials that may be used to isolate the magnet from the arc gap. The material must be made thick enough to avoid breakdown between the center high voltage electrode and the magnet, but thin enough such that the arc gap is still within a region of high B-field. In current benchtop actuator designs described below, 0.06"-thick (1.5 mm) alumina sheet is being used.

Optical Measurements

In addition to the above measurements of the actuator electrical and magnetic characteristics, optical techniques were also applied to characterize the plasma arc. Two sensors were used to monitor the light emission for the 60 Hz arc: (1) a United Detector Technologies model UV-100 silicon sensor, which is responsive in the 250-1100 nm range with peak response (amps per watt) around 830 nm, and (2) an Ocean Optics model USB 4000 spectrometer, which measures emissions in the 715-985 nm band. The silicon sensor was used to measure the time-dependent pulsing of the arc while the USB 4000 measured atomic line and molecular band emissions from the sweeping arc integrated over longer time periods (2500 ms integration, ~300 plasma pulses).

Measurements with the UDT UV-100 silicon detector show the pulsing of the AC discharge at approximately 120 Hz (T ~8 ms), which corresponds to double the excitation frequency. The measurement of the light emissions in FIG. 10A illustrates that the arc discharges on both the positive and negative cycles when excited in this configuration. The peak intensity of the emission increases proportionally with transformer voltage (i.e., increasing arc current).

From FIG. 10B, atomic oxygen transitions are observed at 777 and 844 nm, along with band emissions from molecules over the entire range of the USB 4000. The intensity of these emissions increases as the AC transformer voltage increases, indicating the formation of higher concentrations of high-energy excited states as the current of the arc increases, while also demonstrating more power dissipation in the arc. The atomic oxygen lines indicate the presence of $O(^5P)$ and $O(^3P)$ excited atoms with energies above the ground state atom of 10.74 and 10.99 eV, respectively (other atomic states are present, but their emissions are in the noise of the molecular emissions). The molecular band spectra are due to emissions from electronically excited $N_2$ species. The band emissions from transition $N_2(B \rightarrow A)$ in the 500-1100 nm NIR range are commonly observed in atmospheric air plasmas, along with $N_2(C \rightarrow B)$ in the 275-425 nm, UV range. The band emissions may potentially be modeled and used to determine the plasma temperature.

Pulse Generation Circuits

Previous work applied a GBS Minpuls 2.2 system and also a neon sign transformer as a means to power the actuators. Recent work has focused on more compact circuits that can readily be configured to power arrays of actuators. The majority of testing focused on applying a dual-MOSFET flyback-type tank circuit to excite the arc-magnet actuator. This circuit operates on the concept of zero-voltage switching (ZVS), where the oscillation is controlled by the resonant frequency of the tank circuit formed between the condenser capacitors and the primary inductor $\{f \sim (LC)^{-1/2}\}$. A DC voltage applied to the circuit results in current flow through the primary coil and onto the MOSFET drains, along with simultaneous voltage on the gates which initiates the turn-on process in each. Due to mismatch in the MOSFETs, one turns on faster than the other, resulting in higher current flow in that branch and reducing current to the gate of the MOSFET in the other branch, turning it off. Assuming the top MOSFET turns on first, the voltage on its drain is near ground, while the voltage on the bottom MOSFET drain rises, peaks, and then falls to zero as the tank circuit completes a half cycle. As the bottom MOSFET drain falls to zero, the gate current to the top MOSFET is removed, turning it off. The top MOSFET drain voltage then begins to rise, turning on the lower MOSFET gate. During this next half cycle, the voltage of the bottom MOSFET drain is clamped at zero, which ensures the top MOSFET stays off while its drain voltage rises, peaks, and cycles back to zero. This cycle repeats itself as the tanks circuit continues to oscillate, alternating triggering of the MOSFET gates. In this design, the MOSFETs switch with zero voltage drop from drain to source, which reduces heating (and power loss) due to switching, providing high efficiency.

V-I and power input curves for the circuit module are plotted in FIG. 11A (the number in the legend denotes test dates in YYMMDD format). The operation of the flyback circuit to produce an arc in a coaxial arrangement with ~1/16" gap (0.125" center electrode, 0.25" i.d. outer electrode, alumina dielectric spacer) results in power consumption in the range of 8 W near breakdown (~5.5 V supply) to 124 W with the driver module supplied 32 V. There is a significant change in the input I-V slope near 10 V, which corresponds to a transition between a weak arc with intermittent rotation to a rapidly rotating arc above ~10 V supply. Terminal measurements of the circuit characteristics were repeatable on various test days. The flyback generator produced pulsing in the 72 to 83 kHz range over the power range tested. Circuits in this configuration can be tuned in frequency by swapping components, tunable elements, or adding jumpers to control time constants. The voltage and current waveforms of the actuator attached to the secondary side of the transformer were monitored using a Tektronix 6015 HV probe and a Pearson model 411 current monitor. FIG. 11B shows a sample of the voltage and current waveforms with 16 V supplied to the driver circuit module, using a CRT type transformer to produce high voltage.

In addition to this flyback type circuit, other options for driver circuit which will offer control of frequency and duty cycle are being considered for future applications of the cyclotronic plasma actuator. One off-the-shelf option under consideration is the GBS Minipuls 0.1, which is a lower power version of the GBS Minipuls 2.2 aimed at UAV applications. Preliminary work was performed on clock-driven circuits where a timer circuit controls a bank of parallel MOSFETs to charge and discharge the primary-side coil from a battery supply. The configuration is similar to a DC-DC step-up boost converter, where the inductive coil is replaced with the primary of a transformer used to generate high voltage across the arc gap. Initial tests with a circuit using dual (parallel) IRFP250N power MOSFETs have allowed powering of the coaxial actuators in the 8 to 30 kHz range (with variation in duty cycle). Preliminary work has used the same CRT transformer applied in the ZVS circuit experiments, shorting the center-tap such that the primary coil has an inductance of 23 µH. In future work, a goal is to optimize this type of circuit and rate its performance compared to the ZVS flyback type driver, as both approaches are potential options for powering actuators from a DC supply on a UAV.

Prototype Development

A few basic designs were built and tested, in addition to the versions applied in visualization studies and wind tunnel tests which applied off-the-shelf spark plugs. Two approaches investigated were (i) a reconfigurable coax, and (ii) an embedded magnet design with electrode etched on copper-clad circuit board materials.

The reconfigurable coax used a 0.125" diameter inner electrode made from 110 copper rod with a rounded end at the tip. The outer electrode is a 0.25" I.D. zinc-plated brass, and the insulator is nonporous alumina ceramic. For the images shown in FIGS. 12A and 12B, the center electrode tip is positioned 0.125" below the outer electrode, recessed in the alumina ceramic tube such that the rounded tip is positioned approximately 1/32" above the alumina. V-I characteristics with 60 Hz bipolar excitation were qualitatively similar to the testbed devices using spark plugs (not shown here for brevity).

Actuator Configurations

Coaxial Arc Magnet Arrangement (Type 1)

The Type 1 coaxial arrangement is similar to the one applied for actuator testbeds in prior work as shown in FIGS. 2 and 3 and FIG. 12A through 12F. In the Type 1 design 100, the coaxial electrodes 115 & 120 are placed within the inner diameter 127 of a ring magnet 125 separated by dielectric material 132, such that the arc 130 is produced within the inner diameter 127 of the magnetic ring. The arc gap 135 in this design is therefore limited to approximately one half the inner diameter, or the difference between the magnet inner radius and the center electrode radius. The magnet itself (if plated with conductive material) can serve as the outer (grounded) electrode sheath; alternatively, a metal spacer or thin copper tube can be used as the sheath.

For bench testing, the device is secured to a PEEK mounting plate, and a high voltage lead is attached to the bottom of the center electrode, while the sheath (and magnet) are grounded through a copper terminal. The arc is formed in the coaxial gap of approximately 1.6 mm (0.0625"). With high voltage on the center electrode, and the magnet orientated such that the B-field is positive at the top of the ring, the arc rotation is counterclockwise (CCW).

Coaxial Embedded Arc-Magnet Arrangement (Type 2)

The Type 2 coaxial arrangement 200 is a significant modification of the devices tested in the Type 1 arrangement. In this design, the center electrode 205 of the coax is placed within the inner diameter 215 of the ring magnet 210, while the outer electrode 220 of the coax is placed around the outer circumference 217 of the ring magnet 210. The electrodes 205, 220 protrude at positions defined above a top portion 219 the ring magnet 210, and which is sheathed from the electrodes by dielectric material 230 (e.g., alumina disks, mica sheeting, or Kapton film). The arc 235 is formed in the air gap above the dielectric surface. The arc gap 240 in this design is therefore limited by the width of the magnetic ring (i.e., the difference between the outer radius 217 of the magnet and outer diameter 207 of the center electrode 205), and the magnetic field strength varies with the size of the ring magnet used, the dielectric thickness, and the magnet material grade. A few coaxial Type 2 actuators are shown in FIGS. 13A, 13B & 13C; and then in FIGS. 14A through 14D.

Parameters for the Coaxial Type 2 benchtop actuators which have been designed and tested in recent work are summarized in Table 2. The B-fields and capacitances listed are measurements made immediately after assembly, and prior to testing. The gap listed is nominal, and can be adjusted by changing the center electrode component in each device. Variation in gap does impact the performance, but all Type 2 variants tested here had a similar coaxial gap. The construction procedures for Revisions A-E are similar, with some variations in dielectric materials, magnet grades, and field strengths.

TABLE 2

Measured Parameters for Coaxial Actuator Type 2 Bench Test Variants

| Revision # | Magnet o.d. × i.d. [inches] | $B_{surf}$ [G] | Gap [mm] | Capacitance [pF] (10 kHz) |
|---|---|---|---|---|
| C2A | 1.0 × 0.5 | 1977 | 5.5 | 10.7 |
| C2B | 1.0 × 0.5 | 3000 | 5.5 | 8.15 |
| C2C | 1.0 × 0.5 | 1491 | 5.5 | 5.70 |
| C2D | 1.0 × 0.5 (2x-stack) | 2201 | 5.5 | 6.92 |
| C2E | 0.375 × 0.125 | 2330 | 5.6 | 3.36 |

Coaxial Arrangement with Patterning Electrodes (Type 3)

Figure 15D:
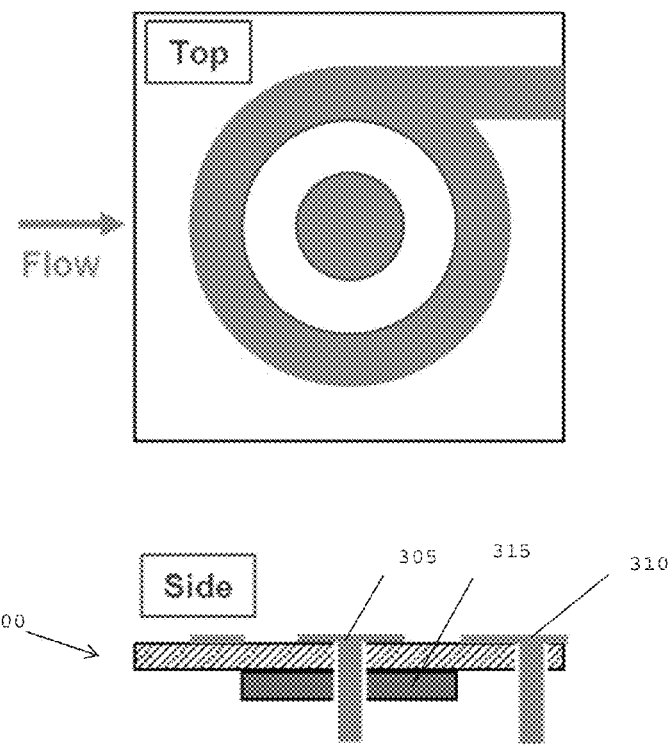
FIGS. 15D and 15E are top and side view representative schematics of a Type 3 cyclotronic plasma actuator in operation and accordance with one embodiment of the invention.
Figure 15E:
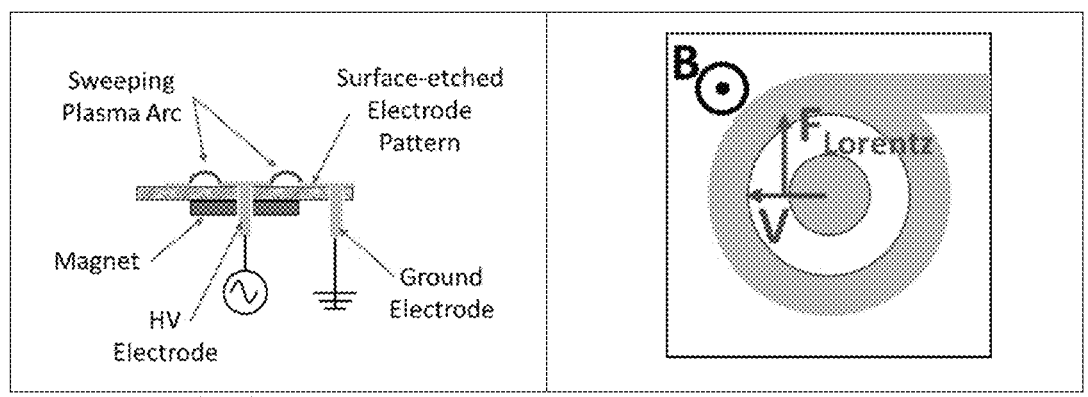
Figure 16A:
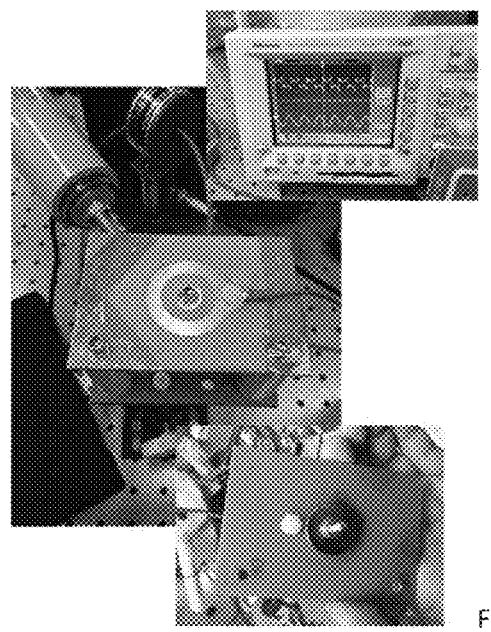
FIGS. 16A, 16B and 16C illustrate testing of a Type 3 cyclotronic plasma actuator with embedded magnet designs.
Figure 16B:
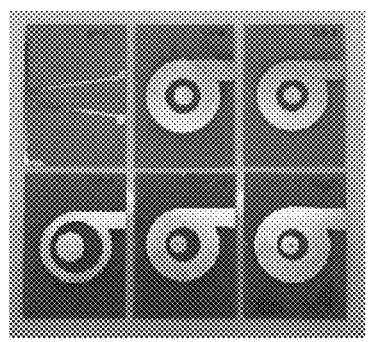
Figure 16C:
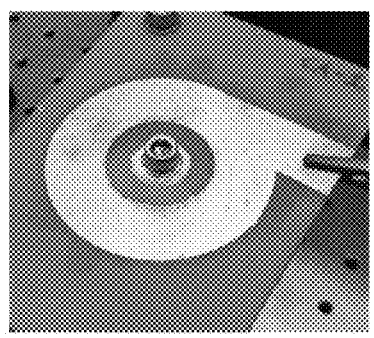

Another approach referred to herein as a Type 3 coaxial actuator 300 involved patterning electrodes on circuit boards FIGS. 15A through 15E. The patterning electrodes 305, 310 were done by both milling and etching electrode patterns in copper-clad FR4 board. The modified concept is illustrated in FIG. 15A. The patterned circuit boards were combined with a 1" O.D.×0.25" thick ring magnet 315, and driven with 60 Hz bipolar excitation. Some of the variants produced and tested are shown in FIGS. 16A, 16B, and 16C. With this format, it was possible to achieve break down of an arc-magnet and rotation of arc in the magnetic field around the electrode gap, FIG. 16c. However, the FR4 material was prone to failure after a few minutes of operation.

Due to issues with breakdown of the FR4 circuit material under exposure to the plasma arc, approaches for using other circuit board materials were investigated. A typical material is copper-clad alumina (trade name Curamik®). A sample of 1.5 mm thick Curamik® with double-sided 0.25 mm thick cladding was obtained and etched using $FeCl_3$ bath using a similar technique to that applied for FR4, as detailed in FIG. 16D. For this thickness of copper, the etching period was 3.5 hours (long compared to the thinly coated FR4 which took 20-30 minutes). After etching, the copper traces were verified to have good conductivity and the center and outer electrodes were well-isolated. Given that the geometries are similar to the FR4 trials, it is expected that an actuator using this material can be achieved.

Experimental Results

Bench testing focused on measuring the rotation rate of the arc in quiescent flow, using zero-voltage-switching (ZVS) circuits as the pulse driver. I-V characteristic were measured, and tachometer measurements as well as high speed imaging were applied to quantify the rotation rate for various actuators. The various actuator variants having a similar gap (5.5 mm) allowed characterization of the arc rotation as a function of magnetic field strength (B-field).

The general trends which were observed are:
Increasing B-field increases the arc rotation rate.
Increasing the driving voltage (and therefore actuator current) increases the rotation rate.
Increasing the gap increases the power consumption due to increased impedance.
Increasing the gap increases the operating current and increases the rotation rate.
The B-field has influence on the actuator terminal characteristics, as the faster rotation rates result in lower operating voltage to sustain an arc.

Tachometer Methods

Results made from the two simplified tachometer methods, UV-100 sensor and inductive pickup methods, are overviewed here (In this section the dates of tests are referred to in format YYMMDD such that "170818" refers to "18 Aug. 2017"). FIG. 17A compares data taken with Coax Type 2 actuator Revision A (C2A) using both the UV emission sensor method and the inductive pickup sensor method. The two methods are in excellent agreement.

Further tests compared the rotation rates of various actuator configurations. FIG. 17B shows a number of data sets for Coax Type 2 actuators. Considering that the gaps for most devices in FIG. 17B are similar, the rotation rate scales with the B-field measured in the arc gap, such that C2B and C2F which uses the strongest magnet achieve the highest rotation rates, C2A the next highest, and C2C the lowest for the data sets shown. Variant C2F (Revision F), having a narrower gap, the strongest magnet, and an arc path routed in a region of high B-field by the modification of the outer electrode, has the highest arc rotation rates.

Comparing the 170825 and 170828 data for C2B (Revision B), there was a significant reduction in the rotation rate after operation at high power in earlier tests. This was confirmed to be due to a lowering of the magnetic field to approximately 90% of its original value (2684 from 3000 G). Similar degradation was confirmed in other variants, with the degradation being more severe for thinner magnets. The effect is attributed to degradation of the upper portion of the magnet when operated at high voltage (higher power deposition) for a significant amount of time. This is discussed in more detail in reference to high speed measurements below.

The rotation rates for C2C were confirmed using a Casio EX-FH25 camera capable of 1000 fps, yielding excellent agreement with the UV sensor measurements. Measurements for various actuators taken in late August 2017 were repeatable with measurements taken more recently in early October 2017.

High-Speed Visualizations of Sweeping Plasma Arc

In order to provide a physical understanding of how the apparent plasma "disc" is formed when actuated, a series of high-speed visualizations of the plasma actuation were acquired. These visualizations provided evidence to substantiate the hypothesis that the plasma actuation takes the form of a local arc filament, which is swept into a circular pattern through the Lorentz force, induced by the interaction of the magnetic field and the moving charge across the arc. These visualizations also were used to identify if and how the rotation rate of the plasma arc could be manipulated through changes in the actuator configuration, which can be utilized to improve future designs.

Figure 18C:
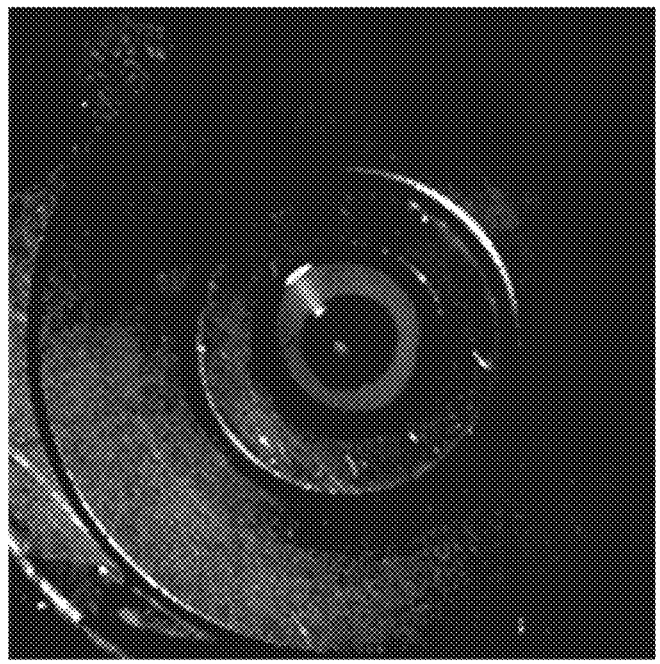
FIG. 18C through 18F are photos of various types of cyclotronic plasma actuators showing the arc.
Figure 18D:
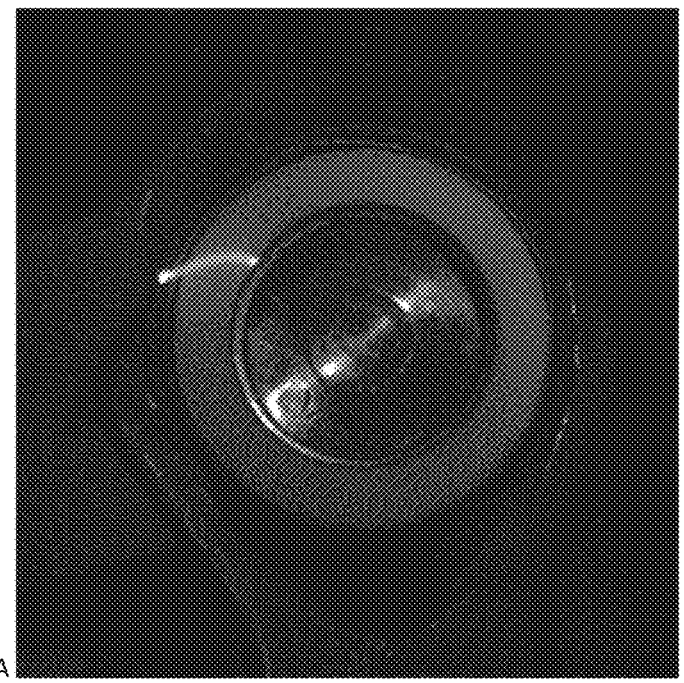
Figure 18E:
Figure 18F:
Figure 33A:
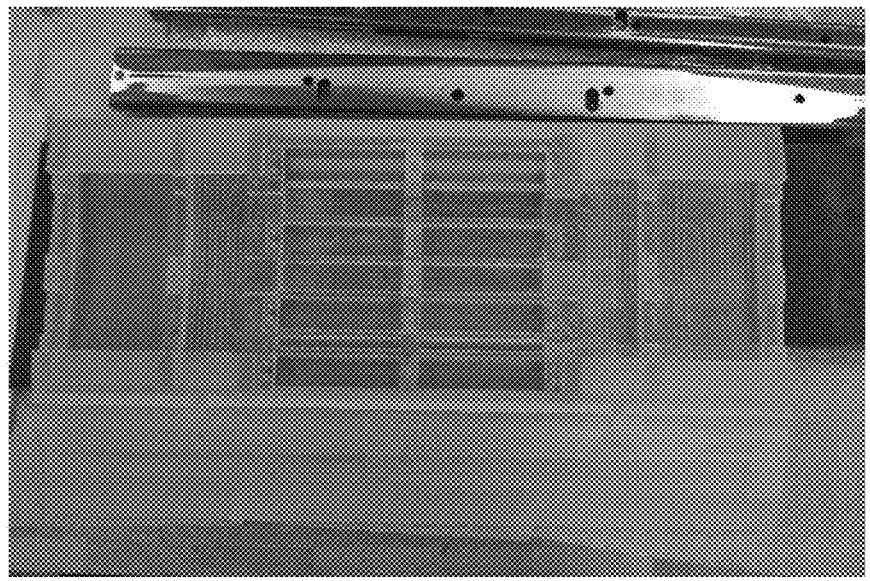
FIGS. 33A, 33B, 33C, and 33D are photo images of an airfoil with one or more actuator installed therein.
Figure 33B:
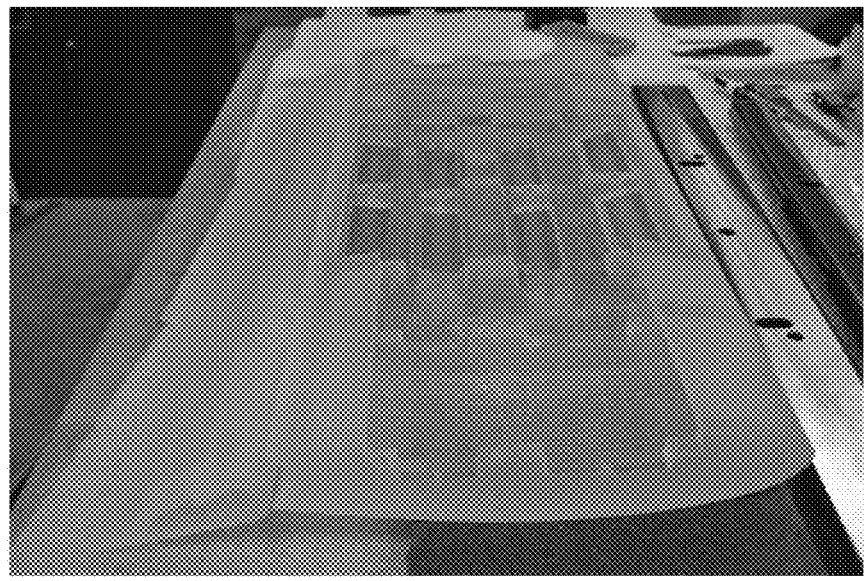
Figure 33C:
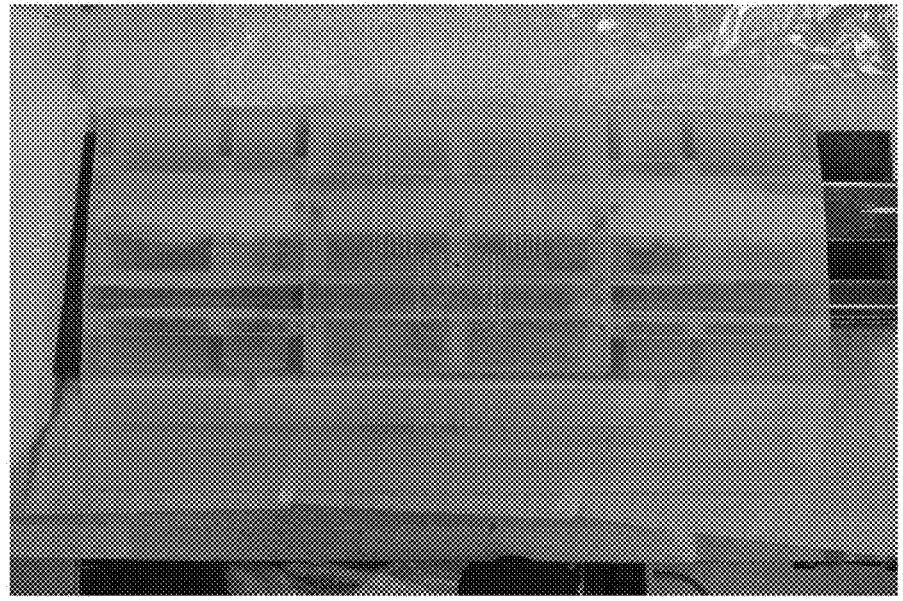
Figure 33D:
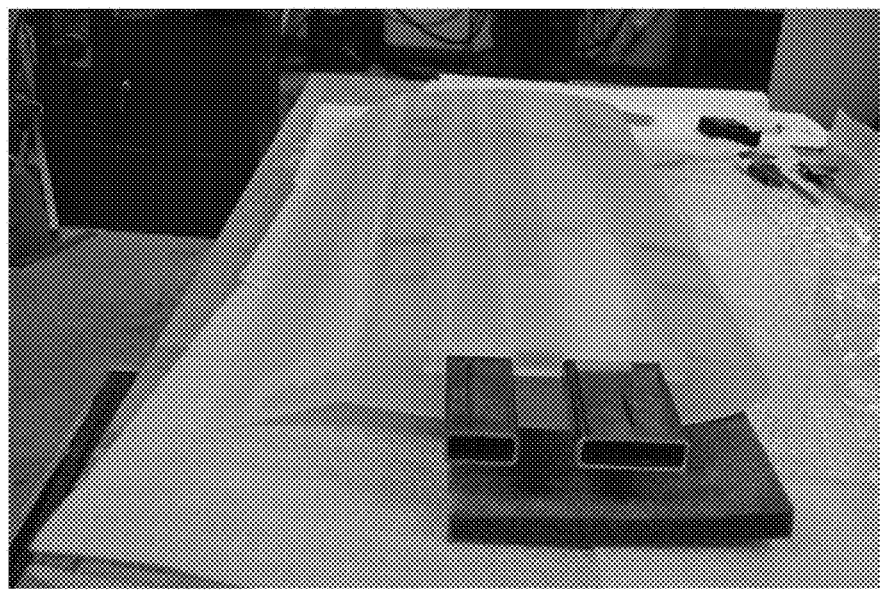

A representative schematic of the basic high-speed visualization studies on the actuator is shown in FIG. 18A. A simple actuator bench test was configured with a high-speed video camera placed directly overhead. High-speed visualizations were obtained for the ACDelco and Iridium modified spark plug electrodes, with three permanent magnets used to provide different magnetic field strengths local to the plasma arc. Visualizations were acquired using a Photron AX200 high-speed camera, which features a maximum frame rate of 6,400 fps at full resolution (1,024×1,024 px) and a 12-bit pixel depth. The top image acquisition speed of the camera is 900,000 fps at reduced resolutions. Additional visualizations were also obtained at a frame rate of 100,000 fps for the Iridium spark plug and the standard magnet model used in subsequent experiments. The purpose of these secondary high-speed visualizations were to observe the periodic arc breakdown produced by the AC driving circuit. The GBS Minipuls 2.2 system was used at an operating frequency of 20 kHz during these high-speed visualization experiments.

A variety of high-speed imaging tests were conducted with Type 1 and Type 2 actuators to confirm the results deduced from simplified tachometer methods. A summary of the resulting arc rotation characteristics are shown in FIG. 18B. As seen in FIG. 18B, a higher power input, characterized by higher voltage, increases the rotation rate of the arc filament. The high-speed imaging results for rotation rate are in good agreement with the tachometer measurements (also included in FIG. 18B. Another interesting observation is that the rotation rate of actuator type C1A is lower than the rotation rate of actuator C2B with 12V supplied to the circuit. However, the trend is reversed and the rotation rate of actuator C1 is higher than the rotation rate of actuator C2B at higher voltages. This comparison implies that the rotation rate of the arc filament depends on the combined effects of electrode gap size, magnetic field strength, and power supplied.

The high-speed videos revealed a curved shape of the arc filament, FIG. 18C-18F (which are high-speed video snapshots of the Plasma Arv breakdown at 20 VC Input), with the outer end of the arc filament lagging behind the motion of the inner end of the arc filament for actuators C2A, C2B, and C2C2 ("C2C2" refers to the $2^{nd}$ build of C2C which has a more powerful magnet). These actuators had the magnet enclosed between the two electrodes with the arc forming above the surface of the magnet. In contrast, arc curvature was not observed for actuator C1A which had the magnet external to both electrodes. Thus, the reported curved shape of the arc filament is thought to be a result of the radial variation of the magnetic field strength across the magnet, along with the longer arc-distance produced, given a fixed phase angle traversed, across larger radial locations of the actuator. The maximum measured magnetic field strength was located at the midpoint between the inner and outer diameters of the magnet.

Evaluation of Actuator Flow Physics with Planar Velocimetry

Initial planar Particle Image Velocimetry measurements were performed, integrating a reconfigurable actuator into a 1-ft×1-ft low-speed subsonic wind tunnel. The purpose of these preliminary measurements was to understand the effects of the actuator on the flow field, particularly the influence of actuation on fluid mixing between the freestream region and the boundary layer. These PIV data also provided valuable insights into the regions where vortical flow structures appear and where flow-field interactions induced by the actuation could be most prominently observed. This understanding will be used to guide the actuator placement for control of turbulent boundary-layer separation in subsequent phases of the study.

The GBS Minipuls 2.2 system was utilized when acquiring all PIV data. An acrylic circular turntable was machined to fit into a cutout of the wind tunnel floor. A cutout in the center of the turntable allowed for various modified spark plugs and permanent magnet configurations to be inserted. The height of the spark plug, relative to the test section wall, was adjustable from below the tunnel floor using a set of nylon ¼-20 screws. All results presented here featured the spark plug tip mounted level with the wind tunnel floor, in order to provide minimal obstruction to the flow. The spark plug was mounted in the center of a ring-shaped Neodymium permanent magnet, which had an outer diameter of 3 inches, an inner diameter of 0.78 inches, and a thickness of 1 inch. PIV data were acquired for both the NGK Iridium and ACDelco modified spark plugs presented in Table 1.

The PIV data were acquired by shaping the beam from a laser into a sheet and capturing the scattering from a set of seed particles in the flow across two frames, via a digital CCD camera, with a small inter-frame time. A schematic of the PIV experimental configuration is shown in FIG. 19. The laser used in this investigation was a New Wave Solo Nd:YAG laser, which operates at a wavelength of 532 nm and provided a maximum energy of 120 mJ per pulse. The output of the beam was directed towards the test section using three Thorlabs dichroic mirrors (R>99% at $\lambda$=532 nm), then through a set of beamforming optics. The beam was shaped into a sheet using a plano-concave cylindrical lens (f=−25 mm) in combination with a spherical convex lens (f=400 mm). This configuration resulted in a laser sheet with a thickness of 1 mm, which covered the full field of view of the camera. The optical path of the laser was enclosed in a black foam board structure to contain reflections while the laser was firing.

Images were acquired using a PCO 1600 digital CCD camera, with a 1600×1200 pixel array and a dual-frame shutter. The inter-frame time of the laser pulses was adjusted based on the wind tunnel fan setting to provide approximately 20 pixel displacements in the freestream. The field of view of the camera measured 5.24 in (streamwise)×3.93 in (wall-normal), and was offset from the wall by 0.05 inches in order to mitigate laser reflections off of the test section floor, as these reflections would potentially damage the camera CCD array. The camera frame acquisition and laser were triggered using a Berkeley Nucleonics Corp Model 575 pulse/delay generator. Synchronization of the laser pulses with the camera shutter was performed using a Tektronix TDS 2024B oscilloscope, which was used to monitor the laser output via a Thorlabs photodiode and the synchronization output of the camera. Seeding particles were produced using an American DJ Haze generator with Haze/G oil-based haze fluid. The resulting particles produced by this system were 2-3 µm in mean diameter.

Acquired PIV images were reduced to vector fields using the LaVision DaVis 8.2 software package. The vector fields were calculated using a multi-pass method with decreasing interrogation window size. The initial size of the rectangular interrogation windows were 128×128 pixels with 50% overlap, which decreased across three passes to a rectangular interrogation window size of 32×32 pixels with 50% overlap. An additional three passes were conducted with an adaptive-geometry interrogation window, having a size within 16×16 pixels with 75% overlap. This multi-pass processing method allowed the early passes with large interrogation windows to improve the vector calculations of the later passes, which acted to increase the reliability of the finer vector fields that were calculated. Histograms of velocity fields revealed no peak locking, and a visual inspection of the acquired images indicated particle diameters as typically occupying two to three pixels. Spurious vectors were detected using a standard deviation filter and were replaced with spatially-interpolated vectors by the DaVis software.

PIV data were acquired for three freestream velocities of the wind tunnel, measured to be $V_\infty$=2.7 ft/s, 7.9 ft/s, and 35.4 ft/s. These cases provided streamwise Reynolds numbers of $Re_x$=1.57×10$^4$/ft, 4.60×10$^4$/ft, and 2.06×10$^5$/ft, respectively. However, only results for $V_\infty$=2.7 ft/s will be presented here, as the small boundary-layer thickness of the higher freestream velocities made it difficult to clearly observe the influence of actuation on the boundary-layer flow. In future testing, a larger wind tunnel will be utilized which will permit longer, streamwise boundary-layer development at higher speeds, providing a larger boundary layer thickness for higher Reynolds numbers. Since the maximum driving frequency of the Minipuls 2.2 system (f=20 kHz) was observed to provide the most stable cyclotronic arc when exposed to the freestream flow, all PIV data were acquired for this carrier frequency. PIV data were also acquired at lower speeds with a driving frequency of f=5 kHz, and no perceptible differences were produced from the f=20 kHz driving frequency.

A comparison of the flat plate velocity field with and without actuation is presented in FIGS. 20A, 20B, and 20C, with the actuator position indicated by a vertical dashed line at x=0. The velocity field with the actuator installed, but inactive, is shown in FIG. 20A. Subplot FIG. 20B) correspond to actuation with the NGK Iridium spark plug, operating in continuous mode, (DC=100%). Similarly, subplot FIG. 20C corresponds to actuation with the NGK Iridium spark plug, operating in burst mode, ($f_{burst}$=200 Hz, DC=50%). From FIG. 20A, the actuator has a negligible effect on the boundary layer when inactive. However, in FIG. 20B, when actuation is enabled a large velocity defect region is produced downstream of the actuator location. It should be noted that the boundary layer does not separate, as no region of negative streamwise velocity is produced across the boundary-layer region resolved in the acquired measurements. In the further downstream region (x>90 mm), a large growth in the boundary-layer thickness can be observed and the velocity defect region is filled in. A similar effect can also be observed in FIG. 20C for the actuator operating in burst mode, however the reduction in velocity is less perceptible in the velocity contours.

From FIGS. 20A, 20B, and 20C, it is clear that the actuator has a discernible influence on the boundary layer, though the effects produced by these interactions can be seen to develop with streamwise distance. In order to emphasize the evolution of the boundary-layer flow field, a set of extracted streamwise velocity profiles from the PIV data of the unactuated, continuous, and burst mode cases are shown in FIGS. 21A, 21B, and 21C at streamwise locations x=−10 mm, 50 mm, and 106 mm. From FIG. 20A, the boundary-layer profiles for all three cases are consistent upstream of the actuator location. Downstream of actuation, in FIG. 20B, a reduction in streamwise velocity can be observed for the continuous and burst mode cases, as compared to the unactuated case. However, the subsequent recovery in near-wall streamwise velocity of the continuous and burst mode cases can be observed in FIG. 20C, which actually have a higher streamwise velocity in the region immediately adjacent to the wind tunnel wall. This local increase in velocity suggests that, while the effect of the cyclotronic plasma actuator is initially associated with a region of decreased velocity in the boundary layer, it eventually develops flow structures which enhance mixing of the boundary-layer flow.

This observed trend in the boundary-layer profiles is similar to those observed in previous studies of passive vortex generator devices. For example, the boundary-layer profiles measured using stereo-PIV on a DU 91-W2-250 airfoil are shown in FIGS. 22A and 22B. The resulting boundary-layer profile for the airfoil at α=6.5 deg, where the flow would normally be attached, is shown in FIG. 22A. Conversely, the boundary-layer profile for the airfoil at α=17.95 deg, where the flow would normally be separated, is shown in FIG. 22B. From FIG. 22A, it can be seen that the effect of the VGs on the baseline, attached flow actually produces a local velocity defect region downstream of the VG. Though, from FIGS. 22A and 22B, the enhanced mixing induced by the VG is effective at retaining boundary-layer attachment at high angles attack, where it would normally be separated. The boundary-layer profiles shown for the flat plate boundary layer of the current study in FIGS. 21A through 21C, are quite similar to those shown for the airfoil at a low angle of attack, in FIG. 22A. This favorable comparison suggests that similar flow field effects are produced for the cyclotronic plasma actuator, as are typically observed for passive vortex generators. Subsequent studies on the actuator will be utilized to characterize the velocity profile associated with actuation on a normally separated flow, such as that shown in FIG. 22B for a passive vortex generator device.

In order to further display the mixing induced by actuation, the z-vorticity component (ζ) calculated from the velocity vector fields are shown in FIGS. 23A, 23B, 23C. It should be noted that a local region of high vorticity appears in FIGS. 23A, 23B, 23C near the actuator location at x=0 and upstream of this location, though this apparent concentration of vorticity is an artifact of the surface reflections of the associated PIV acquisition and not due to fluid dynamic interactions. From FIG. 23A, the unactuated flow displays vorticity generation at and diffusion from the wall of a typical flat plate boundary-layer flow. When actuated, a local shear layer can be observed in FIG. 23B, which is formed and displaced away from the wall with increased streamwise distance, up to x=60 mm. This local region of vorticity then significantly weakens with further streamwise distance. A similar trend is also observed for the burst mode actuation in FIG. 23C, though the magnitude of the vorticity and the displacement of the shear layer are not as large as that associated with the continuous actuation.

Based on this evidence of rotational flow, it is also convenient to identify what influence this vorticity has on the unsteady mixing across the boundary layer profile. Presumably, if some type of vortical flow structure is produced through active actuation, its effects would be perceptible through an increase in the general flow field unsteadiness. The standard deviation of the velocity scalar is shown in FIGS. 24A, 24B, and 24C across the flow field, which was calculated based on an ensemble of 1020 vector fields. From FIG. 24A, the unactuated velocity field is characterized by very little deviation from the mean. In FIG. 24B, when continuous actuation is applied the velocity fluctuations in the boundary-layer region are substantially increased, as indicated by the increase in the standard deviation. It is interesting to note that this standard deviation reaches a local maximum near x=87 mm, which is immediately downstream of the region of high vorticity identified in FIG. 23B. The difference in the locations of maximum vorticity and maximum unsteadiness is further emphasized in FIG. 25, where the z-vorticity and velocity standard deviation are overlaid in the same figure, with the maximum magnitudes of each variable indicated by an arrow. The reason why this region of maximum unsteadiness immediately follows the region of maximum vorticity is yet to be determined, though it is clear that the flow interactions induced by the cyclotronic plasma actuator must be given sufficient streamwise length to develop in order to be effective in enhancing the mixing of the boundary-layer flow. From FIG. 24C, a similar trend can be observed for the burst mode actuation, though the maximum unsteadiness in the velocity field is lower than that observed for the continuous actuation. Additionally, the principal locations of velocity fluctuations are spread across a longer streamwise length of the flow field than the continuous actuation case.

In order to also understand the differences in the effects of actuation between the two modified spark plugs, a comparison of the velocity and vorticity fields is shown in FIGS. 26A-26D, with both cases run in burst mode ($f_{burst}$=200 Hz, DC=50%). The velocity and vorticity contours of the NDK Iridium plug are shown in FIGS. 26A and 26C, respectively, with the velocity and vorticity contours of the ACDelco plug shown in FIGS. 26B and 26D, respectively. From FIGS. 26A-26D, the velocity and vorticity contours reveal a very similar effect between the two modified spark plug configurations. The key difference between these two cases is that the influence of the NDK Iridium spark plug is visible much closer to the actuator location, where the effects induced by the ACDelco plug appear farther downstream.

PIV data were also acquired across a horizontal plane (x-z plane), which grazed through the boundary layer at a height y=5 mm from the wind tunnel floor. These PIV data were only acquired for a subset of conditions, with the ACDelco spark plug. The velocity scalar contours for the flow field are shown in FIGS. 27A and 27B. In FIGS. 27A and 27B, the actuator is centered at x=0, z=0. The unactuated velocity is shown in FIG. 27A, and the velocity produced with continuous actuation at f=20 kHz is shown in FIG. 27B. It should be noted that these velocity contours have been normalized by the freestream velocity, so the velocity in FIG. 27A is below $V/V_\infty$=1 throughout the entire velocity field, as the height of the measurement location was below the boundary-layer thickness. It should be noted that, due to the preliminary nature of these PIV results, there are several locations downstream of x=80 mm where isolated surface reflections prevented vectors to be effectively calculated. It can be seen in FIG. 27B that the effects of actuation produce localized streaks of low-velocity fluid in the x-z plane. While it is believed that these low-velocity streaks are produced by a streamwise-oriented vortex produced by the actuation, though the current results are not entirely definitive, as a similar effect could be produced by a decrease in velocity across the fixed y-location due to a local thickening of the boundary layer. However, since the two streaks provide an asymmetric velocity defect centered about the z=0 location, it is likely that the actuator is producing a local upwash and downwash regions across the velocity field, similar to the effects shown previously in FIGS. 22A and 22B for a passive vortex generator acting on a nominally attached flow. In either case, it is clear that the actuation approach is producing distinct, three-dimensional flow features in the near-wall region, which may prove to be useful towards separation control.

Pressure Recovery Measurements

A study of the effect of the cyclotronic plasma actuator on the flow was also conducted on a basic, linearly diffusing ramp geometry in a subsonic wind tunnel. A representative schematic of the hump and ramp geometry used for these experiments is shown in FIG. 28. The hump was fixed to the floor of a subsonic wind tunnel, having a 3-ft×4-ft test section. The span of the hump was 1 ft, and splitter plates were attached to the edges of the span to isolate the flow across the hump surface from the other regions of the test section. A boundary-layer trip was positioned at the upstream end of the flat upper surface of the hump to ensure a turbulent boundary layer was produced over the downstream ramp. Three actuator mounting locations were built into the flat surface after the initial flow acceleration over the hump. A 12.9-inch linear ramp was built into the downstream end of the hump, oriented at an angle of 25 deg relative to horizontal. Pressure data were recorded using an Esterline (formerly Pressure Systems, Inc) DTC Initium electronically-scanned pressure system. A series of pressure taps were machined into the ramp surface in 0.45-inch increments. Measurements were acquired across a total of 31 pressure taps, including those across the ramp and four taps located 4.25, 0.75, 0.5, and 0.25 inches upstream of the ramp location. Three actuator mounting locations were built into the model, though for the results presented here the actuator was placed 2.5 inches upstream of the start of the ramp. Experiments were completed at a freestream velocity of 31.2 ft/s (9.5 m/s), corresponding to a Reynolds number of 200,000, based on the 12.9-inch length of the ramp.

In addition to testing the cyclotronic plasma actuator, the pressure recovery characteristics produced by passive vortex generator (VG) devices were also studied to provide a comparison of effects. These passive VGs were produced using a 1-inch wide strip of copper tape, with the downstream end cut and bent vertically to form pairs of triangular vanes. The height of the vanes was 0.25 inches. If a flat-plate, turbulent boundary layer was assumed to begin at the location of the trip on the hump geometry, empirical relations of turbulent boundary-layer growth estimates the thickness to be approximately 0.2 inches, which is less than the VG height. Typically, vortex generators are designed with a height between 0.2 and 0.5 of the local boundary-layer thickness, indicating that the vortex generators were conservatively designed for the current study. A photograph of an example vortex generator strip is shown in FIG. 29. In addition to testing a full VG strip, a single pair of VGs were also tested to compare against the pressure recovery characteristics of a single cyclotronic plasma actuator. However, it should be noted that this pair of VGs will still act to produce a pair of streamwise vortex structures, while the single cyclotronic plasma actuator is expected to produce one. The pressure recovery effects produced by an AC-DBD actuator were also compared, though it should be noted that this DBD plasma actuator was placed slightly downstream of the cyclotronic plasma actuator mounting location. Additionally, several pressure taps were covered by the dielectric tape used to produce the actuator, so surface pressure measurements across the upstream section of the ramp were not reliably acquired.

The resulting pressure distributions across the wall-mounted hump and ramp are shown in FIGS. 30A and 30B. The $C_p$ distribution produced by the baseline (no actuation) case, along with the $C_p$ distribution with a VG strip, a pair of VG vanes, and cyclotronic plasma actuation are shown in FIG. 30A. These $C_p$ values were referenced based on freestream static pressure and dynamic pressure values acquired upstream of the hump. The net differences in $C_p$ between a controlled and uncontrolled case are also shown in FIG. 30B for the VG pair, AC-DBD actuation at the ramp location, and the cyclotronic plasma actuator. It should be noted that the AC-DBD actuated case is not shown in FIG. 30A since the dielectric tape coverage prevented reliable measurements from being acquired across the region upstream of the ramp. A separate no-control velocity reference acquired after installation of the DBD actuator was thus used to identify the $\Delta C_p$ distribution with DBD actuation shown in FIG. 30B.

From FIG. 30A, a nearly-constant pressure is obtained for the no-control case, which was attributed to the massively separated flow induced by the strong adverse pressure gradient at the start of the ramp. The addition of the VG pair was observed to improve the pressure recovery characteristics across the ramp, which also acted to increase the suction at the ramp corner as the flow navigated the corner between the flat section of the hump and the 25 deg ramp. Similarly, the VG strip case in FIG. 30A reveals a significant increase in pressure recovery and a much larger suction peak at the ramp corner. The greater pressure recovery of the VG strip, as compared to the VG pair, was attributed to an improved mixing from a full array of spanwise vortex structures produced by the VG strip. The pressure recovery characteristics of the VGs served as an effective point of comparison against the effects induced by the cyclotronic plasma actuator, which is also shown in FIGS. 30A and 30B. It can be observed in FIG. 30A that the pressure recovery and suction peak induced by the cyclotronic plasma actuator are very similar to those induced by the VG cases, though to a lesser magnitude. Additionally, for the conditions utilized in the current experiments the AC-DBD actuation had a negligible effect on the flow, as observed in FIG. 30B. Based on this observation, the cyclotronic plasma actuation is believed to significantly outperform conventional plasma-based approaches for turbulent boundary-layer separation control at transitional and high Reynolds numbers.

It should be stressed that a multitude of actuator sizing, positioning, and design variations exist between the cyclotronic plasma actuator case and the VG cases. As a result, the induced effects of both actuation approaches cannot be expected to be associated with the same magnitude. For instance, the VG pair configuration would act to produce two streamwise vortices in the flow to enhance mixing and alleviate boundary-layer separation. Conversely, the cyclotronic plasma actuator produces only one vortex, which can be expected to have less flow control authority than a pair of vortices. This difference can easily be addressed by spacing and operating multiple cyclotronic plasma actuators across the span of the aerodynamic body. The cyclotronic plasma actuator was also believed to be slightly underpowered to provide full alleviation of the separated flow. Since the innovation is still in early development stages, approaches to increase power input to the flow through the arc-filament plasma are under active investigation. It can be expected that as improvements are made to the driving circuit of the actuator, the authority provided by actuation will increase. As was also stated previously, the VGs used in this study were likely oversized, as compared to what would normally be used for passive control of turbulent separation. This conservative approach in the VG configuration makes a direct comparison between the magnitudes of the pressure recovery quite difficult, though the distinct consistency in qualitative effects of the VG and cyclotronic plasma actuation reveals great promise for this novel flow control device.

The results of the linear ramp experiments actively demonstrate that the cyclotronic plasma actuator can indeed be used to influence the flow and alleviate turbulent boundary-layer separation effects. Due to the similarities in the pressure recovery characteristics observed between traditional VG systems and the cyclotronic plasma actuator, it is further believed that the current innovation can be matured to meet or exceed the actuation authority offered by standard designs of passive VGs.

Scaling with Magnetic Field

Taking into account the various high-speed image results and tachometer measurements in quiescent flow, along with regular measurements with the DC Gaussmeter, the dependence of arc rotation rate on B-field was determined. Increasing B-fields in the 800 G to 3000 G range corresponded to increasing rotation rates between 800 and 4600 RPM, as seen in FIG. 31. This indicates that to continue improving the arc rotation rate, B-field strength, as well as arc current (increased power deposition) should be increased. To increase B-field, the magnet thickness can be increased at the expense of space, or a higher grade magnet (e.g., N52) may be applied increasing the actuator production cost. Increasing current comes at the expense of supplying higher power to the circuit, and is limited by thermal constraints, as higher current will increase heating of the actuator and circuit elements.

While preliminary studies showed the impact of the cyclotronic plasma actuator on wind tunnel flows, the recent work has focused on improving the performance of the actuator, with the goal of improved effectiveness and control authority.

Comparison to Previous Results

The Type 2 Coax designs produce a significantly faster arc speed compared to the devices tested in earlier work (Type 1 configurations), but do so with a much more compact actuator diameter and reduced overall weight. The 1.0" o.d. Type 1 design with reconfigurable center electrode height, which was tested here produces high RPM, but the outer diameter of the arc gap is only 0.25" compared to 1.06" in the Type 2 designs. However, there is a significant difference in power consumption between the two devices, favoring the Type 1 design. This is due to a significantly lower impedance of the Type 1 gap (data not shown for brevity).

The dimensions and performance data (RPM, arc speed) for various tests are summarized in Table 3. Initial tests with Type 1 and Type 2 actuators have shown the capability of producing high rotation rates with significantly higher arc "tip speeds" using smaller ring magnets compared to earlier work. While C1A produces the highest RPM for the recent data set, C2B produces the highest arc speed (determined from the product of the coaxial gap outer circumference and the rotation rate). The Type 2 designs enable a significantly larger arc gap, and achieve high rotation rates and speeds with a significantly smaller magnet compared to previous testbeds (e.g., compare C2B to Magnet A-C configurations). Currently, designs C2B is the most likely candidates for integration into wind-tunnel models. It is expected that these Type 2 variants, rebuilt with a high-grade magnet (i.e., N52) would achieve improved rotation rate performance compared to either of these. Testing of a modification of C1A with a larger coaxial gap is planned for future work. The Type 1 and Type 2 devices can both be sized to integrate well into the current wind tunnel model. More compact designs may be needed for UAV demonstrations (e.g., C2E in Table 3).

TABLE 3

Comparison of Parameters and Performance for Various Testbed Actuators

| Reference | Actuator | Driver | Rotation [RPM] | Magnet o.d. [mm] | Gap [mm] | Arc o.d. [mm] | Arc Tip Speed [m/s] |
| --- | --- | --- | --- | --- | --- | --- | --- |
| [32] | Magnet A 2.5 mm gap | Minipuls 2.2 | 6173 | 38.1 | 2.5 | 6.3 | 2.04 |

TABLE 3-continued

Comparison of Parameters and Performance for Various Testbed Actuators

| Reference | Actuator | Driver | Rotation [RPM] | Magnet o.d. [mm] | Gap [mm] | Arc o.d. [mm] | Arc Tip Speed [m/s] |
|---|---|---|---|---|---|---|---|
| | Magnet B 2.5 mm gap | Minipuls 2.2 | 9804 | 76.2 | 2.5 | 6.3 | 3.23 |
| | Magnet C 2.5 mm gap | Minipuls 2.2 | 10638 | 76.2 | 2.5 | 6.3 | 3.51 |
| | Magnet A 4.0 mm gap | Minipul 2.2 | 3788 | 38.1 | 4.0 | 8.6 | 1.71 |
| | Magnet B 4.0 mm gap | Minipuls 2.2 | 4505 | 76.2 | 4.0 | 8.6 | 2.03 |
| | Magnet C 4.0 mm gap | Minipuls 2.2 | 4762 | 76.2 | 4.0 | 8.6 | 2.14 |
| This work | C1A | 20 V ZVS Circuit | 5250 | 25.4 | 1.6 | 6.4 | 1.75 |
| | C2A | 20 V ZVS Circuit | 2338 | 25.4 | 5.5 | 26.9 | 3.30 |
| | C2B | 20 V ZVS Circuit | 4321 | 25.4 | 5.5 | 26.9 | 6.10 |
| | C2C | 20 V ZVS Circuit | 1621 | 25.4 | 5.5 | 26.9 | 2.29 |

One goal is to improve the technology readiness level of the actuator approach by investigating various important aspects of integration on a flight platform. Some preparations for future research are described here.

Array Development

The cyclotronic plasma actuator device is intended to replace conventional vane-type VGs, and it is anticipated these devices will perform best when organized in arrays, similar to the configurations used for conventional VGs on fixed-wing aircraft. As the technology matures, this will become a key integration problem to solve, and designs must be found which are both efficient and practical for installation in airframes. For near-term testing of the actuators in the wind tunnel, actuators can be configured to operate independently from wall-plug DC supplies, as in FIG. 32. However, for integration into aircraft systems, especially UAVs, a more elegant solution must be devised. Ongoing work is investigating the operations of multiple actuator drivers off a single DC bus.

Wind-Tunnel Tests with a Flapped S8036 Airfoil

In recent work, a flapped airfoil model has been constructed to serve as a wind tunnel testbed for cyclotronic plasma actuators. The wind tunnel model, pictured in FIGS. 33A-33D, uses an S8036 Airfoil Model with Pressure Taps and Modules for Plasma Actuators. This model was constructed with a 3D printed body, mounted to a steel internal structure. Removable modules, similar to that shown in FIG. 34A, can be used to secure arrays of actuators at various positions along the chord. The internal structural design allows the wiring for actuators to be routed through the wing spars to the actuator modules; the layout of the cross section is shown in FIG. 34B. The model also has three chordwise rows installed to evaluate the influence of the actuation on the local pressure distribution and lift characteristics across planes coincident with or directly between actuators. The modules are designed to allow for a span-wise array of up to 6 actuators to be embedded into the airfoil model. Additionally, four module mounting locations are built into the model at different chordwise positions, allowing the performance produced by actuation at various streamwise positions to be compared.

UAV Flight Testing

Another important goal is demonstrating effectiveness of plasma arc-magnet actuators in a UAV platform. It is anticipated that the plasma actuator systems will use a separate battery supply from the other aircraft systems (actuators, radio, etc.). The estimated payload for the actuator system (driver modules, transformers, and arc-magnet actuators) is approximately 5 lbs. (2268 g) depending on how the aircraft is configured. The tentative flight test metric used will be evaluation of actuator effect on takeoff ground roll for varied flap settings.

The associated weights and volumes of the high-voltage pulse circuits are compared to the GBS Minipuls 0.1 system in Table 4, breaking down the weights and volumes associated with the driver circuits and transformer modules (circuits 1-5 all use the same transformer module).

TABLE 4

Comparison of Mass and Volume for Various HV Pulse Circuits

| # | Circuit Configuration | Driver Mass [g] | Transformer Mass [g] | Total Circuit Mass [g] | Driver Volume [cm³] | Transformer Volume [cm³] | Total Circuit Volume [cm³] | Total Circuit Density [g-cm⁻³] |
|---|---|---|---|---|---|---|---|---|
| 1 | ZVS #1 | 115.4 | 225.2 | 340.6 | 143.6 | 324.0 | 467.6 | 0.728 |
| 2 | ZVS #2 | 192.1 | 225.2 | 417.3 | 316.4 | 324.0 | 640.4 | 0.652 |

TABLE 4-continued

Comparison of Mass and Volume for Various HV Pulse Circuits

| # | Circuit Configuration | Driver Mass [g] | Transformer Mass [g] | Total Circuit Mass [g] | Driver Volume [cm³] | Transformer Volume [cm³] | Total Circuit Volume [cm³] | Total Circuit Density [g-cm⁻³] |
|---|---|---|---|---|---|---|---|---|
| 3 | IRF540N | 39.2 | 225.2 | 264.4 | 52.64 | 324.0 | 376.6 | 0.702 |
| 4 | IRFP250N | 36.9 | 225.2 | 262.1 | 78.7 | 324.0 | 402.7 | 0.651 |
| 5 | Dual IRFP250N | 51.9 | 225.2 | 277.1 | 218.1 | 324.0 | 542.1 | 0.511 |
| 6 | GBS Minipuls 0.1 | 83.0 | 252.0 | 335.0 | 268.8 | 446.8 | 715.6 | 0.468 |

This preliminary analysis shows that the Mazzilli-type ZVS and unipolar clock-driven MOSFET designs are comparable in total mass and volume to the commercially available GBS system, which is intended for integration in UAVs. The flyback transformer used in bench tests is similar in mass to the GBS transformer cascade board, while taking up less volume; potentially this component, which accounts for a significant percentage of the circuit mass, can be reduced in volume once the design is optimized, but it is doubtful that the mass will be significantly reduced (depending on available core sizes). The ZVS driver circuits are significantly heavier than the 30 W GBS system, but both operate at significantly higher power (up to ~120 W); also, the ZVS #2 module has an integrated cooling fan and driver circuit which adds weight and volume (compared to ZVS #2). The simple unipolar pulse driver circuits (circuits 3-5) are significantly lower in weight than the other options, but these designs have not been optimized for efficiency, and it is anticipated that the mass will increase as these designs are matured.

Multiphysics Simulation Development for Plasma Actuator

A goal was to simulate the flow field of the wind tunnel experiments with the cyclotronic plasma actuator modeled as a momentum/vorticity, thermal source boundary condition. Preliminary simulations of the actuator were modeled in a "decoupled" fashion. Wind-tunnel simulations were performed using two low-Reynolds number Reynolds Averaged Navier-Stokes turbulence models, i.e. turbulence models in which physical effects through the low-Reynolds number viscous sub-layer are resolved.

Prior to construction of 2-D and 3-D turbulent simulations of the wind tunnel experiments, numerical and grid convergence studies were completed for simulation of turbulent boundary layer development over a length scale relevant to the experimental system, 0.15 m, and for the experimental flow conditions, $V_\infty=2.7$ ft/s (0.823 m/s), $P_0=99090$ Pa, $T_0=73$ F (295.93 K), RH (relative humidity)=50%. Preliminary calculations indicated that for this flow configuration, a non-dimensional turbulent flow height $y^+=1$ corresponded to a physical height of $2.37 \times 10^{-4}$ m.

Calculations indicated that the relevant physical results and numerical error are sufficiently resolved with a dimensionless global residual convergence criterion of $1 \times 10^{-7}$.

Discretization error was characterized by studying wall shear stress and streamwise momentum flux 0.1 m downstream of the simulation inlet as a function of the number of node points used to discretize the wall-normal dimension in the turbulence boundary layer formation simulations. These two parameters derived from post-processing of the simulation results should approach constant values as the inverse of the node count (which is proportional to finite volume cell height) approaches zero, FIG. 36 and FIG. 37.

As expected, calculations indicated that a degree of discretization which produces a first wall normal node location near a $y^+$ value of 1 is sufficient to sufficiently eliminate discretization error in crucial derived parameters.

Using the numerical and meshing accuracy constraints derived from the previous studies, two-dimensional simulations of the wind tunnel used in the plasma flow control experiments were derived. The computational domain extended 0.15 m upstream and downstream of the vorticity generation device location and 0.15 m above the vorticity generation device in the wall (floor) normal direction and was comprised of $1.44 \times 10^5$ finite volume cells. Two simulation configurations were used: the first based on a Reynolds-Averaged Navier-Stokes model coupled to a single-equation Spalart-Allmaras model (with Spalart source term limiter and with low Reynolds number term closure achieved via inclusion of a Poisson wall distance model), and the second based on a Reynolds-Averaged Navier-Stokes model coupled to a two-equation Chien k-ε turbulence model (with low Reynolds number term closure achieved via inclusion of a Poisson wall distance model). Second order flux schemes were utilized on all equations and all simulations assumed fully developed turbulent boundary layers at the inlets derived from the simulations presented earlier with minimal turbulent intensities. Assuming an inactive flow actuator, the flow field modeling using both methods, FIGS. 38B and 38C, were in excellent agreement with data, FIG. 38A.

Results of the two-dimensional simulations are also in excellent agreement with experimental boundary layer profile data from three streamwise locations upstream and downstream of an inactive actuator, FIGS. 39, 40 and 41.

Initial studies have also begun in which the plasma flow control device is modeled as a momentum source, and/or turbulent kinetic energy source, and/or a thermal source. The eventual goal will be to provide a correlation of velocity profiles from these simulations to those obtained from active flow control experimental data, and determine appropriate source magnitudes to use in flow simulations based on information from separate plasma-dynamic simulations of the actuator. Preliminary example calculations of this type are illustrated in FIG. 42 and FIG. 43, in which the Spalart-Allmaras simulation presented in the previous section was modified to include a 1 kg-m⁻²-s⁻² wall normal momentum source at x=0, y=0.

Three-dimensional simulations of the flow in the wind tunnel have also begun. The cases are configured in manner similar to the two-dimensional simulations presented in the previous section. Turbulent kinematic viscosity in the experimental wind tunnel calculated in a three-dimensional, Spalart-Allmaras-based simulation is illustrated in FIG. 44.

Another goal was to generate preliminary simulations of plasma flow and chemistry in the discharge region of the corresponding experiments. Preliminary 1D and 2D axisymmetric plasma modeling used several BLAZE models in a coupled fashion including Navier-Stokes, Molecular Transport (advection-diffusion for neutrals, drift-diffusion for charged particles), Poisson Electric Field, and Electron Energy Transport (with optional non-equilibrium electron energy distribution function approach in which local mean electron energies are determined from the local energy distribution rather than from electron transport dynamics, and a two-term spherical harmonic Boltzmann equation expansion EEDF solver module). All fluxes were modeled as second order. Non-equilibrium Boltzmann tables were calculated and periodically updated on a Boltzmann mesh which was derived from the multiphysics mesh using an automated cell-agglomeration scheme internal to the model. Reconstruction of Boltzmann results on the multiphysics mesh utilized a second order approach along with a Gaussian spatial filter to eliminate any minor spatial discontinuities resulting from highly spatially parallelized operation. Boltzmann tables were constructed on a discrete reduced electric field (E/N) domain between $10^{-23}$ and $10^{-20}$ V-m$^2$, with individual non-equilibrium EEDFs modeled using an electron energy domain between 0.1 and 100 eV discretized into 1000 electron energy cells.

The plasma chemistry set utilized was developed by progressively adding neutral and plasma species and reactions associated with groupings of species and reaction pathways associated with $N_2$, $O_2$, $CO_2$, and Ar states. Additionally, the model under-relaxation and Boltzmann solver settings were adjusted to maintain stability in a 1D simulation with the discretized dimension representing a 2 mm gap between a high voltage electrode and a ground. The plasma-chemistry set used is primarily based on $N_2$, $O_2$, $CO_2$, and Ar states, specifically: Ar, Ar$^+$, Ar($^1S_5$), CO, $CO_2$, e$^-$, N($^4S_{3/2}$), N$^+$, $N_2$, $N_2^+$, $N_2(A^1\Pi)$, $N_2(A^1\Sigma)$, $N_2(A^3\Sigma)$, $N_2(B^3\Pi)$, $N_2(B^3\Sigma)$, $N_2(v=1)$, $N_2(v=2)$, $N_2(v=3)$, $N_2(v=4)$, $N_2(v=5)$, $N_2(v=6)$, $N_2(v=7)$, $N_2(v=8)$, $N_2(W^3\Delta)$, NO, $NO_2$, O($^3P_2$), O$^+$($^4S_{3/2}$), $O_2(^3X)$, $O_2^+(X^2\Pi_g)$, $O_2(a^1\Delta_g)$, $O_2(b^1\Sigma_g)$, $O_3$. The present version of the chemistry set, which is not presented for brevity, contains 436 volume reactions and 25 surface reactions.

Both direct-current and pulsed 1D simulations were performed, while the direct-current simulations (which were primarily used for chemistry verification simulations) are not presented here for brevity. Pulsed 1D simulations were based on a 50 finite volume cell based discretization of a 2 mm, 1 atm air discharge gap. Cell sizes were progressively lowered as they approached the electrodes in order to capture the high charged particle concentrations which occur immediately adjacent to the electrodes. Minimum finite volume cell thickness adjacent to electrodes was approximately 2 μm. Calculations modeled three sinusoidal pulses at a frequency of 13 kHz using time steps of $7.7\times10^{-7}$ sec. and a transient simulation approach. High voltage terminal voltage for a select 1D case as a function of simulation time is presented in FIG. 45.

Electron number density and electron temperature at the surface of the high voltage electrode, at the core of the discharge, and at the surface of the ground electrode as a function of time for the 1D discharge simulation associated with the terminal voltage profile in FIG. 45 are presented in FIG. 46 and FIG. 47. Calculations indicate that electron number density peaks are consistent with the terminal voltage peaks and electron number density is higher when polarity is such that the electron drift velocity is towards the high voltage electrode. Calculations further indicate that electron temperatures are highest near the high voltage electrode.

Calculated electron and $N_2^+$ ion number densities as a function of distance from the high-voltage electrode at times consistent with peak terminal voltages of 100 and −100 volts respectively are plotted in FIG. 48 and FIG. 49. Calculations indicate higher peak ion densities than electron densities, however given the much higher mobility for electrons vs. ions, the energy transfer rate from the electric field to the electrons will be much higher than for the ions.

The modeling approach applied in the above 1D pulsed air discharge simulations was also applied to an axisymmetric domain representing the interior of the discharge gap in the spark plugs used in the corresponding experiments. The modeled discharge region is highlighted in FIG. 50, upper-left. Corresponding preliminary axisymmetric 2D simulations were performed for peak to peak terminal voltage values of 0.2, 0.6, and 1.0 kV. By assuming axial symmetry, the calculation precludes the appearance of discrete sparks along a single path and averages the influence of the discharge over the entire discharge gap axial domain. Surface plots of the 1 kV peak to peak voltage case at $t=5.775\times10^{-5}$ sec. (which corresponds to 3/(4 f) and an instantaneous terminal voltage of −500 V) indicate that the electron drift velocity is directed away from the high voltage electrode at this point in the simulation as indicated by the distribution of the electron number density (upper-right), peak electron energies occurring near a corner of the high voltage electrode (lower-left), and electron drift velocity peaks near the high voltage electrode (lower-right). The average electron drift velocity is approximately $3\times10^4$ m/s throughout the majority of the discharge region. When a magnetic model is included as well, the electron drift velocity will be used to compute a total Lorentz force and an associated influence on the nearby flow.

Time traces of electron number density, electron temperature, and electron drift velocity averaged over the entire computational domain are presented in FIGS. 49A-49C with peaks predictably occurring at times associated with peak terminal voltages.

General Conclusions

The research yielded a variety of appealing results which encourage further investigation and development of the cyclotronic plasma actuator technology. Some of the key conclusions and accomplishments achieved are:

Bench testing and preliminary design work illustrated the ability to produce effective cyclotronic actuators using both off-the-shelf components (modified spark plugs and magnets), as well as straightforward designs made from common, readily-available materials. Commercially available AC driver circuits for producing atmospheric arcs could be used to achieve the desired effect with commercially available Neodymium magnets. As a result of research to date, development of more robust designs for detailed analysis in the future should be straightforward.

Visualization of the arc rotation was possible for the experimental configurations. The rotation rate was shown to be dependent on adjustable parameters (geometry and magnetic field strength), establishing the potential for optimization of the design in later studies. In further work, this visualization technique can be linked with wind tunnel testing and modeling results to aid in evaluation of the actuator designs.

PIV and pressure distribution measurements in wind tunnel experiments established the potential for the innovative plasma actuator to impact the boundary-layer flow physics. Preliminary comparisons of the new plasma technology to conventional VG arrangements and DBD results yielded encouraging results when applied to a separated flow case, suggesting that an optimized cyclotronic actuator array, with further validation and knowledgeable system design, could have potential to compete with conventional approaches.

Multiphysics simulations illustrated the capability to study system parameters for relevant experimental actuator configurations, with the potential to investigate both boundary-layer flow physics, and the time-dependent dynamics of the arc plasma.

Assessment by Engineering Team

Overall, the results encourage the advancement of this new innovative plasma actuator concept. Benchtop testing and design work showed that variants of the cyclotronic plasma actuator were straightforward to produce, and that various AC driver techniques could be applied to achieve the desired effect of arc rotation in a magnetic field. High-speed visualization of the preliminary testbeds revealed that the rotation of the arc could be controlled depending on the basic design parameters (arc gap and magnetic field strength). PIV measurements in a small-scale tunnel, and pressure recovery measurements with the actuator placed upstream of an expansion ramp established encouraging behaviors, showing the cyclotronic actuator to have similar impacts to conventional VGs as well as superior performance to a DBD actuator. Furthermore, substantial progress was made in the development of multiphysics simulations of the plasma actuator, showing promise for the future application of computational study in advancement of the actuator technology.

The Applicants anticipate several important benefits from the cyclotronic plasma actuator over other technologies. When compared to traditional dielectric barrier discharge plasma actuators, the cyclotronic plasma actuator may add more energy into the plasma to improve actuator authority and improve effectiveness for low-speed and high-speed flows. This technology may also alleviate turbulent separation through 3D mixing mechanisms, similar to passive vortex generators. This mixing mechanism may also improve operational efficiency, or reduce proposed actuator power requirements, as compared to existing technologies. The proposed innovation also provides more benefit than passive devices as control authority can be provided on-demand and it does not produce undesirable parasitic drag during high-speed cruise. Finally, the actuator has no moving parts and does not require the heavy infrastructures and mechanical complexities associated with high-pressure air storage, as required for most pneumatic approaches to active flow control.

Commercial Applications

The cyclotronic plasma actuator also has potential to significantly reduce drag and fuel burn for commercial aircraft through improved control surface effectiveness and high-lift performance, allowing aerodynamic surface weight and size to be reduced. Operational benefits are also anticipated for the efficiency, maneuverability, and stall prevention of military aircraft in high angle of attack operation. Potential internal flow applications may also include plasma assisted combustion, flame stabilization, and flow management inside inlet S-ducts.

Modifications to Configuration Types

In addition to the above, various modifications can be made to the above Types in accordance with the following: (a) Modification of above with asymmetric electrode geometry; (b) Modification of above with offset center electrode geometry; (c) Modification of above with direct-current (DC) electro-magnet to supply magnetic field; (d) Modification of above with pulsed or alternating current electromagnet to supply time-varying magnetic field; (e) Modification of above with spatially varying magnetic field (e.g., array of magnets); (f) Modification of above with various high-voltage techniques for glow discharge breakdown in gas (e.g., AC pulse, DC pulse, nanosecond pulsing, hybrid techniques, "pulse-sustainer"); (g) Modification of size of elements in above (magnets, electrodes) to optimize performance dependent on gas composition or pressure of atmosphere in which glow discharge operates; and/or (h) Modification of above with electrode terminals in series or parallel circuit with electro-magnet to supply both high-voltage pulse and magnetic field.

Lastly, various applications can be viewed for the various Types discussed herein, including: (a) Application as a plasma device for fluid-dynamic flow control (e.g., boundary-layer flow modification, drag reduction, flight control); (b) Application as a plasma device for plasma-assisted combustion (e.g., integrated into a flame-holder assembly) illustrated in FIGS. 52A, 52B and further shown in FIGS. 53A, 53B; (c) Application as a plasma generation technique for plasma processing of gas (e.g., breakdown of carbon-dioxide); (d) Application as a plasma generation technique for plasma gas spectroscopy (i.e., to identify composition of gases in conjunction with an optical measurement technique); (e) Application as a plasma generation technique for ozone generation; (f) Application as a plasma generation technique for surface treatment by excited gases; (g) Application as a plasma generation technique for plasma sterilization of air and surfaces; (h) Application as an arc lamp light source; (i) Application as an anti-icing device for aircraft; (j) Application as a de-icing device for aircraft; (k) Application as an electrostatic fluid accelerator; (l) Application as a turbulator (e.g., improved heat transfer across surfaces, improved multi-phase or multi-fluid mixing); and/or (m) Application in any of the above application categories as an array of plasma elements.

While particular elements, embodiments, and applications of the present invention have been shown and described, it is understood that the invention is not limited thereto because modifications may be made by those skilled in the art, particularly in light of the foregoing teaching. It is therefore contemplated by the appended claims to cover such modifications and incorporate those features which come within the spirit and scope of the invention.

We claim:

1. A cyclotronic actuator comprising:
   a 3-dimensionally shaped dielectric material having a top surface edge;
   a first electrode defined to have a first base, a first end diametrically opposed to the first base, and a first body positioned between the first base and the first end, and wherein the first body being surrounded by and in contact with the dielectric material, and the first electrode being further configured to be mounted within the dielectric material such that the first end extends through the top surface edge of the dielectric material;
   a second electrode defined to have a second base, a second end diametrically opposed to the second base, and a second body positioned between the second base and the second end, and wherein the second electrode being positioned away from the first electrode and having at least the second body in contact with an outside edge of the dielectric material, and the second electrode being further configured such that the second end extends above the top surface edge of the dielectric material, and wherein the 3-dimensional shaped dielectric material is configured to prevent a coaxial flow of gas between the first body and second body of the first and second electrodes;

a high-voltage electrical plasma driver connected to one of the first or second bases of the electrodes and wherein the other electrode base is grounded such that a plasma discharge is formed across the top surface edge of the dielectric material between the first and second ends of the first and second electrodes when the high-voltage electrical plasma driver is activated; and a ring magnet surrounding the second electrode and configured to introduce a local magnetic field to the plasma discharge, such that the plasma discharge discharges in a radial direction and the local magnetic field is oriented vertically in a direction parallel to the axisymmetric orientation of the first and second electrodes to create a Lorentz Force to cause the plasma discharge to move in a tangential direction and to cause the plasma discharge to discharge out in a circular pattern, whereby three-dimensional, vortical structures are produced by the moving plasma discharge.

2. The actuator of claim 1, wherein the first electrode is positioned in the center of the dielectric material and the second electrode is grounded and surrounds the first electrode axisymmetrically.

3. The actuator of claim 2, wherein the first and second electrodes are placed within an inner diameter of the ring magnet separated by the dielectric material such that the plasma arc is produced within the inner diameter of the ring magnet across the top surface edge of the dielectric material, and wherein an arc gap is formed in the plasma discharge and is defined by the difference between an inner radius of the ring magnet and a radius defined by the first electrode.

4. The actuator of claim 3, wherein the high-voltage AC plasma driver produces a plasma discharge with a voltage of the arc gap within the 2-10 kV range or a variable frequency range of the plasma discharge within a 5 to 20 kHz range and a current of the plasma discharge between 10 and 100 mA.

5. The actuator of claim 3 further comprising:
a fuel/air injection port configured to introduce fuel/air into the plasma discharge for ignition by the moving plasma discharge.

6. The actuator of claim 1, wherein the high-voltage electrical plasma driver is selected from one or more of the following: a high-voltage AC plasma driver, a high-voltage RF circuit, a high-voltage pulsed DC plasma driver, or a bipolar high-voltage circuit.

7. An aircraft wing section comprising:
an aperture configured into the surface of the aircraft wing section; and
a cyclotronic actuator embedded into an airfoil of the aircraft wing and positioned adjacent the aperture, the cyclotronic actuator further configured to have:
a dielectric material having a top surface edge;
a high-voltage plasma driver,
a first electrode connected to the high-voltage plasma driver, the first electrode being surrounded by a dielectric material and configured such that an end of the first electrode is positioned above the top surface edge of the dielectric material,
a second electrode being grounded and positioned away from the first electrode, and the second electrode configured against a portion of the dielectric material such that an end of the second electrode is positioned above the top surface edge of the dielectric material,
and wherein the dielectric material is configured to prevent a coaxial flow of gas between the first and second electrodes, whereby a plasma discharge is formed between the pair of electrodes across the top surface edge of the dielectric material when the high-voltage plasma driver is activated, a ring magnet surrounding the second electrode and configured to introduce a local magnetic field to the plasma discharge, such that the plasma discharge discharges in a radial direction and the local magnetic field is oriented vertically in a direction parallel to the axisymmetric orientation of the first and second electrodes to create a Lorentz Force to cause the plasma discharge to move in a tangential direction and to cause the plasma discharge to discharge out in a circular pattern, whereby three-dimensional vortical structures are produced and released out of the aperture on the airfoil by the moving plasma discharge to aid in preventing boundary-layer separation in the presence of high adverse pressure gradients.

8. The aircraft wing section of claim 7, wherein the high-voltage electrical plasma driver is selected from one or more of the following: a high-voltage AC plasma driver, a high-voltage RF circuit, a high-voltage pulsed DC plasma driver, or a bipolar high-voltage circuit.

9. A fluidic mixing device comprising:
a cyclotronic actuator having:
a high-voltage plasma driver;
a ring magnet having an inner diameter and an outer circumference;
a pair of coaxial electrodes connected to the high-voltage plasma driver, and positioned within the inner diameter of the ring magnet, and having a dielectric material separating the coaxial electrodes from one another, the dielectric material having a top surface region separating the pair of coaxial electrodes and configured to prevent a coaxial flow of gas between the pair of coaxial electrodes, wherein a plasma discharge is formed between the pair of coaxial electrodes across the top surface region of the dielectric material when the high-voltage plasma driver is activated and wherein the ring magnet being positioned to introduce a local magnetic field to the plasma discharge, such that the plasma discharge discharges in a radial direction and the local magnetic field is oriented vertically in a direction parallel to the axisymmetric orientation of the first and second electrodes to create a Lorentz Force to cause the plasma discharge to move in a tangential direction and to cause the plasma discharge to discharge out in a circular pattern, whereby three-dimensional vortical structures are produced by the moving plasma discharge to increase mixing in flows of gases.

10. The fluidic mixing device of claim 9, wherein the high-voltage electrical plasma driver is selected from one or more of the following: a high-voltage AC plasma driver, a high-voltage RF circuit, a high-voltage pulsed DC plasma driver, or a bipolar high-voltage circuit.

11. The actuator of claim 9 further comprising:
a fuel/air injection port configured to introduce fuel/air into the plasma discharge for ignition by the moving plasma discharge.

12. A cyclotronic actuator comprising:
a high-voltage plasma driver;
a ring magnet having an inner diameter and an outer circumference;
a first electrode connected to the high-voltage plasma driver, and positioned within the inner diameter of the ring magnet;
a dielectric material surrounding the first electrode;
a second electrode being grounded and positioned away from the first electrode along the outer circumference of the ring magnet, such that a plasma discharge is formed between the pair of electrodes when the high-voltage plasma driver is activated;
wherein the ring magnet being positioned to introduce a local magnetic field to the plasma discharge, such that the plasma discharge discharges in a radial direction and the local magnetic field is oriented vertically in a direction parallel to the axisymmetric orientation of the first and second electrodes to create a Lorentz Force to cause the plasma discharge to move in a tangential direction and to cause the plasma discharge to discharge out in a circular pattern, whereby three-dimensional vortical structures are produced by the moving plasma discharge.

13. The actuator of claim 12, wherein top sections of the first and second electrodes protrude above a top portion defined by the ring magnet, and wherein the top portion of the ring magnet is sheathed from the first and second electrodes by a dielectric material such that the plasma discharge is formed in above the dielectric material between the first and second electrodes and wherein an arc gap is formed in the plasma discharge and is defined by the difference between the outer circumference of the ring magnet and an outer diameter of the first electrode.

14. The cyclotronic actuator of claim 12, wherein the high-voltage electrical plasma driver is selected from one or more of the following: a high-voltage AC plasma driver, a high-voltage RF circuit, a high-voltage pulsed DC plasma driver, or a bipolar high-voltage circuit.

15. The actuator of claim 12 further comprising:
a fuel/air injection port configured to introduce fuel/air into the plasma discharge for ignition by the moving plasma discharge.

16. A cyclotronic actuator comprising:
a circuit board being made of a dielectric material;
a pair of coaxial electrodes patterned into the circuit board and being spaced apart from one another;
a high-voltage plasma driver connected to one of the coaxial electrodes and wherein the other coaxial electrodes being grounded; and
a magnet being positioned below the circuit board, wherein a plasma discharge is formed between the pair of coaxial electrodes when the high-voltage plasma driver is activated and wherein the magnet being configured to introduce a local magnetic field to the plasma discharge, such that the plasma discharge discharges in a radial direction and the local magnetic field is oriented vertically in a direction parallel to the axisymmetric orientation of the first and second electrodes to create a Lorentz Force to cause the plasma discharge to move in a tangential direction and to cause the plasma discharge to discharge out in a circular pattern, whereby three-dimensional vortical structures are produced by the moving plasma discharge.

17. The cyclotronic actuator of claim 16, wherein the high-voltage electrical plasma driver is selected from one or more of the following: a high-voltage AC plasma driver, a high-voltage RF circuit, a high-voltage pulsed DC plasma driver, or a bipolar high-voltage circuit.

18. The actuator of claim 16 further comprising:
a fuel/air injection port configured to introduce fuel/air into the plasma discharge for ignition by the moving plasma discharge.

* * * * *

UNITED STATES PATENT AND TRADEMARK OFFICE
CERTIFICATE OF CORRECTION

PATENT NO.         : 10,332,724 B2
APPLICATION NO.    : 15/923271
DATED              : June 25, 2019
INVENTOR(S)        : Joseph W. Zimmerman et al.

Page 1 of 1

It is certified that error appears in the above-identified patent and that said Letters Patent is hereby corrected as shown below:

On the Title Page

(72) Inventors: Correct order of the inventors is to be listed as, -- Phillip J. Ansell, Urbana, IL (US); Georgi Hristov, Champaign, IL (US); Joseph W. Zimmerman, Champaign, IL (US); David L. Carroll, Champaign, IL (US) --

(73) Assignee: delete "Champagne" and insert -- Champaign --; and insert -- The Board Of Trustees Of the University of Illinois, Urbana, IL (US) --

Signed and Sealed this
Twenty-eighth Day of January, 2020

Andrei Iancu
*Director of the United States Patent and Trademark Office*